(12) United States Patent
Sadaka et al.

(10) Patent No.: US 7,504,673 B2
(45) Date of Patent: Mar. 17, 2009

(54) SEMICONDUCTOR DEVICE INCLUDING A LATERAL FIELD-EFFECT TRANSISTOR AND SCHOTTKY DIODE

(75) Inventors: Mariam Gergi Sadaka, Austin, TX (US); Berinder P. S. Brar, Newbury Park, CA (US); Wonill Ha, Thousand Oaks, CA (US); Chanh Ngoc Minh Nguyen, Calabasas, CA (US)

(73) Assignee: Flextronics International USA, Inc., San Jose, CA (US)

( * ) Notice: Subject to any disclaimer, the term of this patent is extended or adjusted under 35 U.S.C. 154(b) by 0 days.

(21) Appl. No.: 11/866,259

(22) Filed: Oct. 2, 2007

(65) Prior Publication Data

US 2008/0054304 A1    Mar. 6, 2008

Related U.S. Application Data

(63) Continuation-in-part of application No. 11/211,964, filed on Aug. 25, 2005, now Pat. No. 7,285,807.

(51) Int. Cl.
*H01L 31/0328* (2006.01)
(52) U.S. Cl. .................................................. 257/194
(58) Field of Classification Search ................. 257/192, 257/194
See application file for complete search history.

(56) References Cited

U.S. PATENT DOCUMENTS

| 4,499,481 A | 2/1985 | Greene |
| 4,570,174 A | 2/1986 | Huang et al. |

(Continued)

FOREIGN PATENT DOCUMENTS

EP    1 256 985 A2    11/2002

(Continued)

OTHER PUBLICATIONS

Bergman, J., "Development of Indium Arsenide Quantum Well Electronic Circuits: A Dissertation Presented to the Academic Faculty," http://smartech.gatech.edu/bitstream/1853/5033/1/bergman_joshua_i_200407_phd.pdf, Jul. 2004, 225 pp., Georgia Institute of Technology, Atlanta, GA.

Asano, K., et al., "Novel High Power AlGaAs/GaAs HFET with a Field-Modulating Plate Operated at 35V Drain Voltage," IEDM 98, 1998, pp. 59-62, IEEE, Los Alamitos, CA.

(Continued)

*Primary Examiner*—Thomas L Dickey
(74) *Attorney, Agent, or Firm*—Slater & Matsil, L.L.P.

(57) ABSTRACT

A semiconductor device including a lateral field-effect transistor and Schottky diode and method of forming the same. In one embodiment, the lateral field-effect transistor includes a buffer layer having a contact covering a substantial portion of a bottom surface thereof, a lateral channel above the buffer layer, another contact above the lateral channel, and an interconnect that connects the lateral channel to the buffer layer. The semiconductor device also includes a Schottky diode parallel-coupled to the lateral field-effect transistor including a cathode formed from another buffer layer interposed between the buffer layer and the lateral channel, a Schottky interconnect interposed between the another buffer layer and the another contact, and an anode formed on a surface of the Schottky interconnect operable to connect the anode to the another contact. The semiconductor device may also include an isolation layer interposed between the buffer layer and the lateral channel.

20 Claims, 54 Drawing Sheets

U.S. PATENT DOCUMENTS

| | | | |
|---|---|---|---|
| 4,636,823 A | 1/1987 | Margalit et al. | |
| 4,807,022 A | 2/1989 | Kazior et al. | |
| 4,903,089 A | 2/1990 | Hollis et al. | |
| 4,967,243 A | 10/1990 | Baliga et al. | |
| 5,055,889 A * | 10/1991 | Beall | 257/277 |
| 5,068,756 A | 11/1991 | Morris et al. | |
| 5,106,778 A | 4/1992 | Hollis et al. | |
| 5,126,701 A * | 6/1992 | Adlerstein | 333/17.2 |
| 5,126,714 A | 6/1992 | Johnson | |
| 5,223,449 A | 6/1993 | Morris et al. | |
| 5,231,037 A | 7/1993 | Yuan et al. | |
| 5,244,829 A | 9/1993 | Kim | |
| 5,292,686 A | 3/1994 | Riley et al. | |
| 5,342,795 A | 8/1994 | Yuan et al. | |
| 5,343,071 A * | 8/1994 | Kazior et al. | 257/621 |
| 5,369,042 A | 11/1994 | Morris et al. | |
| 5,374,887 A | 12/1994 | Drobnik | |
| 5,407,842 A | 4/1995 | Morris et al. | |
| 5,468,661 A | 11/1995 | Yuan et al. | |
| 5,554,561 A | 9/1996 | Plumton | |
| 5,555,494 A | 9/1996 | Morris | |
| 5,610,085 A | 3/1997 | Yuan et al. | |
| 5,624,860 A | 4/1997 | Plumton et al. | |
| 5,700,703 A | 12/1997 | Huang et al. | |
| 5,712,189 A | 1/1998 | Plumton et al. | |
| 5,747,842 A | 5/1998 | Plumton | |
| 5,756,375 A | 5/1998 | Celii et al. | |
| 5,783,984 A | 7/1998 | Keuneke | |
| 5,784,266 A | 7/1998 | Chen | |
| 5,804,943 A | 9/1998 | Kollman et al. | |
| 5,889,298 A | 3/1999 | Plumton et al. | |
| 5,909,110 A | 6/1999 | Yuan et al. | |
| 5,910,665 A | 6/1999 | Plumton et al. | |
| 5,920,475 A | 7/1999 | Boylan et al. | |
| 5,956,245 A | 9/1999 | Rozman | |
| 5,956,578 A | 9/1999 | Weitzel et al. | |
| 6,008,519 A | 12/1999 | Yuan et al. | |
| 6,038,154 A | 3/2000 | Boylan et al. | |
| 6,094,038 A | 7/2000 | Lethellier | |
| 6,097,046 A | 8/2000 | Plumton | |
| 6,156,611 A | 12/2000 | Lan et al. | |
| 6,181,231 B1 | 1/2001 | Bartilson | |
| 6,191,964 B1 | 2/2001 | Boylan et al. | |
| 6,208,535 B1 | 3/2001 | Parks | |
| 6,218,891 B1 | 4/2001 | Lotfi et al. | |
| 6,229,197 B1 | 5/2001 | Plumton et al. | |
| 6,309,918 B1 | 10/2001 | Huang et al. | |
| 6,323,090 B1 | 11/2001 | Zommer | |
| 6,348,848 B1 | 2/2002 | Herbert | |
| 6,362,986 B1 | 3/2002 | Schultz et al. | |
| 6,477,065 B2 | 11/2002 | Parks | |
| 6,483,724 B1 | 11/2002 | Blair et al. | |
| 6,525,603 B1 | 2/2003 | Morgan | |
| 6,549,436 B1 | 4/2003 | Sun | |
| 6,661,276 B1 | 12/2003 | Chang | |
| 6,741,099 B1 | 5/2004 | Krugly | |
| 6,775,159 B2 | 8/2004 | Webb et al. | |
| 6,873,237 B2 | 3/2005 | Chandrasekaran et al. | |
| 6,980,077 B1 | 12/2005 | Chandrasekaran et al. | |
| 7,012,414 B1 | 3/2006 | Mehrotra et al. | |
| 7,046,523 B2 | 5/2006 | Sun et al. | |
| 7,176,662 B2 | 2/2007 | Chandrasekaran | |
| 7,321,283 B2 | 1/2008 | Mehrotra et al. | |
| 7,339,208 B2 | 3/2008 | Brar et al. | |
| 2002/0121647 A1* | 9/2002 | Taylor | 257/192 |
| 2003/0141518 A1* | 7/2003 | Yokogawa et al. | 257/194 |
| 2003/0198067 A1 | 10/2003 | Sun et al. | |
| 2005/0024179 A1 | 2/2005 | Chandrasekaran et al. | |
| 2005/0104080 A1 | 5/2005 | Ichihara et al. | |
| 2006/0038650 A1 | 2/2006 | Mehrotra et al. | |
| 2006/0118824 A1 | 6/2006 | Otsuka et al. | |
| 2006/0187684 A1 | 8/2006 | Chandrasekaran et al. | |
| 2006/0197510 A1 | 9/2006 | Chandrasekaran | |
| 2006/0198173 A1 | 9/2006 | Rozman | |
| 2006/0208279 A1* | 9/2006 | Robinson et al. | 257/194 |
| 2006/0226477 A1 | 10/2006 | Brar et al. | |
| 2006/0226478 A1 | 10/2006 | Brar et al. | |
| 2006/0255360 A1 | 11/2006 | Brar et al. | |
| 2007/0069286 A1 | 3/2007 | Brar et al. | |
| 2007/0145417 A1 | 6/2007 | Brar et al. | |
| 2007/0187717 A1 | 8/2007 | Sadaka et al. | |
| 2007/0296028 A1 | 12/2007 | Brar et al. | |
| 2007/0298559 A1 | 12/2007 | Brar et al. | |
| 2007/0298564 A1 | 12/2007 | Brar et al. | |
| 2008/0048173 A1 | 2/2008 | Sadaka et al. | |
| 2008/0048174 A1 | 2/2008 | Sadaka et al. | |
| 2008/0048219 A1 | 2/2008 | Brar et al. | |

FOREIGN PATENT DOCUMENTS

| | | |
|---|---|---|
| EP | 1 638 147 A2 | 3/2006 |
| WO | WO 2005/015642 A1 | 2/2005 |

OTHER PUBLICATIONS

Berroth, M., et al., "Extreme Low Power 1:4 Demultiplexer Using Double Delta Doped Quantum Well GaAs/AlGaAs Transistors," Japanese Journal of Applied Physics, Extended Abstracts of the 22nd 1990 International Conference on Solid State Devices and Materials, 1990, pp. 75-78, Tokyo, Japan.

Eisenbeiser, K., et al., "Manufacturable GaAs VFET for Power Switching Applications," IEEE Electron Device Letters, Apr. 2000, pp. 144-145, vol. 21, No. 4, IEEE.

Kollman, R., et al., "10 MHz PWM Converters with GaAs VFETs," IEEE Eleventh Annual Applied Power Electronics Conference and Exposition, Mar. 1996, pp. 264-269, vol. 1, IEEE.

Lan, E., et al., "A Field Plate Device by Self-Aligned Spacer Process," The International Conference on Compound Semiconductor Manufacturing Technology, 2004, pp. 35-38, GaAs Mantech, St. Louis, MO.

Liu, W., "Fundamentals of III-V Devices: HBTs, MESFETs, and HFETs/HEMTs," §5-5: Modulation Doping, 1999, pp. 323-330, John Wiley & Sons, New York, NY.

Nguyen, L.D., et al., "Ultra-High-Speed Modulation-Doped Field-Effect Transistors: A Tutorial Review," Proceedings of the IEEE, Apr. 1992, pp. 494-518, vol. 80, No. 4, IEEE.

Niemela, V.A., et al., "Comparison of GaAs and Silicon Synchronous Rectifiers in a 3.3V Out, 50W DC-DC Converter," 27th Annual, IEEE Power Electronics Specialists Conference, Jun. 1996, pp. 861-867, vol. 1, IEEE.

Plumton, D.L., et al., "A Low On-Resistance High-Current GaAS Power VFET," IEEE Electron Device Letters, Apr. 1995, pp. 142-144, vol. 16, No. 4, IEEE.

Sickmiller, M., "Packaging of Ultrathin Semiconductor Devices Through the ELO Packaging Process," Mat. Res. Soc. Symp. Proc., 2001, pp. 17.3.1-17.3.6, vol. 681E, Materials Research Society, Warrendale, PA.

Tkachenko, Y., et al., "Improved Breakdown Voltage and Hot-Electron Reliability PHEMT for High Efficiency Power Amplifiers," Asia Pacific Microwave Conference (AMPC'99), Nov. 30, 1999, pp. 618-621, vol. 3, IEEE, Los Alamitos, CA.

Weitzel, C.E., "RF Power Devices for Wireless Communications," 2002 IEEE MTT-S CDROM, 2002, pp. 285-288, paper TU4B-1, IEEE, Los Alamitos, CA.

Williams, R., "Modern GaAs Processing Methods," 1990, pp. 66-67, Artech House, Inc., Norwood, MA.

Wu, C.S., et al., "Pseudomorphic HEMT Manufacturing Technology for Multifunctional Ka-Band MMIC Applications," IEEE Transactions on Microwave Theory and Techniques, Feb. 1995, pp. 257-265, vol. 43, NO. 2, IEEE, New York, US.

"Advanced Synchronous Rectified Buck MOSFET Drivers with Pre-POR OVP," ISL6612A, ISL6613A, Data Sheet FN9159.6, Jul. 27, 2006, pp. 1-12, Intersil Americas Inc., Milpitas, CA.

Ajit, J.S., "Design of MOS-Gated Bipolar Transistors with Integral Antiparallel Diode," IEEE Electron Device Letters, pp. 344-347, Jul. 1996, vol. 17, No. 7, IEEE, Los Alamitos, CA.

Peppel, M., et al., "Optimized Reverse Diode Operation of Power MOSFETs," 2000 IEEE Industry Applications Conference, Oct. 8, 2000, pp. 2961-2965, vol. 5, IEEE, Los Alamitos, CA.

Storm, D.F., et al., "Reduction of Buffer Layer Conduction Near Plasma-Assisted Molecular-Beam Epitaxy Grown GaN/AlN Interfaces by Beryllium Doping," Applied Physics Letters, Nov. 11, 2002, pp. 3819-3821, vol. 81, No. 20, American Institute of Physics, Melville, NY.

* cited by examiner

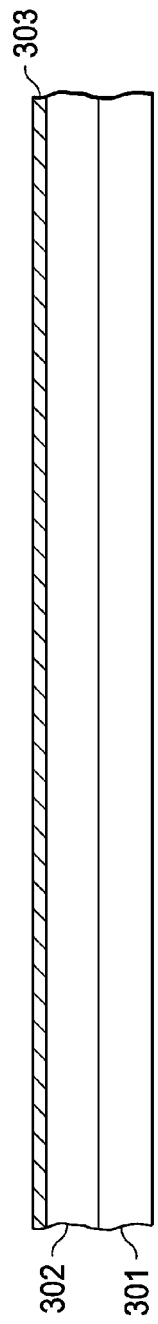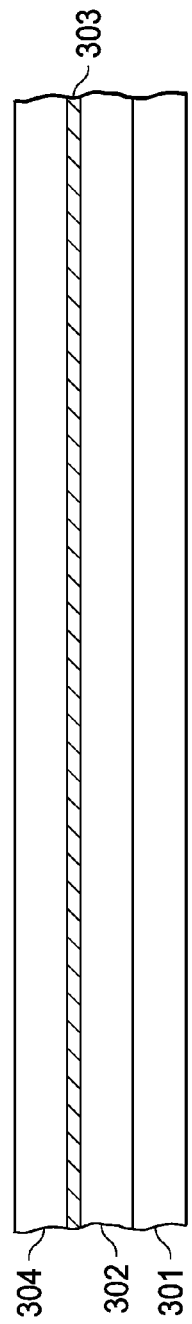

SEMICONDUCTOR DEVICE INCLUDING A LATERAL FIELD-EFFECT TRANSISTOR AND SCHOTTKY DIODE

This application is a continuation in part of, and claims priority to, U.S. patent application Ser. No. 11/211,964, now U.S. Pat. No. 7,285,807 entitled "Semiconductor Device Having Substrate-Driven Field-Effect Transistor and Schottky Diode and Method of Forming the Same," filed on Aug. 25, 2005, which is incorporated herein by reference.

TECHNICAL FIELD

The present invention is directed, in general, to semiconductor devices and, more specifically, to a semiconductor device including a field-effect transistor with at least one lateral channel and a Schottky diode, and a method of forming the same.

BACKGROUND

A field-effect transistor (also referred to as a "FET") is a conventional semiconductor device employable in switch-mode power supplies for use in data processing and telecommunication systems as well as for other applications that use conditioned power for the operation of sensitive electronic circuits. Field-effect transistors have almost universally replaced bipolar transistors previously used for inverters (a type or portion of a power supply) as well as the p-n and Schottky diodes used for rectification. The proliferation of field-effect transistors has, at least in part, been driven by the need to provide highly efficient power supplies with low dc output voltages such as five volts or less at higher current levels. The broad acceptance of field-effect transistors for the aforementioned applications is a consequence of the low forward voltage drop and fast switching speed as well as the low power consumption employed to enable or disable conduction thereof. As a result, the use of field-effect transistors has contributed to compact and efficient power supplies that can be produced at low cost.

As the loads for the power supplies are generally designed with integrated circuits employing shrinking feature sizes for the circuit elements, a need is continually evolving for new designs with lower output voltages (e.g., one volt or less) at higher current levels (e.g., 50 to 100 amperes or more). Present switch-mode power supplies providing input-output circuit isolation (via a transformer) and employing silicon-based field-effect transistors as synchronous rectifiers therein and designed with best current practice are usually operable with switching frequencies only up to several hundred kilohertz ("kHz") due, at least in part, to the slower switching speeds of the silicon-based field-effect transistors. To accommodate continuing developments in integrated circuit technology, however, power supply switching frequencies above one megahertz ("MHz") are desirable to reduce the size of magnetic devices and the capacitive filtering elements of the power supply without compromising the power conversion efficiency. In accordance therewith, field-effect transistors with previously unrealizable characteristics are not only being requested, but are necessary to satisfy the aforementioned conditions.

A material of choice for high performance field-effect transistors is a semiconductor with high electron mobility and wide band gap for high breakdown voltage that is capable of being processed with conventional equipment and methods not substantially different from those already developed for silicon and present generations of compound semiconductors. A particularly desirable material is the compound semiconductor known as gallium arsenide ("GaAs"), which has been used for integrated circuits operable at frequencies well above one gigahertz, and which has been used to produce power field-effect transistors with high performance characteristics. An exemplary performance of gallium arsenide in comparison to other semiconductor materials for high performance field-effect transistors is described in "Fundamentals of III-V Devices" by W. Liu, published by John Wiley and Sons (1999), and "Modern GaAs Processing Methods" by R. Williams, published by Artech House (1990), which are incorporated herein by reference.

Additionally, examples of gallium arsenide field-effect transistors employing a controllable vertical channel between a source and drain thereof are provided in the following references, namely, U.S. Pat. No. 5,889,298 entitled "Vertical JFET Field Effect Transistor," by Plumton, et al., issued on Mar. 30, 1999, U.S. Pat. No. 5,342,795 entitled "Method of Fabricating Power VFET Gate-Refill," by Yuan, et al., issued on Aug. 30, 1994, U.S. Pat. No. 5,468,661 entitled "Method of Making Power VFET Device," by Yuan, et al., issued on Nov. 21, 1995, U.S. Pat. No. 5,610,085 entitled "Method of Making a Vertical FET using Epitaxial Overgrowth," by Yuan, et al., issued on Mar. 11, 1997, and U.S. Pat. No. 5,624,860 entitled "Vertical Field Effect Transistor and Method," by Plumton, et al., issued on Apr. 29, 1997, which are incorporated herein by reference.

An exemplary gallium arsenide field-effect transistor as generally described in the aforementioned references is illustrated with respect to FIG. 1. The gallium arsenide field-effect transistor includes buried and inter-coupled gate fingers (also referred to as a gate and one of which is designated 110) formed in etched trenches in an n-type doped drain 120 thereby producing vertical channels 130. The gates 110 exhibit a gate length (generally designated "GL") and the vertical channels 130 provide a channel opening (generally designated "CO"). The trenches are back-filled epitaxially with p-type doped gallium arsenide to form the gates 110. A p+ implant 140 provides a top surface contact to the gates 110, and is made through a further n-type doped epitaxial layer that forms a source 150. External connection to the gates 110 is made through metallized contacts 160 deposited over the heavily doped p+ implants 140. An external source contact 170 and drain contact 180 are made through metal depositions over further heavily doped areas. The structure produces vertical field-effect transistor channels between the gates 110, and provides source and drain contacts 170, 180, respectively, on opposing sides of the die. The device, therefore, operates with vertical carrier flow and the buried gates 110, typically doped opposite from the vertical channels 130, exhibit limited control over a fill profile thereof.

The field-effect transistor as described above, however, does not accommodate a careful doping profiling and epitaxial layer design necessary to produce a modulation-doped channel that can be formed in a lateral channel and that may be employed to substantially reduce the on-resistance of the device. The field-effect transistor described above is not configured with a channel having a strained material, which would significantly improve a mobility of the current carrying carriers and, consequently, a switching speed thereof. This design methodology of constructing such gallium arsenide field-effect transistors has been analyzed in the following references, namely, "Comparison of GaAs and Silicon Synchronous Rectifiers in a 3.3V Out, 50 W DC-DC Converter," by V. A. Niemela, et al., 27th Annual, IEEE Power Electronics Specialists Conference, Vol. 1, June 1996, pp. 861-867, "10 MHz PWM Converters with GaAs VFETs," by R. Kollman, et al., IEEE Eleventh Annual Applied Power Electronics Conference and Exposition, Vol. 1, March 1996, pp. 264-269, "A Low On-Resistance High-Current GaAs Power VFET," by D. L. Plumton, et al., IEEE Electron Device Letters, Vol. 16, Issue 4, April 1995, pp. 142-144, and "RF Power Devices for Wireless Communications," by C. E. Weitzel, IEEE MTT-S2002, paper TU4B-1, which are incorporated herein by reference. The structure as generally described in the aforementioned references has higher channel and gate resistance per unit die area than the desired resistance and produces a device operable only in the depletion mode, which may limit the applicability of the device in certain situations. Additionally, the devices described in the aforementioned references do not include a body diode. The resulting cost and performance have resulted in limited marketability in view of the presently available silicon-based technology.

Another example of a vertical channel gallium arsenide field-effect transistor is described in "Manufacturable GaAs VFET for Power Switching Applications," by K. Eisenbeiser, et al., IEEE Electron Device Letters, Vol. 21, No. 4, pp. 144-145 (April 2000), which is incorporated herein by reference. The reference describes forming a source contact on a top surface of the die and a drain contact on the bottom. A vertical channel, however, is still provided in the design proposed by Eisenbeiser, et al. Although economies of manufacture are achieved using implants rather than etching and epitaxial growth as described by Eisenbeiser, et al., possible disadvantages of a channel with a vertical structure limit the switching speed and operation as an enhancement-mode device.

R. Williams describes a GaAs power field-effect transistor in "Modern GaAs Processing Methods," incorporating both the source and drain contacts on the upper side of a die with a lateral channel and is illustrated with respect to FIG. 2A. The gallium arsenide field-effect transistor acting as a power field-effect transistor includes a gate 205 interposed between a source 210 and drain 215, creating a lateral channel in an n-type doped GaAs layer 220. A depletion region 225 is formed under the gate 205 and a shallower depletion region 230 forms generally under an upper surface of the die as a result of an inherent existence of surface states at the surface of the crystal (i.e., a surface pinning effect). The gallium arsenide field-effect transistor is formed over a semi-insulating GaAs substrate 235. Designing the source and drain contacts on the same surface of the die requires a complicated multilayer metallization process and results in increased die area and reduced chip yield. The aforementioned configuration can also lead to increased inductance, which is of significance in applications for microwave signal amplification. Also, the gallium arsenide field-effect transistor does not include an intrinsic body diode.

Another gallium arsenide field-effect transistor is described by R. Williams at pp. 66-67 of "Modern GaAs Processing Methods," which is configured with source and drain contacts on opposing sides of the die and a lateral channel, and is illustrated with respect to FIG. 2B. The gallium arsenide field-effect transistor includes a plated air bridge 250 coupled to a source (generally designated "S") on an upper side of the die. Gates (generally designated "G") are interposed between drains (generally designated "D"), and are also located on the upper surface of the die. Couplings to the source are brought down to a lower surface of the die by vias 265 that are plated-through holes between the lower surface and the source and are further coupled together by a plated heat sink 280. Although this arrangement can provide low-inductance external connections to the source, it is limited in its ability to provide a low-resistance channel tightly coupled to the lower surface of a highly conductive substrate, or an intrinsic body diode.

The aforementioned design also does not accommodate large drain contacts desirable for a higher power device, which will increase the resistive and inductive losses. This configuration requires a complex air-bridge processing step, which will increase the cost and potentially affect the reliability of the device. For the large gate width field-effect transistor, the parasitic resistance in series with the source will increase due to the long air-bridge connection. This design also is incompatible with today's packaging techniques for higher power devices embodied in a vertical device configuration.

Additionally, U.S. Pat. No. 6,309,918 entitled "Manufacturable GaAs VFET Process," by Huang, et al, issued on Oct. 30, 2001, is directed toward a vertical FET with source and drain contacts on opposing sides of a die. U.S. Pat. No. 5,956,578 entitled "Method of Fabricating Vertical FET with Schottky Diode," by Weitzel, et al, issued on Sep. 21, 1999, and U.S. Pat. No. 6,097,046 entitled "Vertical Field Effect Transistor and Diode," by Plumton, issued on Aug. 1, 2000, are directed toward a vertical FET on a compound semiconductor substrate with an integrated Schottky diode on an upper surface of the die. Neither of the aforementioned references, which are also incorporated herein by reference, provides low on-resistance using a conductivity-enhanced lateral channel.

Still further references such as U.S. Pat. No. 5,068,756 entitled "Integrated Circuit Composed of Group III-V Compound Field Effect and Bipolar Semiconductors," by Morris, et al., issued on Nov. 26, 1991, and U.S. Pat. No. 5,223,449 entitled "Method of Making an Integrated Circuit Composed of Group III-V Compound Field Effect and Bipolar Semiconductors," by Morris, et al., issued on Jun. 29, 1993, which are incorporated herein by reference, describe an integration of multiple semiconductor devices on a die including n- and p-channel junction field-effect transistors with a lateral channel. These devices include an isolation trench surrounding the devices, etched to a lower semi-insulating gallium arsenide layer and backfilled with silicon nitride. The aforementioned devices, however, are configured with contacts on a top surface, which restricts their application from low voltage, high current systems wherein efficiency is an important design element.

Low on-resistance compound semiconductor field-effect transistors has been enhanced by the use of a layering structure called modulation doping as described in "Fundamentals of III-V Devices" by W. Liu (p. 323) and "Ultra-High-Speed Modulation-Doped Field-Effect Transistors: A Tutorial Review," L. D. Nguyen, et al., Proceedings of the IEEE, Vol. 80, No. 4, pp. 494-518 (April 1992), which are incorporated herein by reference and are particularly applicable to devices with a lateral channel. The objective of modulation doping is to avoid electron scattering in the current conducting channel by ionized impurities due to dopants, which increases channel resistivity due to the decreased carrier mobility. Channel conductivity may be modulated by a separate control element such as a gate that controls channel depletion.

The modulation doping technique has been developed for lateral channels using, for instance, gallium arsenide as an undoped, narrower band gap channel and including an adjacent, doped, wider band gap layer of aluminum gallium arsenide, which provides an abundant and controllable source of free carriers to the gallium arsenide channel. Other combinations of compound semiconductors can be used such as an undoped indium gallium arsenide channel and an adjacent, doped aluminum gallium arsenide layer as the source of free carriers. Successful and repeatable applications of modulation doping, which is based on precision formation of a pseudomorphic layer, employs lateral channel arrangements that are not presently available in devices formed with vertical channels.

Power supplies that employ a field-effect transistor as an active switching device frequently rely on an intrinsic body diode to provide a permanently enabled conduction path for current flow in the direction from the source to the drain to safely accommodate inductive circuit elements during a switching operation of the circuit. Alternatively, an external diode may be provided in the circuit as in the case of a typical silicon-based insulated-gate bipolar transistor. In low-voltage applications, low forward voltage drop of the diode is important to maintain circuit efficiency. While a Schottky diode may be employed in parallel with the active switching device, typically the Schottky diode adds cost to the circuit and requires valuable space for the circuit implementation. In addition, avoiding the storage of minority-carrier charge due to current flowing through a p-n-based intrinsic body diode (which can adversely affect the switching operation of the transistor) is preferable in high-frequency switching circuits. The presence of a p-n-based diode generally results in switching losses due to forward and reverse recovery phenomena. These loss mechanisms result, respectively, in increased forward voltage drop immediately after a diode is turned on, and a reverse current flow immediately after a diode is turned off. For examples of diodes integrated into semiconductor devices, see "Design of MOS-Gated Bipolar Transistors with Integral Antiparallel Diode," by Ajit, J. S., IEEE Electron Device Letters, Vol. 17, Issue 7, July 1996, pp. 344-347, "Optimized Reverse Diode Operation of Power MOSFETs," by Peppel, M., Weis, B., Conference Record of the 2000 IEEE Industry Applications Conference, Vol. 5, Oct. 8, 2000, pp. 2961-2965, and U.S. Pat. No. 4,967,243, entitled, "Power Transistor Structure with High Speed Integral Antiparallel Schottky Diode," by B. J. Baliga, et al., issued on Oct. 30, 1990, which are incorporated herein by reference.

Accordingly, a field-effect transistor, especially employing gallium arsenide transistor or other compound semiconductor device, that includes a Schottky diode in parallel with the active switching element, particularly an active switching element with low on-resistance and fast switching speed, would be a highly desirable circuit element, not only for its low forward voltage drop, but also with reduced forward and reverse recovery effects, which are related to its ability to avoid unnecessary charge storage associated with conduction by minority carriers. In addition, an integrated structure incorporating a Schottky diode on the same die with an active switch would reduce the footprint of semiconductor devices in an end product, accommodating thereby an increase in power conversion density and a simplified heat dissipation arrangement.

Considering the limitations as described above, a field-effect transistor design is not presently available for the more severe applications that lie ahead. Accordingly, what is needed in the art is a gallium arsenide and other compound semiconductor devices including a Schottky diode configured for wide acceptance, particularly in low voltage and high current applications, overcoming many of the aforementioned limitations. In accordance therewith, a compact and efficient power supply, particularly for very low voltage and high current loads such as microprocessors, as well as amplifiers for telecommunications and other applications, would benefit from a robust field-effect transistor including a Schottky diode in parallel therewith employable with other devices without incurring unnecessary costs or the need to commit a substantial portion of the physical volume of the end device to the power supply.

SUMMARY OF THE INVENTION

These and other problems are generally solved or circumvented, and technical advantages are generally achieved, by advantageous embodiments of the present invention that includes a semiconductor device including a lateral field-effect transistor and Schottky diode and method of manufacturing the same. In one embodiment, the lateral field-effect transistor includes a buffer layer having a contact covering a substantial portion of a bottom surface thereof, a lateral channel above the buffer layer, another contact above the lateral channel, and an interconnect that connects the lateral channel to the buffer layer, operable to provide a low resistance coupling between the contact and the lateral channel. The semiconductor device also includes a Schottky diode parallel-coupled to the lateral field-effect transistor including a cathode formed from another buffer layer interposed between the buffer layer and the lateral channel, a Schottky interconnect interposed between the another buffer layer and the another contact, and an anode formed on a surface of the Schottky interconnect operable to connect the anode to the another contact. The semiconductor device may also include an isolation layer interposed between the buffer layer and the lateral channel.

In another aspect, the present invention provides a semiconductor device including a lateral field-effect transistor and a Schottky diode, and method of forming the same. In one embodiment, the lateral field-effect transistor includes a buffer layer having a contact coupled to a bottom surface thereof, a lateral channel above the buffer layer, another contact above the lateral channel, and an interconnect that connects the lateral channel to the buffer layer, operable to provide a low resistance coupling between the contact and the lateral channel. The semiconductor device also includes a Schottky diode coupled to the lateral field-effect transistor including a cathode formed from the buffer layer, an anode formed on a bottom surface of the cathode, and a Schottky contact coupled to a bottom surface of the anode. The semiconductor device may also include an isolation layer interposed between the contact and the buffer layer.

In another aspect, the present invention provides a semiconductor device including a lateral field-effect transistor and a Schottky diode, and method of forming the same. In one embodiment, the lateral field-effect transistor includes a buffer layer having a contact coupled to a bottom surface thereof, a lateral channel above the buffer layer, another contact above the lateral channel, and an interconnect that connects the lateral channel to the buffer layer, operable to provide a low resistance coupling between the contact and the lateral channel. The semiconductor device also includes a Schottky diode coupled to the lateral field-effect transistor including a cathode above the lateral channel, an anode formed on an upper surface of the cathode, and a Schottky contact coupled to an upper surface of the anode. The semiconductor device may also include an isolation layer interposed between the buffer layer and the lateral channel.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3 to 35 illustrate cross-sectional views of an embodiment of constructing a semiconductor device according to the principles of the present invention;

DETAILED DESCRIPTION OF ILLUSTRATIVE EMBODIMENTS

Figure 1:
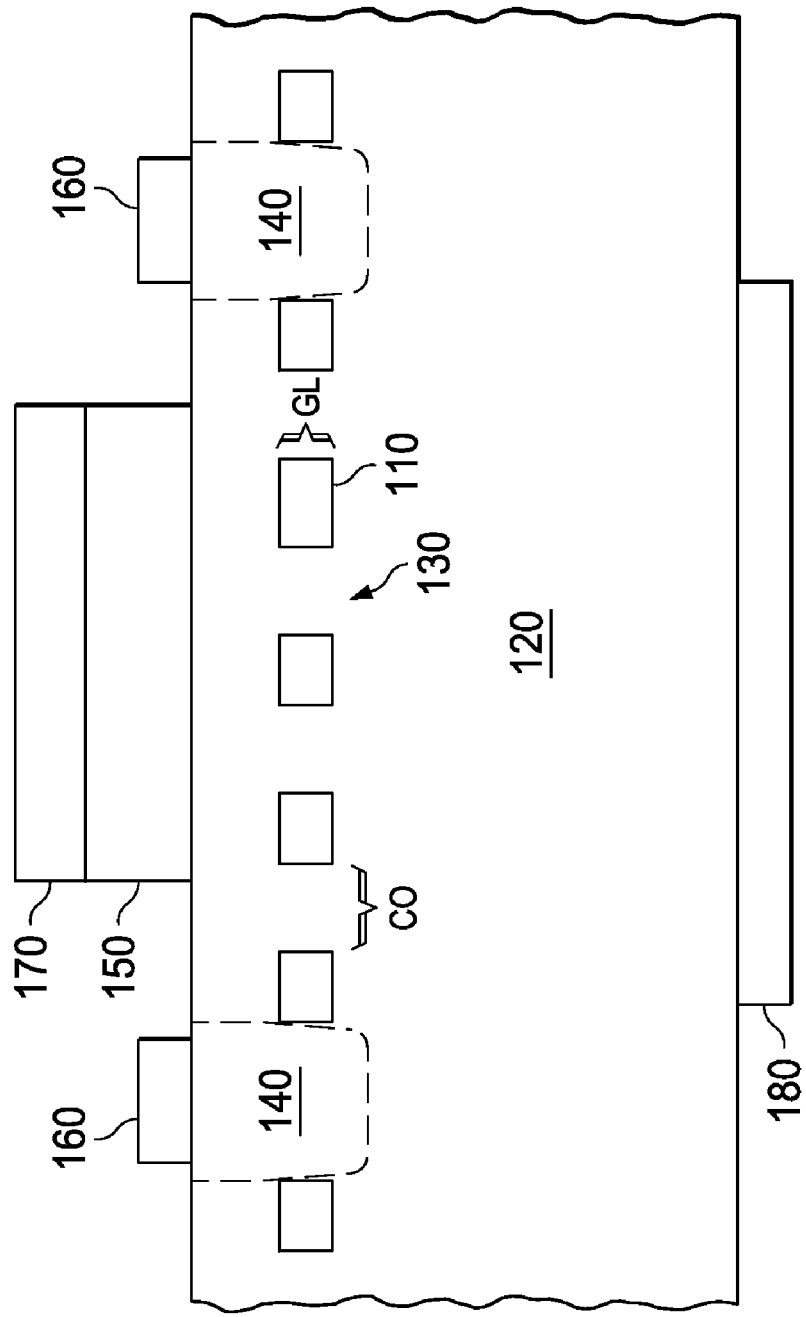
FIGS. 1, 2A and 2B illustrate cross-sectional views of field-effect transistors according to the prior art.
Figure 2A:
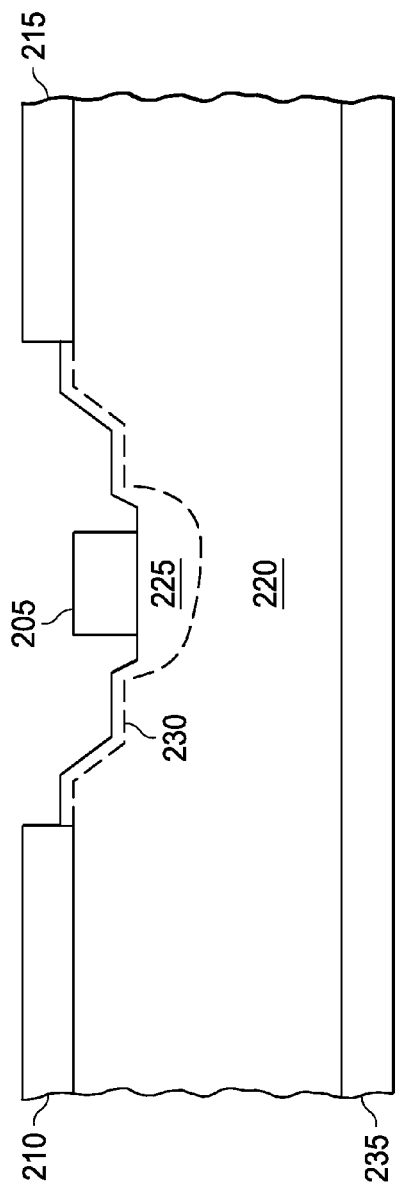
Figure 2B:
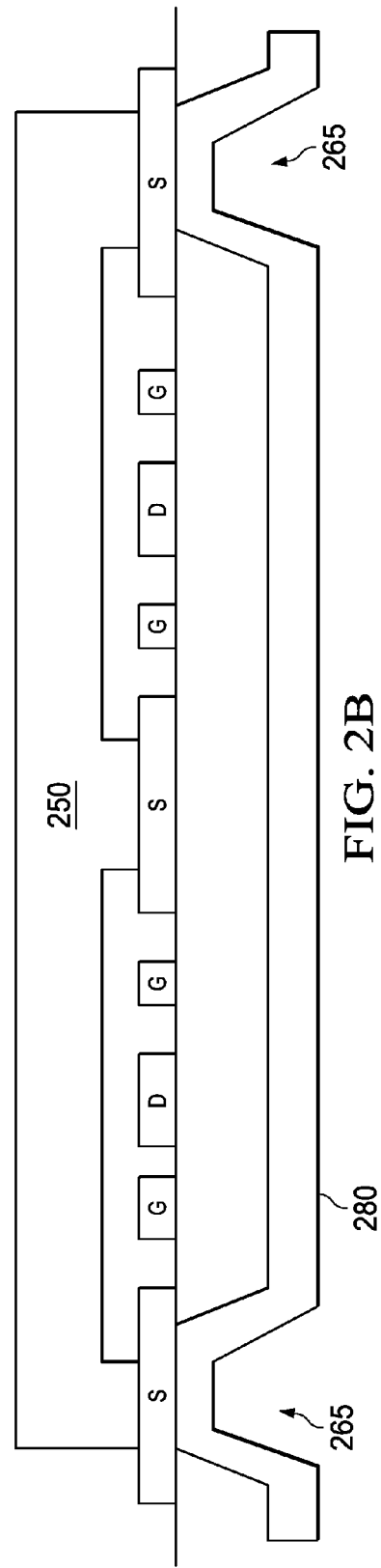

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely, a semiconductor device and, more particularly, a semiconductor device having a lateral field-effect transistor ("FET") and a Schottky diode formed on the same die, coupled to drain and source contacts thereof. The lateral FET includes a source contact coupled to a doped epitaxial buffer layer formed on a substrate, which can be optionally removed during device processing to reduce device electrical and thermal resistances. A drain contact is coupled to an opposing surface of the device to provide a low on-resistance lateral FET with very fast switching transition times. The lateral FET also includes at least one lateral channel to, among other things, further reduce an on-resistance thereof.

As it is recognized in the art, the switched terminals of a FET, particularly a FET without an intrinsic body diode, are referred to as a "source contact" and "drain contact." Due to the symmetric structural elements of a field-effect transistor, the terminal designated as the source contact and the terminal designated as the drain contact may be reversed. Thus the designations "source" and "drain" for a particular device are not unique and may be interchanged.

The principles of the present invention may be applied to a compound semiconductor FET with modulation-doped lateral channel(s) and other semiconductor devices that include current-carrying channels including modulation-doped lateral channel(s) and switched terminals or contacts on opposing surfaces thereof. Thus, the principles of the present invention apply to semiconductor devices having at least one lateral channel and contacts on opposing surfaces thereof.

The modulation doping technique has been developed for lateral channels using, for instance, gallium arsenide as an undoped, narrower band gap channel and including an adjacent, doped, wider band gap layer of aluminum gallium arsenide, which provides an abundant and controllable source of free carriers to the gallium arsenide channel. Other combinations of compound semiconductors can be used such as an undoped indium gallium arsenide channel and an adjacent, doped aluminum gallium arsenide layer as the source of free carriers. Successful and repeatable applications of modulation doping, which is based on precision formation of a pseudomorphic layer, employs lateral channel arrangements that are not presently available in devices configured with vertical channels.

In an exemplary embodiment, the lateral FET includes a plurality of lateral channels, among other things, to further reduce an on-resistance thereof. The principles of the present invention may be applied to a compound semiconductor FET with a single modulation-doped lateral channel and other semiconductor devices that include current-carrying channels including modulation-doped lateral channels and switched terminals on opposing surfaces thereof. Thus, the principles of the present invention apply to semiconductor devices having single or multiple lateral channels and contacts on opposing surfaces thereof.

The inclusion of multiple lateral channels in a semiconductor device recognizes the limited improvement in on-resistance that can be obtained by simply increasing the thickness of a single lateral channel. Carriers in the lateral channel flow near the channel edges due to highly localized electric field distributions within the lateral channel, and this limits an improvement of the device on-resistance as the lateral channel is made thicker. A single thicker lateral channel made of material with a different lattice constant from a substrate exhibits more numerous atomic dislocations in the crystal lattice, which degrades the carrier mobility and device breakdown characteristics. A further benefit of multiple lateral channels is an increase in transconductance of the semiconductor device for a given device area. Improvements in the device on-resistance and transconductance for presently available semiconductor devices ordinarily comes at the expense of greater die area, which has a direct effect on the cost and yield of the semiconductor device. By incorporating multiple channels into the semiconductor device constructed according to the principles of the present invention, the semiconductor device can achieve improvements in on-resistance and transconductance over a device with a single channel without the limitations as discussed above.

A field-effect transistor formed in a compound semiconductor device such as gallium arsenide with a lateral channel structure as described in U.S. Patent Application Publication No. 2006/0226478 entitled "Semiconductor Device Having a Lateral Channel and Contacts on Opposing Surfaces Thereof," to Brar, et al., published Oct. 12, 2006, U.S. Patent Application Publication No. 2006/0255360 entitled "Semiconductor Device Having Multiple Lateral Channels and Method of Forming the Same," to Brar, et al., published Nov. 16, 2006, U.S. Patent Application Publication No. 2007/0069286 entitled "Semiconductor Device Having an Interconnect with Sloped Walls and Method of Forming the Same," to Brar, et al., published Mar. 29, 2007, and U.S. Patent Application Publication No. US-2007/0145417 A1 entitled "High Voltage Semiconductor Device Having a Lateral Channel and Enhanced Gate-to-Drain Separation," to Brar, et al., published Jun. 28, 2007, which are incorporated herein by reference, accommodates a careful doping profiling with an epitaxial layer design to produce a modulation-doped lateral channel. The lateral, modulation-doped channel structure may be employed to substantially reduce the on-resistance of the device while preserving high switching speed.

The principles of the present invention are applied to a compound semiconductor FET formed on a substrate, including a diode such as a Schottky diode formed on the same die coupled to drain and source contacts of the device, wherein the substrate may be removed during device processing. As recited above, the removal of the substrate is an optional sequence during device processing, which may be omitted in an alternative embodiment of the invention.

The substrate is a structural layer of a gallium arsenide field-effect transistor on which the device is formed that contributes to its on-resistance. Substrate resistivity can be reduced by introducing dopants (e.g., silicon) at high concentration levels and by substantially thinning the wafer during device processing to improve the geometry of carrier flow. The substrate doping levels, however, are limited by segregation of dopants during formation of the gallium arsenide boule from which the wafer or substrate is sawn, particularly at high doping concentrations. Increasing silicon doping levels beyond a density of $5 \times 10^{-18}$ cm$^{-3}$ can be very challenging, especially due to the need to control the doping level over the entire distance between the seed and tail of the semiconductor ingot during its production. Usually substrates are specified with a large process window for substrate resistivity (such as $0.8 \times 10^{-3}$ to $5 \times 10^{-3}$ ohm·cm) to maintain high wafer yield, which is important for low wafer cost. However, such process windows are often inadequate to control end device properties such as on-resistance of a production FET. Substrates with high or even moderate doping levels cost substantially more than semi-insulating (e.g., undoped) substrates, which is a further significant disadvantage for their use.

Compound semiconductor wafers can be thinned during device processing by a grinding process to about 75-25 micrometers ("μm"), wherein 25 μm is a particularly challenging thinning level for state-of-the-art wafer processing, and is ordinarily not optimized to manage wafer yields and cost. Substantially thinned wafers with high substrate doping concentrations result in lower device operating temperatures and reduced on-resistance that contribute to reductions in package size and cost, which in turn increase device reliability. Nonetheless, even with substantial thinning, the presence of a substrate with a thickness that might be in the range of 75-25 μm still has significant contribution to device on-resistance.

A further disadvantage incurred by the substrate, particularly a gallium-arsenide substrate, is its poor thermal conductivity. Substrate thermal conductivity directly affects device operating temperature, which results in an increase in on-resistance as device temperature increases, with adverse effects on package size and device reliability. The thermal conductivity of a gallium arsenide substrate is substantially poorer than that of its silicon counterpart (55 versus 130 W/m·K), which provides further motivation for its thinning or removal altogether. As described above, wafer thinning to about 75 μm can be performed using standard practices, and thinning to about 25 μm can be performed in some existing production facilities with state-of-the-art processes with corresponding increases in wafer cost. Nonetheless, the remaining resistance of the substrate after thinning still provides a significant contribution to the on-resistance of the device.

During the ordinary manufacturing steps of the invention to form a FET such as a lateral FET with a parallel-coupled Schottky diode, the process generally starts with a highly doped substrate. During device processing steps as described in U.S. Patent Application Publication No. US-2007/0187717 A1 entitled "Semiconductor Device Having Reduced On-Resistance and Method of Forming the Same," to Sadaka, et al., published Aug. 16, 2007, which is incorporated herein by reference, the substrate can be removed before completion of device processing to allow a metallic contact to be formed directly on an internal, highly doped, epitaxial buffer layer, thereby avoiding the resistance of the substrate that would otherwise include a layer interposed in the series flow of charged carriers if not removed. Removal of the substrate during device processing accommodates use of a semi-insulating substrate with its attendant reduced cost compared to the cost of a low resistance substrate with a high doping level. Removal of the substrate also accommodates the use of GaAs on Si wafers.

For examples of power supplies that provide an environment for the semiconductor device, see U.S. Patent Application Publication No. 2005/0024179, entitled "Extended E Matrix Integrated Magnetics (MIM) Core," to Chandrasekaran, et al., published Feb. 3, 2005, U.S. Pat. No. 6,775,159, entitled "Switching Power Converter Circuits Providing Main and Auxiliary Output Voltages," to Webb, et al., issued Aug. 10, 2004, U.S. Pat. No. 6,549,436, entitled "Integrated Magnetic Converter Circuit and Method with Improved Filtering," to Sun, issued Apr. 15, 2003, U.S. Pat. No. 7,046,523, entitled "Core Structure and Interleaved DC-DC Converter Topology," to Sun, et al., issued May 16, 2006, U.S. Pat. No. 7,012,414, entitled "Vertically Packaged Switched-Mode Power Converter," to Mehrotra, et al., issued Mar. 14, 2006, U.S. Patent Application Publication No. 2006/0187684, entitled "Power Converter Employing Integrated Magnetics with a Current Multiplier Rectifier and Method of Operating the Same," to Chandrasekaran, et al., published Aug. 24, 2006, and U.S. Pat. No. 7,176,662, entitled "Power Converter Employing a Tapped Inductor and Integrated Magnetics and Method of Operating the Same," to Chandrasekaran, issued Feb. 13, 2007, all of which are incorporated herein by reference.

Exemplary characteristics and advantages associated with the use of selected embodiments of the lateral FET according to the principles of the present invention are set forth below. The lateral FET may be capable of switching transition times on the order of nanoseconds, rather than switching transition times on the order of 35 to 50 nanoseconds realizable with the present silicon-based technology. The lateral FET may exhibit peak inverse voltage ratings such as 10 to 20 volts or more, and should have low on-resistance including the parasitic electrical resistance from the device packaging approaching one milliohm or less. In addition, the lateral FET desirably has gates that can be driven with digital logic, with low gate charge and correspondingly low and controllable field-effect transistor threshold voltage. The lateral FET also desirably has current ratings of at least a dozen amperes, and should be cost competitive with presently available field-effect transistors having similar power ratings implemented in silicon-based technology. The lateral FET also advantageously includes a Schottky diode that is capable of conducting substantially the full rated device current when the FET is turned off.

Additionally, the lateral FET having source and drain contacts on opposing sides of the die facilitates low resistance and inductance packaging by providing more area for contacts. The lateral FET may also operate as an enhancement-mode device, which implies a normally-off device when a gate voltage is substantially zero volts to avoid short circuits during power supply start-up. The presence of a Schottky diode formed on the same die with the anode coupled to a contact of the lateral FET can also provide substantial benefits in circuit design as well as cost reduction, particularly in power supply applications.

In the drawings, boundaries may be shown as lines to separate semiconductor regions or layers with apparent abrupt changes in doping levels or species. It is recognized that semiconductor manufacturing processes such as implantation and diffusion may cause doping concentrations and atomic species to vary in a continuous and sometimes gradual manner across a semiconductor device. Consequently, graded boundaries of device regions may be shown as lines in the drawings for explanatory purposes without compromising an understanding of the structure of the devices.

Many steps conventionally used to process a gallium arsenide (also referred to as "GaAs") die, wafer or substrate and other compound semiconductors as described herein are well known in the art, and, in the interest of brevity, will not be described in detail. The basic steps include, for example, molecular-beam epitaxy, metal-organic chemical vapor deposition, patterning, exposing, etching, vacuum depositing, plating, doping, alloying, annealing, and cleaning. For reference purposes, R. Williams describes many conventional processes for constructing a gallium arsenide device in "Modern GaAs Processing Methods." Additionally, several separate processing steps may be generally combined into a single step within the scope of the present invention, such as a combined annealing step wherein a number of alloys that are separately deposited are heated together to jointly activate the alloys. Further, alternative methods to perform a processing step such as vacuum deposition, sputtering, or plating processes may be combined or performed separately without further elaboration herein. Also, while selected doping levels and characteristics such as thickness of layers that make up an exemplary lateral FET will hereinafter be provided, those skilled in the art understand that alternative doping levels and characteristics may be provided and still be within the broad scope of the present invention. For instance and in the appropriate circumstances, the layers may be oppositely doped, such as a p-type layer may be replaced with an n-type layer.

Referring now to FIGS. 3 to 35, illustrated are cross-sectional views of an embodiment of constructing a semiconductor device (e.g., a lateral FET including a parallel-coupled Schottky diode) according to the principles of the present invention. The process as described below removes a semi-insulating substrate on which the device is formed. Of course as described in U.S. Patent Application Publication No. 2006/0255360 introduced above, the device can be formed on a doped substrate, which may be thinned but not removed with accommodation for the processing steps to retain the substrate.

Beginning with FIG. 3, the lateral FET is formed on a substrate (e.g., GaAs substrate) 301. The substrate 301 is preferably semi-insulating for low cost since it will be removed during a later processing step. Optionally, the substrate 301 may be a doped (e.g., n-type doped) conductive layer (e.g., a conductive substrate). The substrate 301 may be chosen to be sufficiently thick, such as 650 μm, to provide mechanical and chemical support for semiconductor processing and handling, and may be supported by a further underlying medium.

If the substrate 301 is optionally doped, a preferred n-type doping material for GaAs is silicon ("Si"), but selenium ("Se"), tellurium ("Te") or other doping materials or combinations thereof may be employed within the broad scope of the present invention. Although the lateral FET described herein is GaAs based, alternative semiconductor materials may be employed to form the substrate 301 such as a semiconductor material based on indium-phosphide ("InP") as well as oppositely doped semiconductors with essential properties of related materials appropriately altered.

As further illustrated in FIG. 3, a first buffer layer 302 (e.g., an n+ epitaxial buffer layer) is optionally deposited above the substrate 301. The first buffer layer 302 is preferably grown by molecular beam epitaxy or metal-organic chemical-vapor deposition to a preferred thickness of about 3000 angstroms ("Å"). A suitable n-type doping material such as Si may be employed, but alternatively Se, Te or other n-type dopant or combinations thereof may be employed in the epitaxial growth process. A preferred doping density is in the range of $7\times10^{17}$ to $5\times10^{18}$ cm$^{-3}$. The addition of the first buffer layer 302 generally provides a more uniform crystal structure for further epitaxial depositions than an ordinary, doped or undoped GaAs substrate 301, and thus is optionally included for the formation of the above layers for improved device characteristics.

Referring now to FIG. 4, illustrated is a first etch stop layer 303 deposited above the first buffer layer 302. The first etch stop layer 303 embodied in a thin aluminum-arsenide ("AlAs"), aluminum-gallium-arsenide ("AlGaAs"), indium-phosphide ("InP"), or indium-gallium-phosphide ("InGaP") epitaxial deposition is formed above the first buffer layer 302. Chemical-vapor deposition or other vacuum deposition process such as molecular beam epitaxy can be used for formation of the first etch stop layer 303, using techniques well known in the art. When an aluminum-gallium-arsenide deposition is used for the first etch stop layer 303, a relatively higher concentration of aluminum (with respect to gallium) would typically be used to provide a more robust etch stop layer for a subsequent etching process. The first etch stop layer 303 provides an etch stop for substantially complete removal of the substrate 301 and the first buffer layer 302 in a later processing step. The first etch stop layer 303 is preferably about 25 to 500 Å thick, and can be optionally doped n-type with a doping level approximately in the range of $1\times10^{17}$ to $5\times10^{18}$ cm$^{-3}$, or left undoped.

In an alternative embodiment, the first etch stop layer 303 may be deposited as an intermediary layer within a second buffer layer described hereinbelow with reference to FIG. 5, et seq. In such alternative embodiment, a portion of the second buffer layer is epitaxially deposited directly above the substrate 301, then the first etch stop layer 303 is deposited, followed by completion of deposition of the second buffer layer.

Turning now to FIG. 5, above the first etch stop layer 303 is a second buffer layer (e.g., an n+ epitaxial buffer layer) 304 that is preferably grown by molecular beam epitaxy or metal-organic chemical-vapor deposition to a thickness of about 3000 angstroms ("Å"). In an alternative embodiment wherein the substrate 301 and the first buffer layer 302 are not removed, the initial portion of the second buffer layer 304 may be deposited directly on to the substrate 301 and intervening layers omitted. A suitable n-type doping material such as Si may be employed, but alternatively Se, Te or other n-type dopant or combinations thereof may be employed in the epitaxial growth process. A preferred doping density is in the range of $7\times10^{17}$ to $5\times10^{18}$ cm$^{-3}$. The addition of the second buffer layer 304 generally provides a more uniform crystal structure for further epitaxial depositions than an ordinary, doped GaAs substrate 301, and thus may be optionally included for the formation of the above layers for improved device characteristics. A preferred thickness for the second buffer layer 304 is 3000 Å, but a thicker layer may be grown to provide increased rigidity of the die after a later thinning step described below regarding removal of the substrate. The added device on-resistance of the device as a result of making the second buffer layer 304 thicker is not significant.

Figure 6:
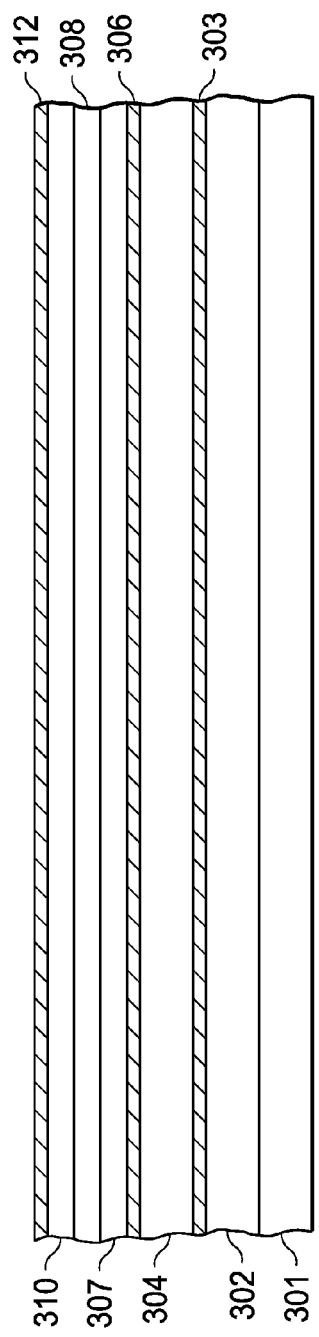

Turning now to FIG. 6, a second etch stop layer 306 is deposited above the second buffer layer 304. The second etch stop layer 306 is embodied in a thin aluminum-arsenide ("AlAs"), aluminum-gallium-arsenide ("AlGaAs"), indium-phosphide ("InP"), or indium-gallium-phosphide ("InGaP") epitaxial deposition as described hereinabove with reference to the first etch stop layer 303. The second etch stop layer 306 is preferably about 25 to 500 Å thick and can be doped n-type with a doping level in the range of $1\times10^{17}$ to $5\times10^{18}$ cm$^{-3}$ or undoped. Above the second etch stop layer 306, a first isolation layer 307 (e.g., a p+ isolation layer) is formed with a thickness preferably of about 100 nanometers ("nm"), and is heavily p-doped with a doping level preferably of about 1 to $5\times10^{19}$ cm$^{-3}$. Above the first isolation layer 307, a second isolation layer 308 (e.g., a lightly p-doped isolation layer) is formed with a thickness preferably of about 1 to 3 µm, and is p-doped with a doping level preferably of about $1\times10^{15}$ to $1\times10^{16}$ cm$^{-3}$ to provide a high blocking voltage rating for the device. Above the second isolation layer 308, a third buffer layer (e.g., a gallium arsenide n-type doped buffer layer) 310 is epitaxially formed, preferably with a doping level of $1\times10^{17}$ cm$^{-3}$ and a thickness of 500 Å. A suitable n-type doping material such as Si may be employed, but another n-type dopant or combinations thereof may be employed in the epitaxial growth process.

A third etch stop layer 312 is deposited above the third buffer layer 310. The third etch stop layer 312 is embodied in a thin aluminum-arsenide ("AlAs"), aluminum-gallium-arsenide ("AlGaAs"), indium-phosphide ("InP"), or indium-gallium-phosphide ("InGaP") epitaxial deposition as described hereinabove with reference to the first etch stop layer 303. The fourth etch stop layer 340 is preferably about 25 to 500 Å thick and can be doped n-type with a doping level in the range of $1\times10^{17}$ to $5\times10^{18}$ cm$^{-3}$ or can be left undoped.

Figure 7:
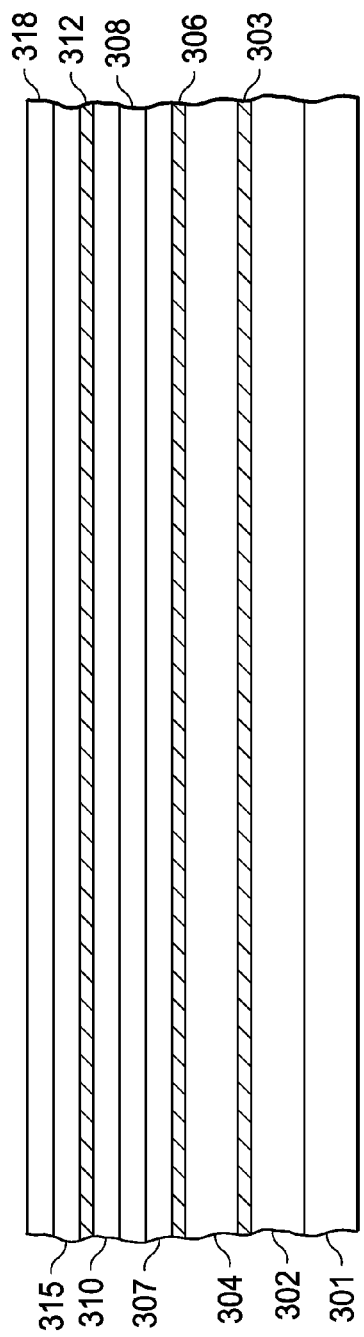

Referring next to FIG. 7, a fourth buffer layer 315 located above the third etch stop layer 312 is an alternating aluminum-gallium arsenide/gallium arsenide ("AlGaAs/GaAs") super-lattice buffer that is sequentially deposited epitaxially to improve the smoothness of the surface of the crystal and to increase the mobility of the electrons in the channel to be formed thereabove. The presence of aluminum may also act as a "getter" to capture and disable oxygen atoms that may otherwise be present in the subsequent growth. The fourth buffer layer 315 is deposited preferably with ten alternating layers of AlGaAs (0.24 Al), preferably about 185 Å thick, and GaAs, preferably about 15 Å thick. The total thickness of the fourth buffer layer 315 is approximately 2000 Å.

A first barrier layer 318 located above the fourth buffer layer 315 is an aluminum-gallium arsenide-phosphide AlGaAsP (0.24 Al and 0.05 P) bottom barrier/spacer that is epitaxially deposited at approximately 1000 Å to substantially block free carriers from flowing down to the layers therebelow. An n-pulse doping with Si ("delta doped"), preferably to a doping level of about $4\times10^{12}$ cm$^{-2}$, is thereafter performed thereon to supply the free carriers to the channel thereabove by the mechanism of modulation doping.

Figure 8:
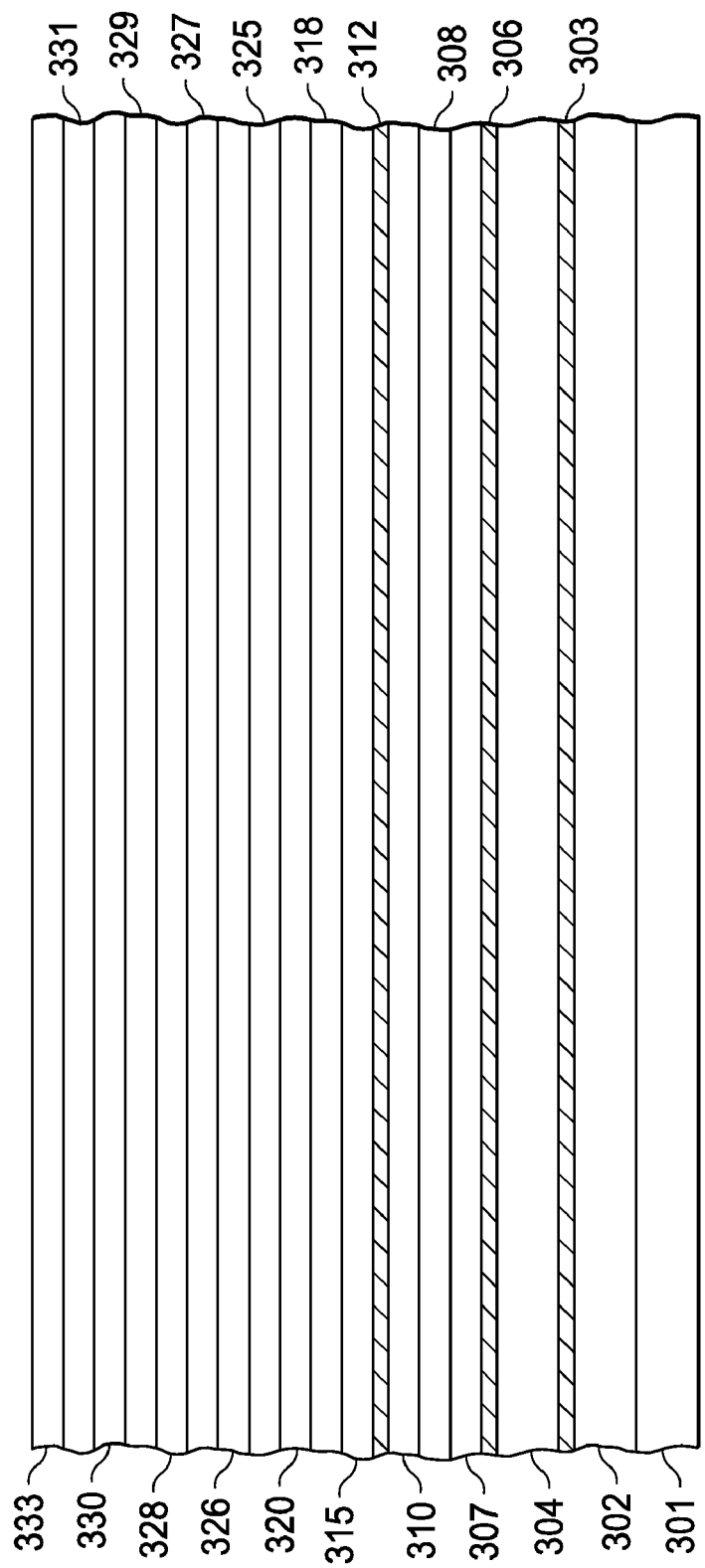

Turning now to FIG. 8, first spacer layer 320 [e.g., a substantially undoped AlGaAsP (0.24 Al and 0.05 P) spacer] is then epitaxially deposited at approximately 40 Å above the first barrier layer 318 to separate the effects of dopants from the channel, thereby separating the free carriers from the ionized sites and improving electron mobility therein. Above the first spacer layer 320 is a thin, indium-gallium arsenide ("InGaAs") layer that is epitaxially deposited with about 20% indium to form a first lateral channel 325 (also referred to as "a lateral channel" or "another lateral channel") with controllable conductivity. Due to the substantial lattice mismatch between GaAs and InGaAs, the first lateral channel 325 is inherently lattice-strained (i.e., it is "pseudomorphic," and the resulting device is referred to as a pseudomorphic high-electron-mobility transistor, or a "pHEMT") and is preferably less than about 100 Å to prevent lattice dislocations and formation of polycrystalline structure in the layers to be deposited thereabove. The lattice-strained channel provides higher carrier mobility owing to a reduced effective mass of the carriers. The first lateral channel 325 provides the controllable conduction mechanism between the source and drain of the lateral FET and provides a modulation-doped channel with reduced crystalline irregularities for free carriers supplied by adjacent pulsed doped layers.

A second spacer layer 326 [e.g., a substantially undoped AlGaAsP (0.24 Al and 0.05 P) spacer] is then epitaxially deposited at approximately 40 Å above the first lateral channel 325 to separate the effects of dopants from the channel, thereby separating the free carriers from the ionized sites and improving the electron mobility therein. An n-pulse doping with Si ("delta doped"), preferably to a level of about $4\times10^{12}$ cm$^{-2}$, is thereafter performed thereon to supply free carriers to the first lateral channel 325 below and to a second lateral channel to be deposited thereabove by the mechanism of modulation doping. A third spacer layer 327 [e.g., a substantially undoped AlGaAsP (0.24 Al and 0.05 P) spacer] is then epitaxially deposited at approximately 40 Å above the second spacer layer 326 to separate the effects of dopants from a second lateral channel to be deposited thereabove, again separating free carriers from the ionized sites and improving electron mobility of a second lateral channel.

Above the third spacer layer 327 is a second, thin, indium-gallium arsenide ("InGaAs") layer that is epitaxially deposited with about 20% indium to form a second lateral channel 328 (also referred to as "a lateral channel" or "another lateral channel") with controllable conductivity. Again, due to the substantial lattice mismatch between GaAs and InGaAs, the second lateral channel 328 is inherently lattice-strained and is preferably less than about 100 Å to prevent lattice dislocations and formation of polycrystalline structure in the layers to be deposited thereabove.

A fourth spacer layer 329 [e.g., a substantially undoped AlGaAsP (0.24 Al and 0.05 P) spacer] is then epitaxially deposited at approximately 40 Å above the second lateral channel 328 to separate the effects of dopants from the second lateral channel 328 as described hereinabove. An n-pulse doping with Si ("delta doped"), preferably to a level of about $4\times10^{12}$ cm$^{-2}$, is thereafter performed thereon to supply free carriers to the second lateral channel 328 and to a third lateral channel to be deposited thereabove by the mechanism of modulation doping. A fifth spacer layer 330 [e.g., a substantially undoped AlGaAsP (0.24 Al and 0.05 P) spacer] is then epitaxially deposited at approximately 40 Å above the fourth spacer layer 329 to separate the effects of dopants from a third lateral channel above, thereby separating free carriers from the ionized sites and improving electron mobility of a third lateral channel.

Above the fifth spacer layer 330 is a third, thin, indium-gallium arsenide ("InGaAs") layer that is epitaxially deposited with about 20% indium to form a third lateral channel 331 (also referred to as "a lateral channel" or "another lateral channel") with controllable conductivity. Again, due to the substantial lattice mismatch between GaAs and InGaAs, the third lateral channel 331 is inherently lattice-strained and is preferably less than about 100 Å to reduce lattice dislocations and formation of polycrystalline structure in the layers to be deposited thereabove.

Above the third lateral channel 331 is another region (see below) that is epitaxially deposited including sub-layers of AlGaAsP (0.24 Al and 0.05 P) to provide additional free carriers (electrons) for modulation doping of the third lateral channel 331, and to provide a barrier for the free carriers in the third lateral channel 331. A sixth spacer layer 333 is undoped and deposited at about 40 Å to provide a spacer layer separating the free carriers in the third lateral channel 331 from ionized impurity sites. A n-pulse doping with Si ("delta doped"), preferably to a level of about $4\times10^{12}$ cm$^{-2}$, is performed on the sixth spacer layer 333 to induce additional free electrons with enhanced mobility that migrate across the sixth spacer layer 333 to the third lateral channel 331.

The inclusion of phosphorus in the spacer layers mentioned above provides a mechanism to at least partially compensate for the mismatch of the lattice constant for the lateral channels. For example, the lattice constant for InAs is 6.0584 Å, which indicates that the inclusion of indium in the lateral channels increases the lattice constant thereof. In comparison, the lattice constant for GaAs, which forms the foundation of the lateral FET, is 5.6533 Å. The lattice constant for GaP is smaller (5.4512 Å) than that for GaAs and, as such, indicates that the inclusion of phosphorus in the spacer layers produces an opposite component of strain on the crystal, thereby providing the compensation for the longer atomic spacing in the lateral channels resulting from the inclusion of indium atoms therein. In addition, the inclusion of phosphorus improves carrier confinement in the lateral channels due to its wider bandgap energy as opposed to, for instance, AlGaAs with the same aluminum composition. The strain balancing can be achieved by one of the following, namely, adjusting an indium composition in the lateral channels or a thickness thereof, and adjusting the phosphorous composition in the spacer layers or a thickness thereof. This will change the localized strain in the lateral channels and will change the carrier mobility. It also changes the height of the spacer layers and the aforementioned parameters may be adjusted to improve device performance. Thus, modulation doping is preferably achieved by separating the channel-conduction carriers from the carrier-contributing donor atoms located in the Si-pulsed areas. Carrier mobility in the first, second and third lateral channels 325, 328, 331 is thereby improved by providing a conductive path substantially undisturbed by lattice imperfections that would otherwise be affected by in-channel dopants.

Although the semiconductor device as described herein includes three lateral channels, semiconductor devices with one or more lateral channels are well within the broad scope of the present invention. When modifying the number of lateral channels, attention should be given to the concentration of phosphorous in the spacer layers, which relaxes the strain from the indium as described above. The inclusion of a plurality of lateral channels improves the on-resistance of a semiconductor device designed with a given die area, almost in proportion to the number of lateral channels. In addition, the breakdown voltage of the semiconductor device may be increased by the inclusion of the multiple lateral channels due to reduced localized electric field distribution around the edges thereof.

Figure 9:
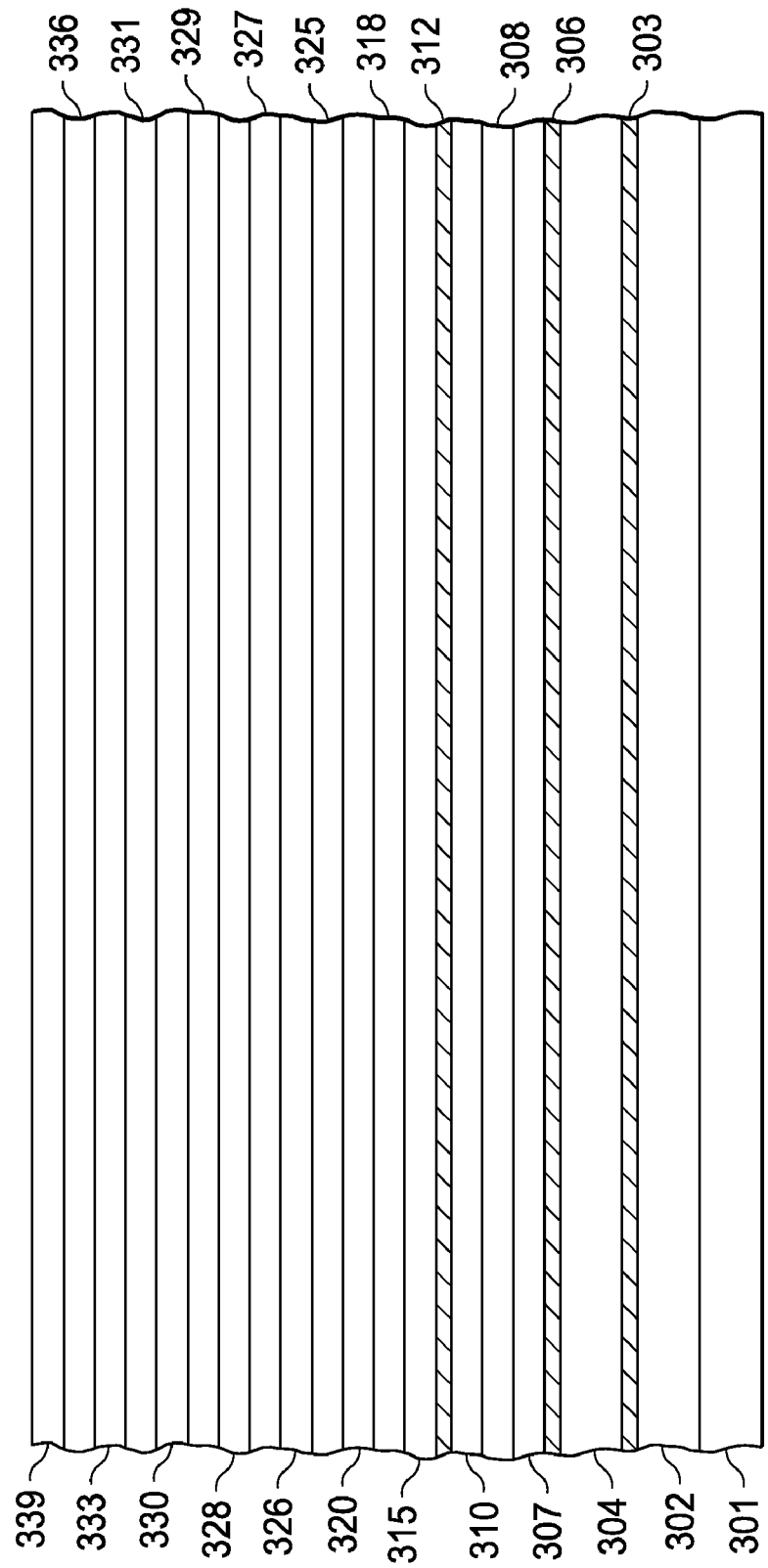

Turning now to FIG. 9, a second barrier layer 336 (embodied in an undoped AlGaAs layer) is then epitaxially deposited at about 210 Å with an n-doping level in the range of $1\times10^{17}$ to $5\times10^{17}$ cm$^{-3}$ or undoped. A recess layer 339 of GaAs is then epitaxially deposited, preferably at about 230 Å and Si-doped with a doping level in the range of $1\times10^{17}$ to $5\times10^{17}$ or undoped.

Figure 10:
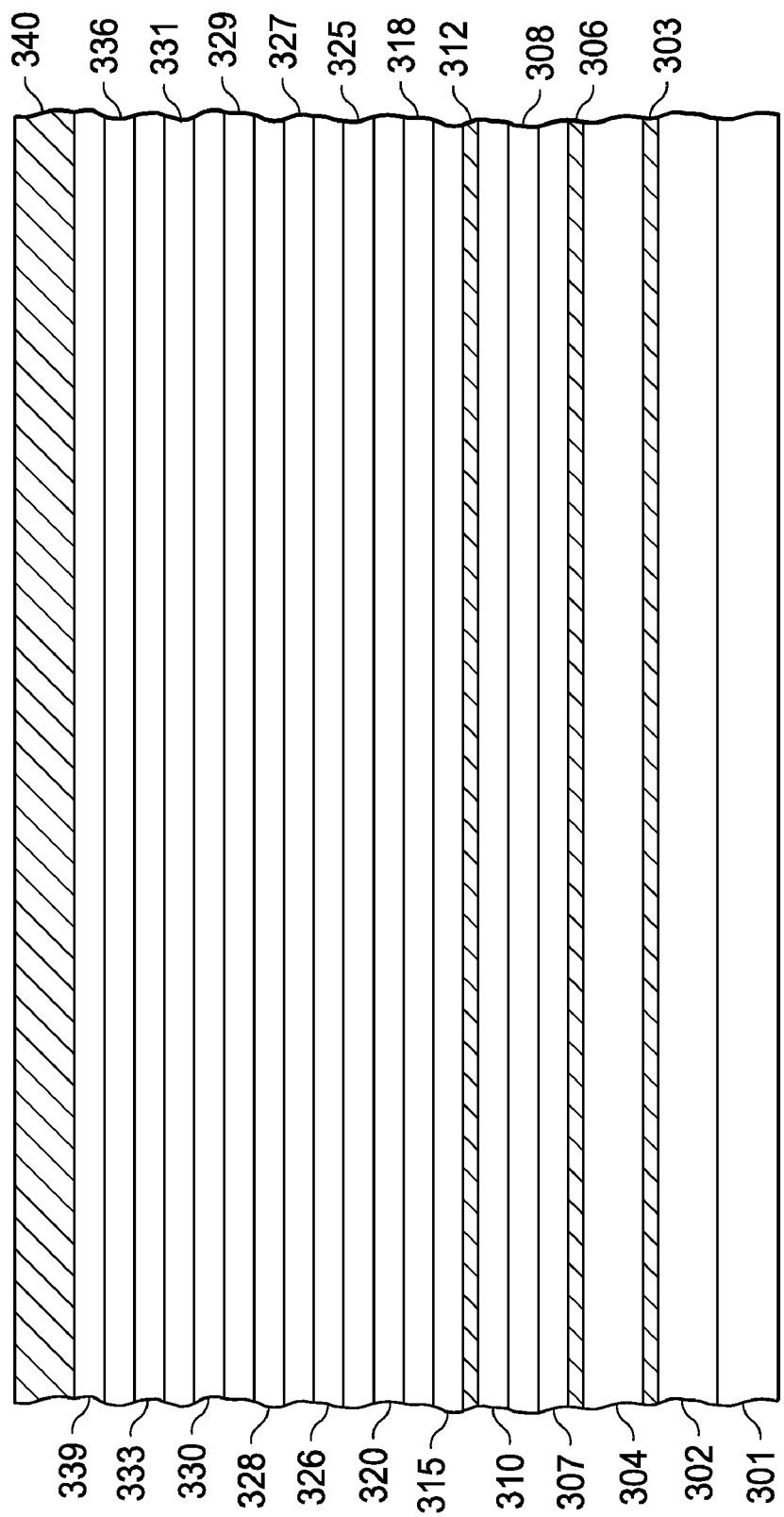

Turning now to FIG. 10, a fourth etch stop layer 340 embodied in a thin aluminum-arsenide ("AlAs"), indium-phosphide ("InP"), or indium-gallium-phosphide ("InGaP") epitaxial deposition is formed above the recess layer 339. The fourth etch stop layer 340 provides an etch stop for a later, trench-forming process for GaAs layers to be further deposited and doped thereabove. The fourth etch stop layer 340 is preferably about 25 to 500 Å thick and can be doped n-type with a doping level in the range of $1\times10^{17}$ to $5\times10^{18}$ cm$^{-3}$ or undoped.

Figure 11:
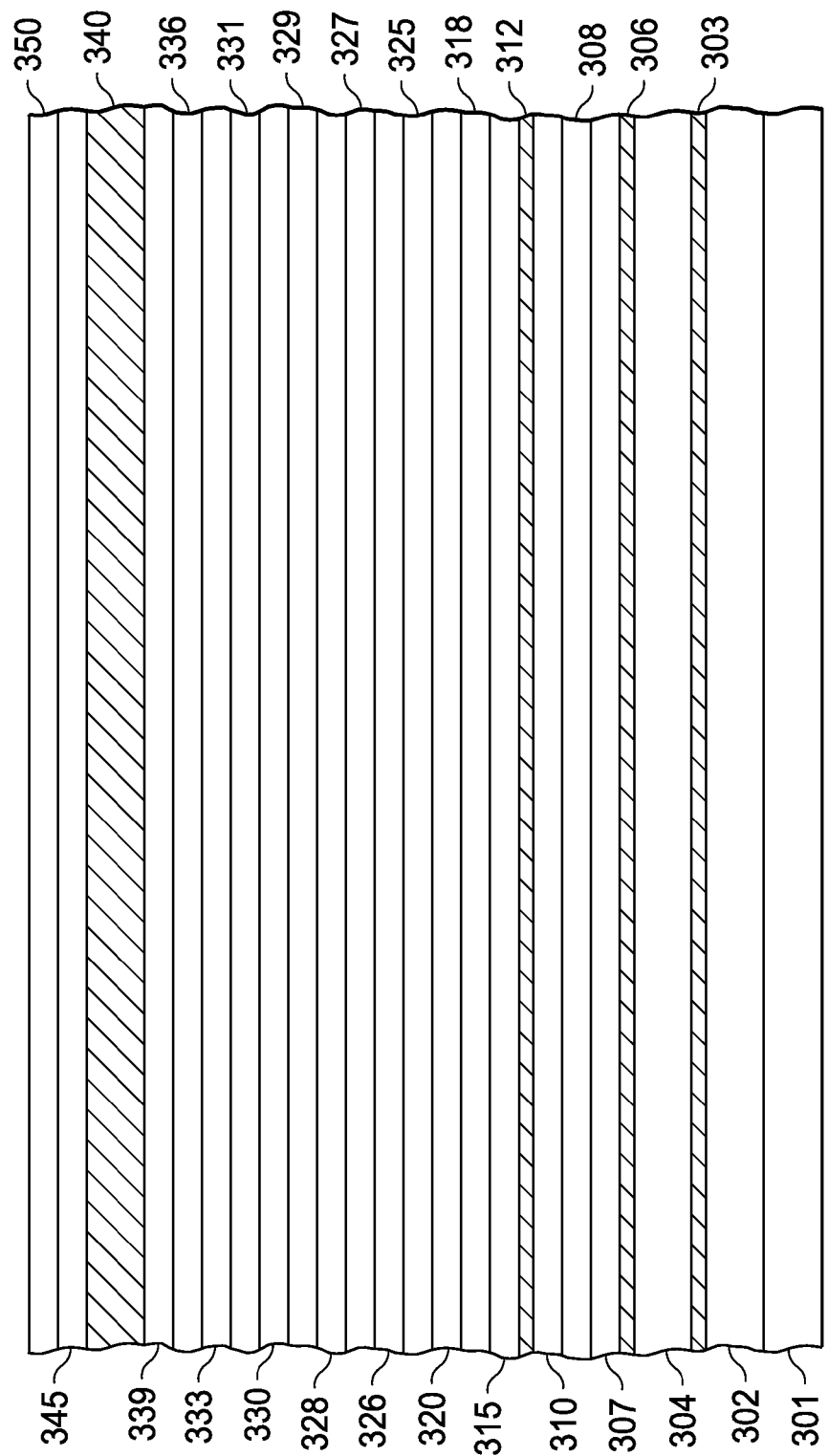

Turning now to FIG. 11, layers of GaAs are epitaxially deposited above the fourth etch stop layer 340 to form source and drain contact layers for the lateral FET. First, a first source/drain contact layer 345 of about 300 Å of an n-type doped layer of GaAs is epitaxially deposited, preferably using Si as the dopant with a doping level in the range of $1\times10^{17}$ to $1\times10^{18}$ cm$^{-3}$. Then, a second source/drain contact layer 350 of about 500 Å of a heavily doped n+ layer of GaAs is epitaxially deposited with a doping level in the range of $1\times10^{18}$ to $1\times10^{19}$ cm$^{-3}$ to improve formation of ohmic contacts for the source and drain and to reduce resistance in the source-to-gate and drain-to-gate regions of the channels.

Turning now to FIGS. 12 to 17, illustrated are cross-sectional views of an embodiment of constructing a source interconnect through the lateral FET in accordance with the principles of the present invention. The source interconnect is configured to create a low-resistance ohmic contact between the first, second and third lateral channels (also referred to as "lateral channels") 325, 328, 331 and a metallic contact to be formed on the lower surface of the die.

Figure 12:
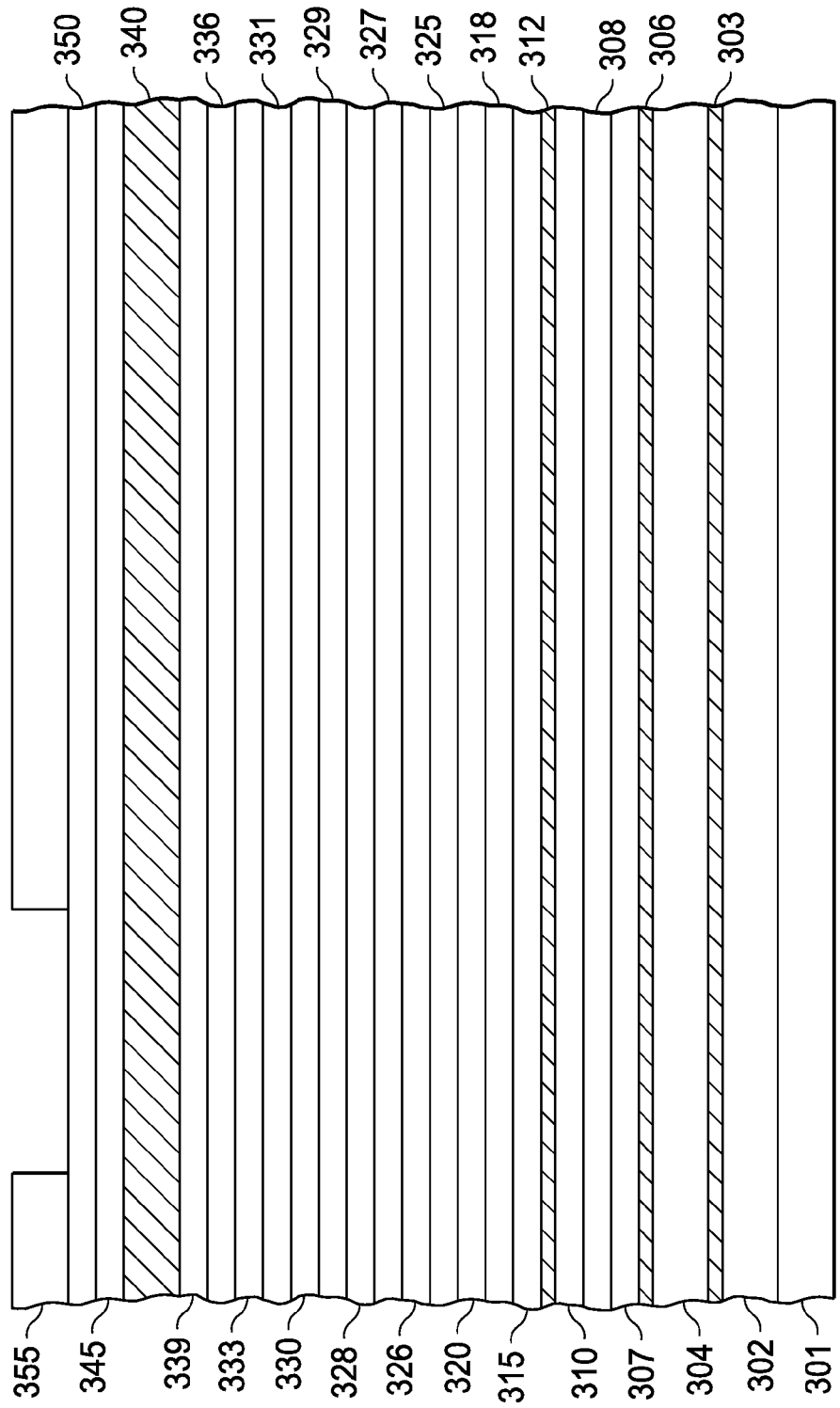
Figure 13:
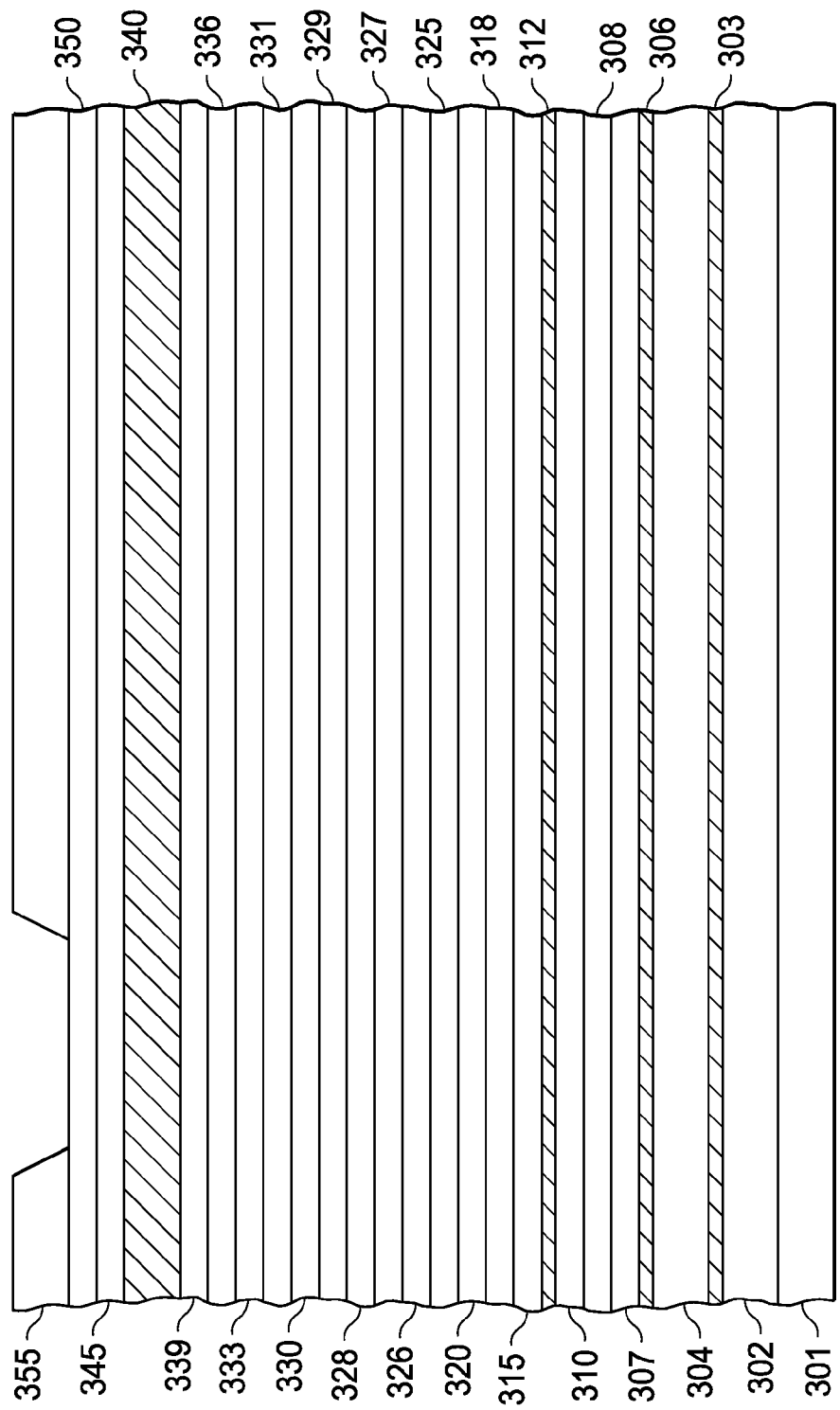

Turning first to FIG. 12, a spun-on photoresist 355 is illustrated that has been masked, exposed and developed as is well known in the art preparatory to forming a trench for access to the layers therebelow. The photoresist 355 is then baked (e.g., reflowed) such as on a hot plate or oven at about 110 to 150 degrees Celsius and in a normal atmosphere, which cures the photoresist 355 and causes a lower surface of the photoresist 355 facing the trench to encroach toward the trench, forming a generally angular aspect to the trench as illustrated with respect to FIG. 13. The angle of the slope in the photoresist 355 can be controlled by modifying a duration and temperature profile of the reflow process as is well understood in the art.

Figure 14:
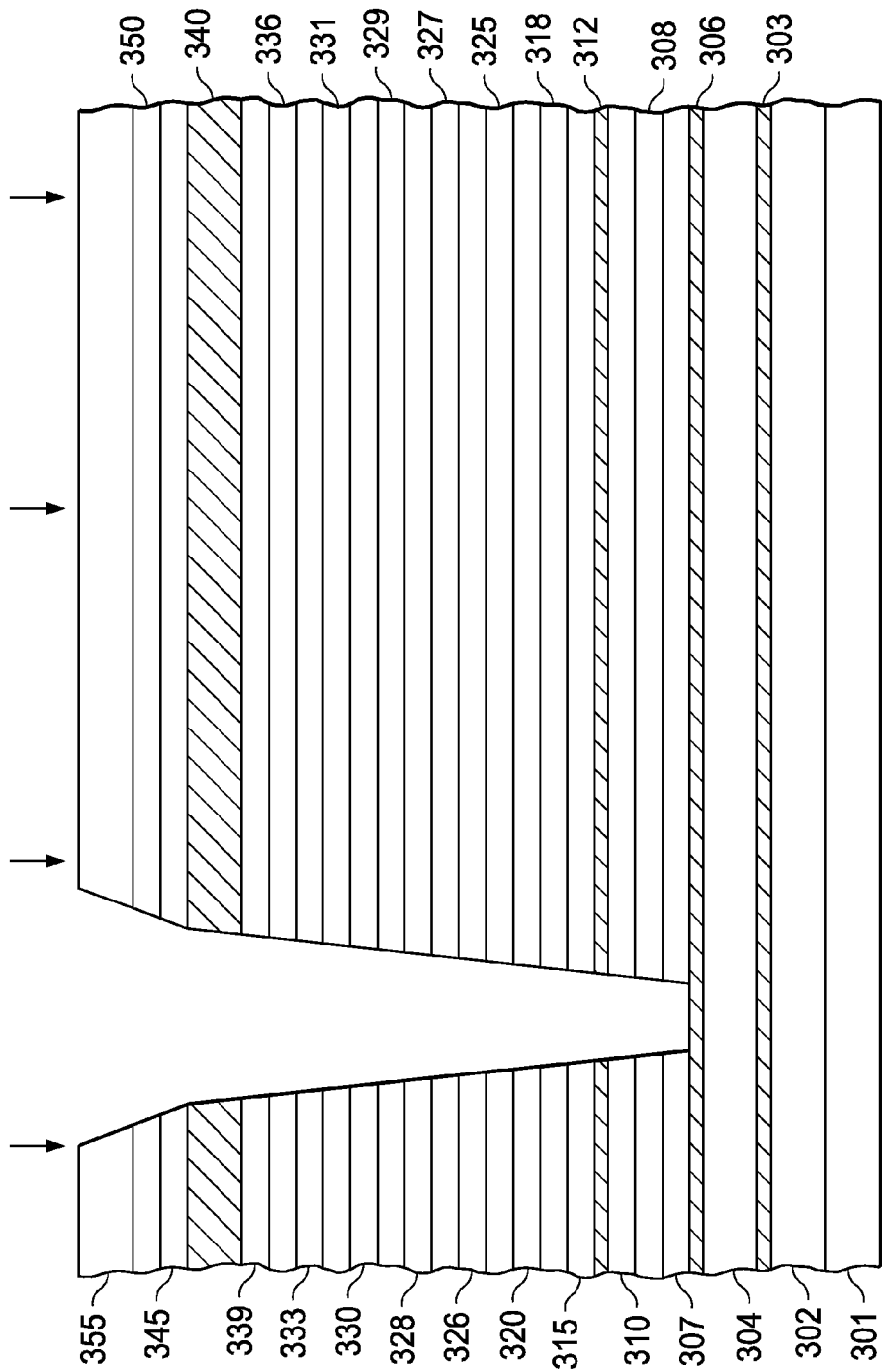
Figure 15:
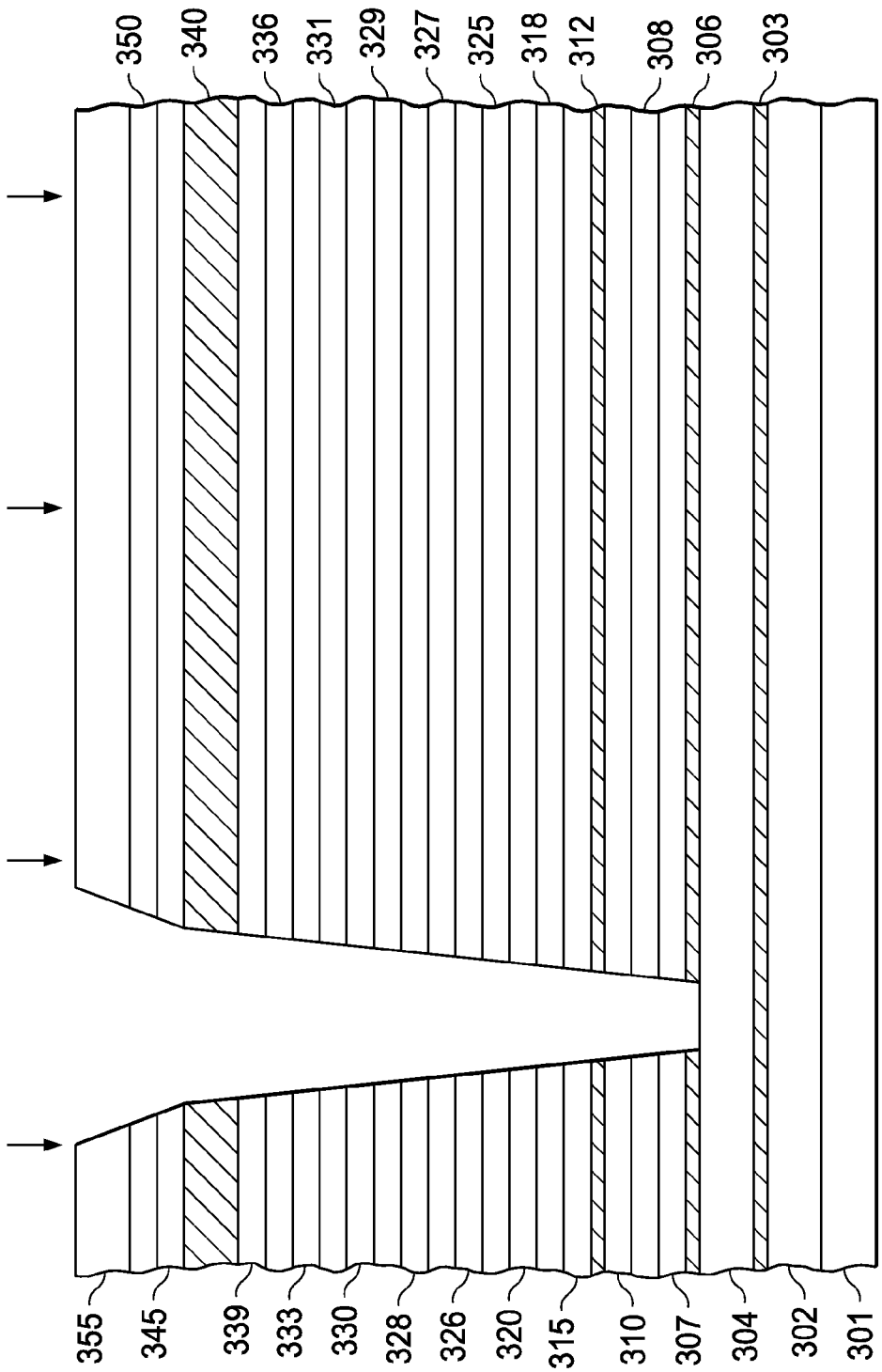

Turning now to FIG. 14, the portion of the lateral FET unprotected by the photoresist 355 is anisotropically dry etched, preferably using an inductively coupled plasma (i.e., an "ICP" dry etch) for a controlled period of time to form a source via (or trench) through the layers of the lateral FET down to the third etch stop layer 312. The presence of the third etch stop layer 312 facilitates controllably etching the source trench to the bottom of the fourth buffer layer 315. The third etch stop layer 312 is then removed from the bottom of the trench using a wet etch such as a hydrochloric acid ("HCl")-based etch. The anisotropic dry etch is then continued for a controlled period of time through the third buffer layer 310 and the first and second isolation layers 307, 308 to the second etch stop layer 306. The presence of the second etch stop layer 306 facilitates controllably etching the source trench to the bottom of the first isolation layer 307. The second etch stop layer 306 is then removed from the bottom of the trench using a wet etch such as an HCl-based etch as illustrated in FIG. 15. This sequence of etching steps facilitates forming a low-resistance contact between the first, second and third lateral channels 325, 328, 331 and a metal layer (a source contact)

that is deposited over ("below" as illustrated in the FIGUREs) the second buffer layer 304, as illustrated and described below with reference to FIG. 34. The non-selective dry etching may further alter a profile of the photoresist 355. Gallium arsenide is generally etched faster than the photoresist 355 by the ICP dry etching, producing a general slope in the walls of the trench in exposed portions of the GaAs and can also produce sloping walls in exposed intervening layers (some slopes not shown).

Figure 16:
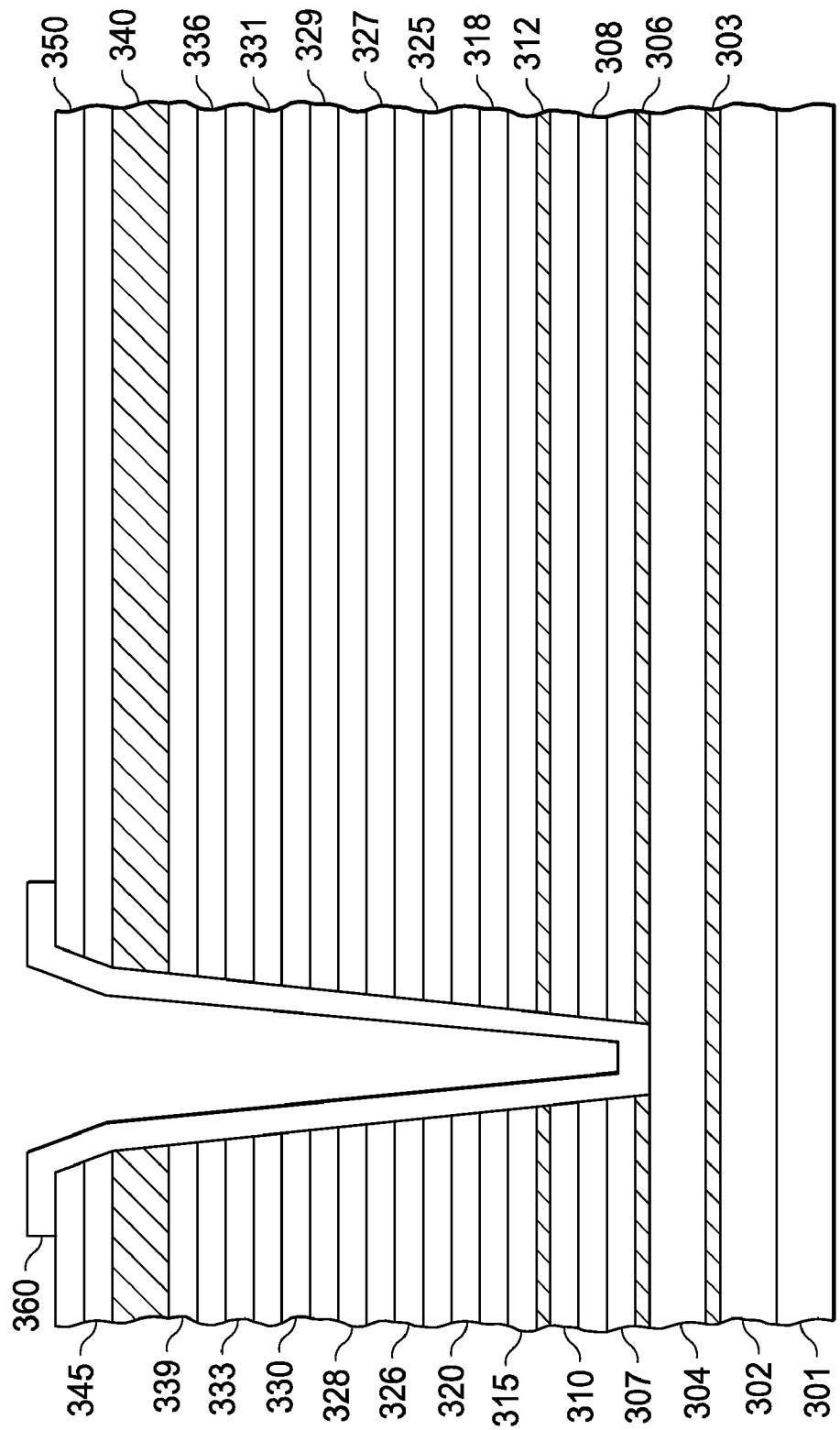

Turning now to FIG. 16 the walls of the source trench should be sufficiently sloped so that a thin metal layer (generally designated 360) can be deposited on horizontal and semi-horizontal surfaces, preferably by a vacuum evaporation and deposition process. The metal material is anisotropically deposited onto the horizontal surfaces such as the bottom of the source trench and on the sloped surfaces. Typically, about 3000-4000 Å of gold ("Au"), germanium ("Ge"), nickel ("Ni"), and then gold are preferably sequentially deposited and annealed to produce an alloy with a low-resistance ohmic contact and good adhesion with the first, second and third lateral channels 325, 328, 331 and the second buffer layer 304. Other alloys such as palladium-germanium-gold, nickel-indium-germanium, palladium-germanium and aluminum-tin-nickel may be employed to advantage. Annealing causes an alloy to form among the metallic species and allows migration of metal into adjacent semiconductor material, forming a metal semiconductor eutectic, thereby enhancing its low-resistance, ohmic property.

Figure 17:
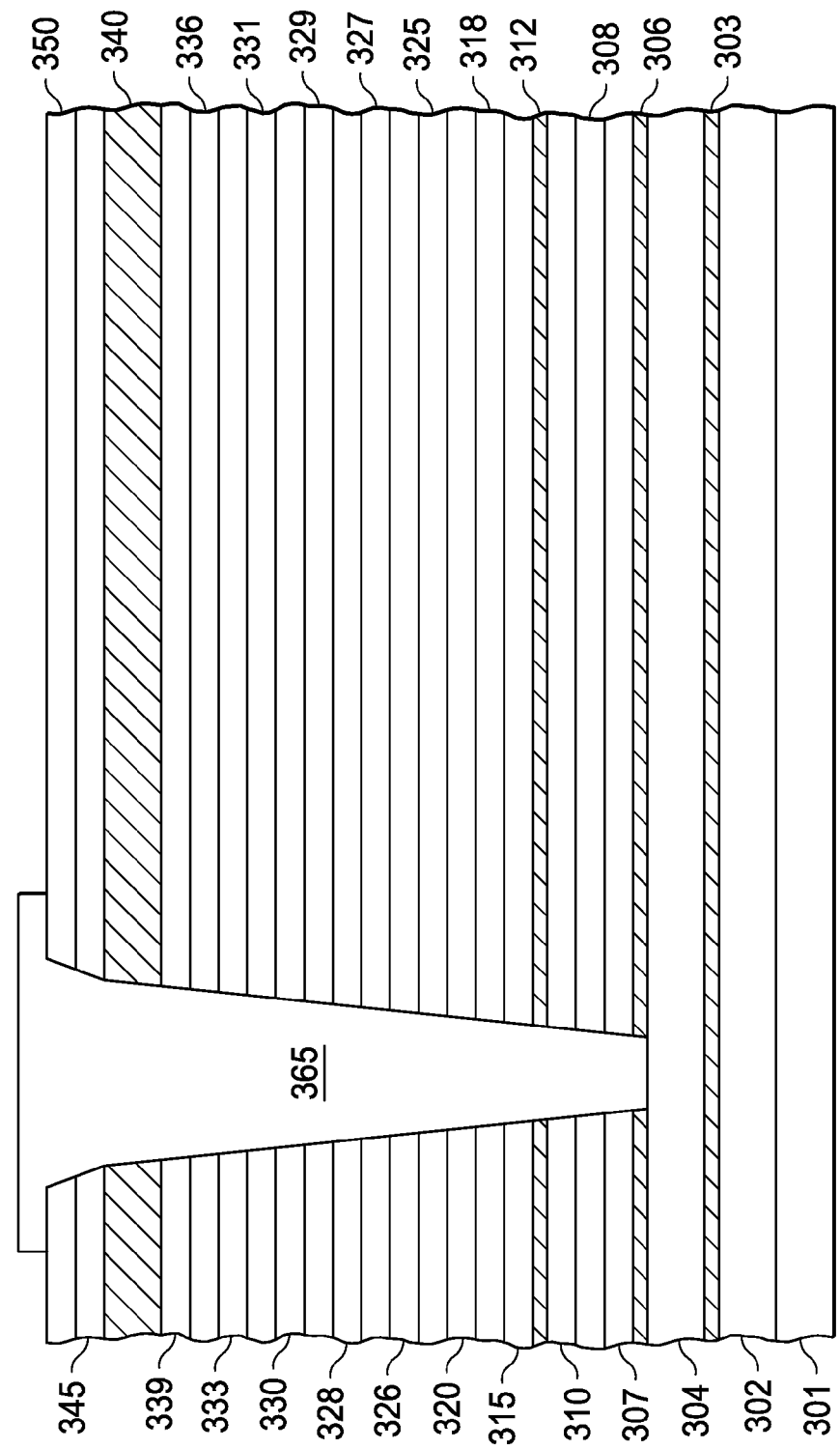
Figure 18:
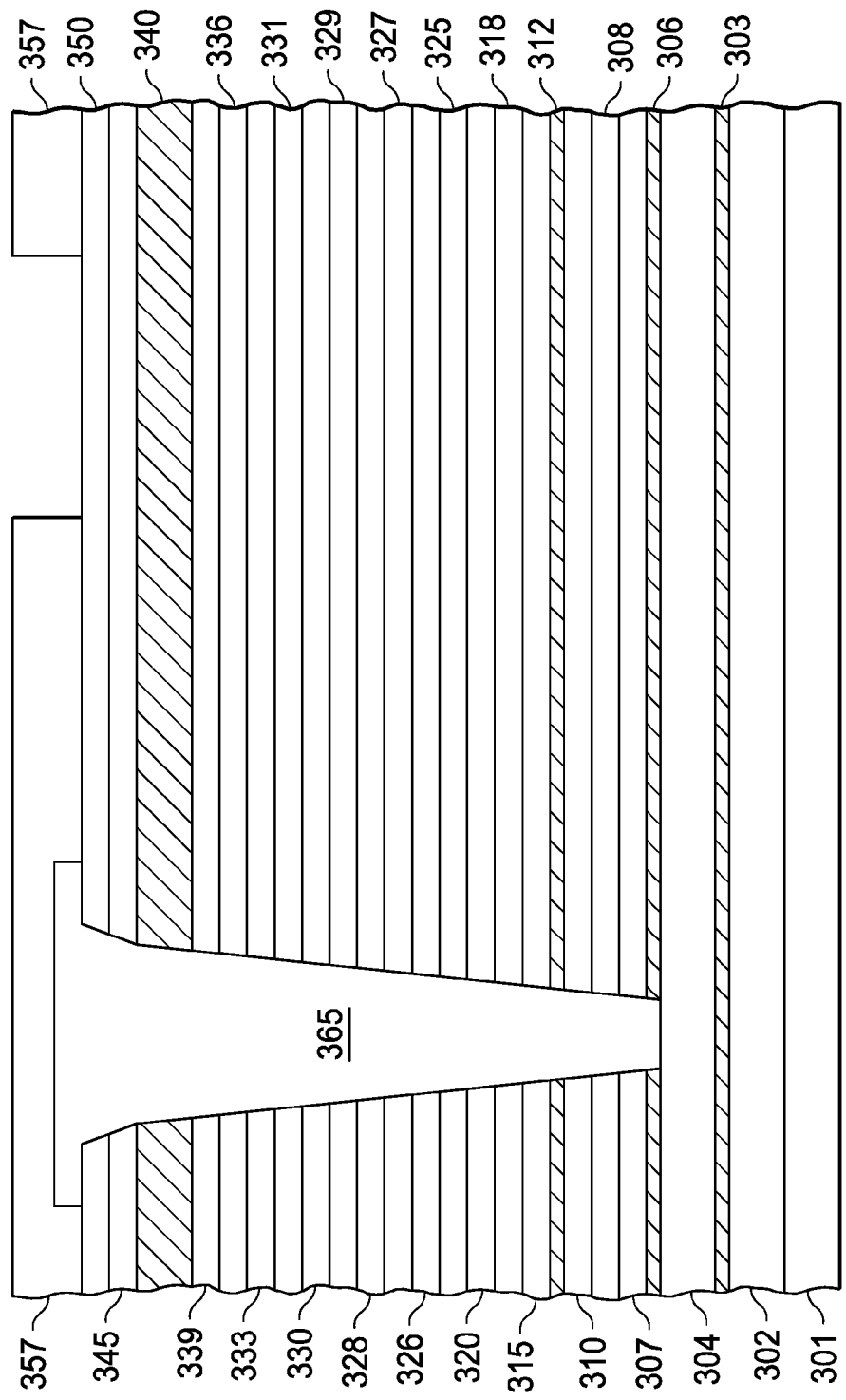
Figure 19:
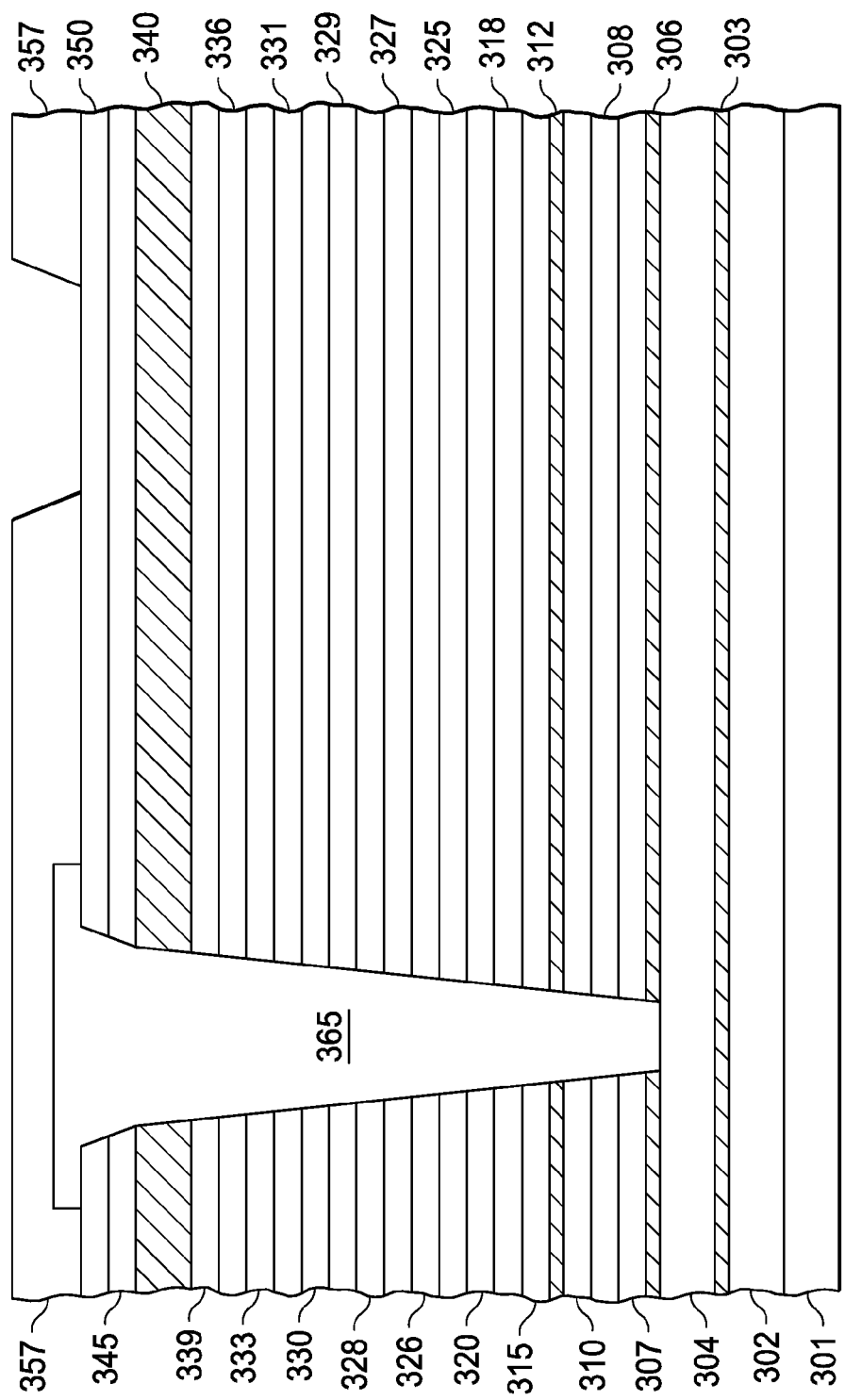

Turning now to FIG. 17, an electroplating process is thereafter performed to form a low-resistance source interconnect 365. The source interconnect 365 is filled substantially level with the top surface of the wafer with plated platinum and gold. The wafer is dipped into a plating solution and is connected to an electrical current source. A metal material of the plating solution (e.g., either platinum or gold) becomes ionized and is deposited on a conductive surface. The creation of the source interconnect 365 enhances a metallic path between the highly conductive portions of the first, second and third lateral channels 325, 328, 331 and the second buffer layer 304. In this manner, the lateral channels 325, 328, 331 between a source contact and a drain contact can be formed and a low-resistance contact to the source (coupled to the lateral channels 325, 328, 331) can be configured on an opposing surface of the lateral FET from a contact for the drain (also coupled to the lateral channels 325, 328, 331). Alternatively, an implant may be formed to create the source interconnect such as illustrated in U.S. Patent Application Publication No. 2006/0226477, entitled "Substrate Driven Field-Effect Transistor," to Brar, et al., published Oct. 12, 2006, which is incorporated herein by reference.

Turning now to FIGS. 18 to 23, illustrated are cross-sectional views of an embodiment of a monolithically integrated Schottky diode coupled in parallel with the source and drain contacts of the FET, including a low-resistance interconnect to the Schottky diode through the layers of the die, in accordance with the principles of the present invention. The Schottky interconnect is configured to form a Schottky diode at an interface with the third buffer layer 310. A spun-on photoresist 357 is illustrated with respect to FIG. 18 that has been masked, exposed and developed as is well known in the art preparatory to forming a trench for access to the layers therebelow. The photoresist 357 is then baked (e.g., reflowed) such as on a hot plate or oven at about 110 to 150 degrees Celsius and in a normal atmosphere, which cures the photoresist 357 and causes a lower surface of the photoresist 357 facing the trench to encroach toward the trench, forming a generally angular aspect to the trench as illustrated with respect to FIG. 19. The angle of the slope in the photoresist 357 can be controlled by modifying a duration and temperature profile of the reflow process as is well understood in the art.

Figure 20:
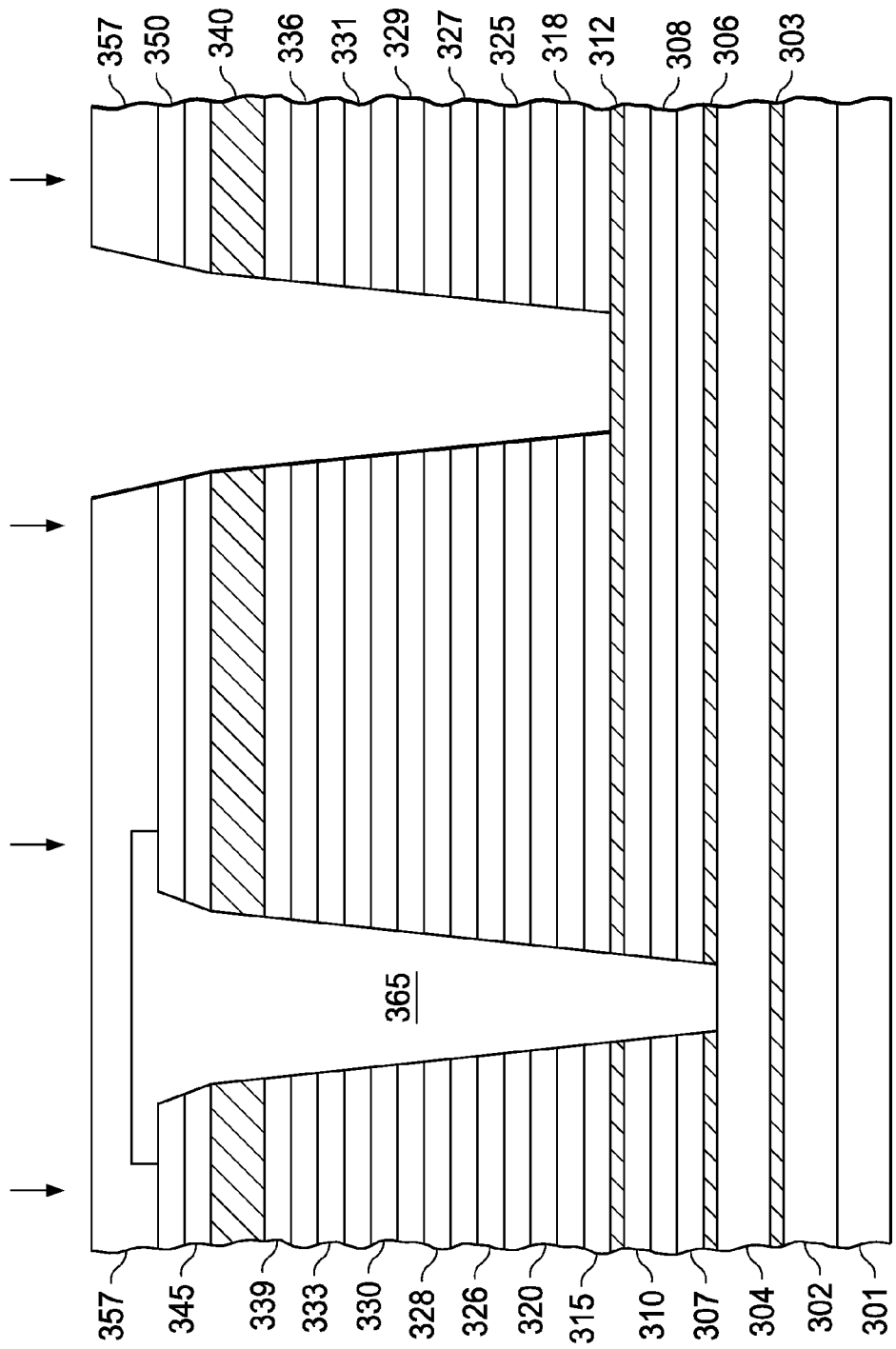
Figure 21:
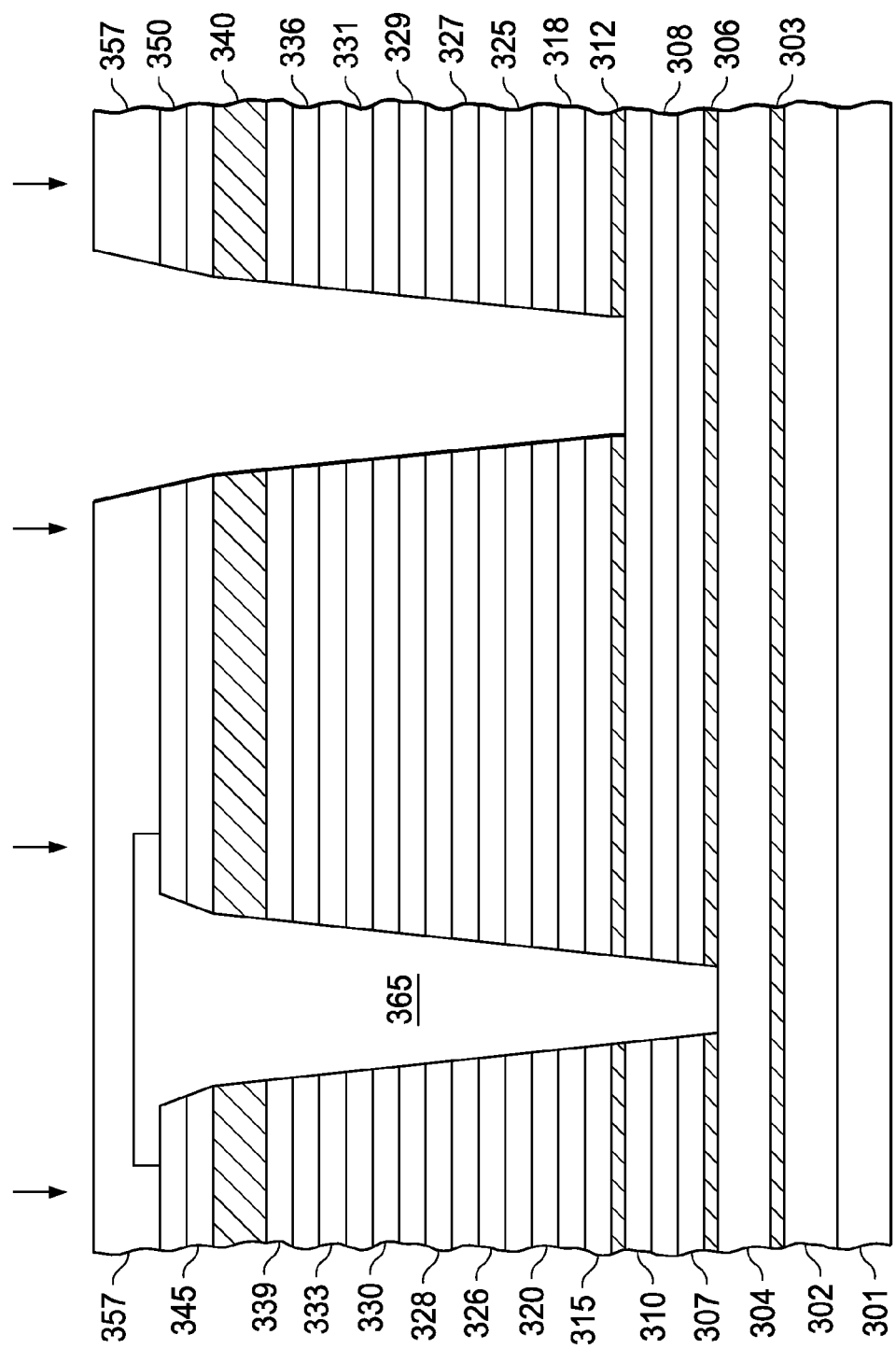

Turning now to FIG. 20, the portion of the lateral FET unprotected by the photoresist 357 is anisotropically dry etched, preferably using an inductively coupled plasma (i.e., an "ICP" dry etch) for a controlled period of time to form a Schottky via (or trench) through the layers of the lateral FET down to the third etch stop layer 312. The presence of the third etch stop layer 312 facilitates controllably etching the trench to the bottom of the fourth buffer layer 315. The third etch stop layer 312 is then removed from the bottom of the trench using a wet etch such as a HCl-based etch as illustrated in FIG. 21. This sequence of etching steps enables forming a Schottky interconnect between a Schottky contact and the third buffer layer 310. The non-selective dry etching may further alter a profile of the photoresist 357 in a manner as previously discussed hereinabove to produce sloping walls of the trench in exposed intervening layers.

Figure 22:
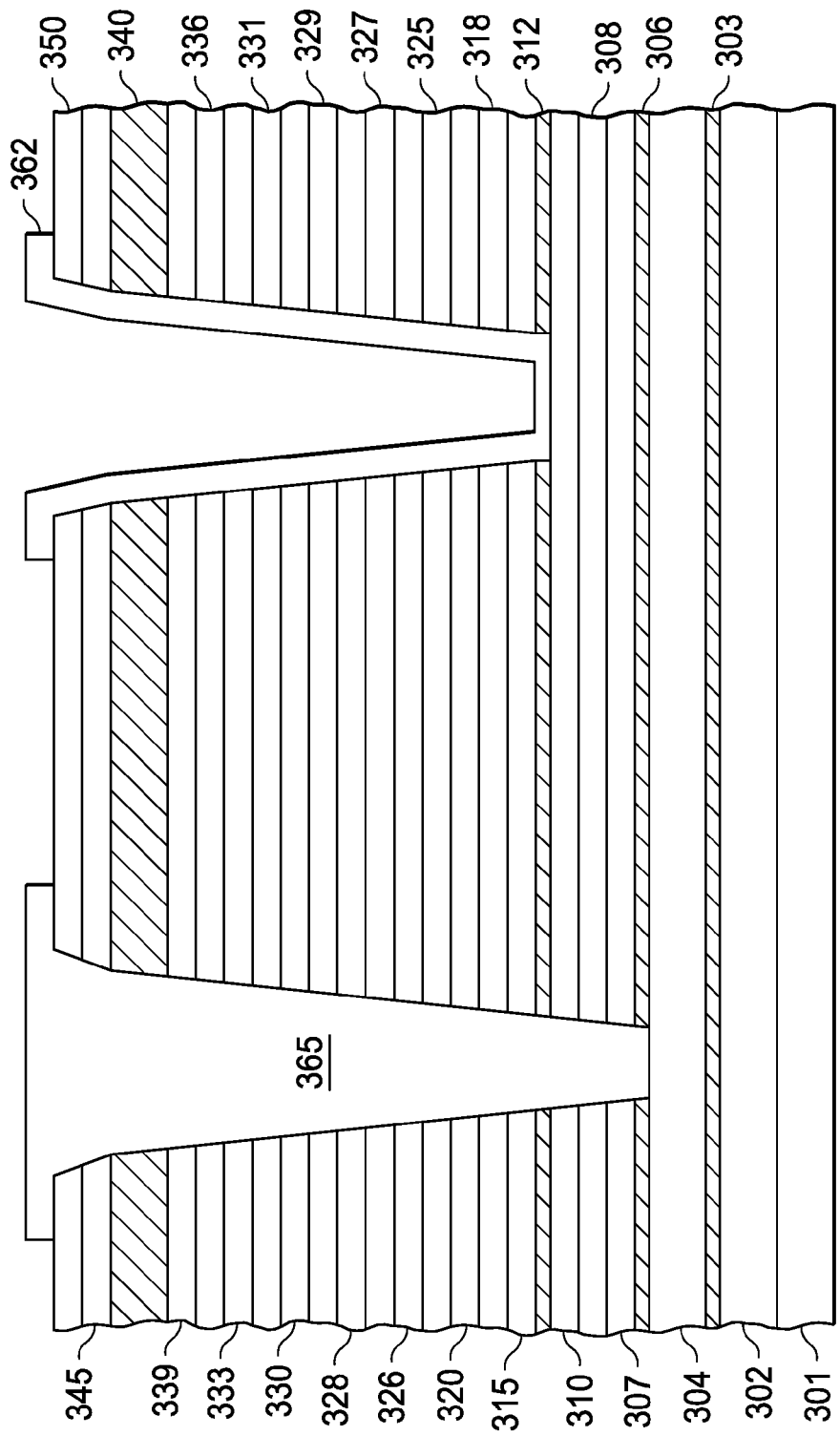

Turning now to FIG. 22, the walls of the Schottky interconnect trench should be sufficiently sloped so that a thin metal layer (generally designated 362) can be deposited on horizontal and semi-horizontal surfaces, preferably by a vacuum evaporation and deposition process. The metal material is anisotropically deposited onto the horizontal surfaces such as the bottom of the source trench and on the sloped surfaces. Typically, about 3000-4000 Å of titanium ("Ti"), platinum ("Pt"), and then gold ("Au"), are preferably sequentially deposited to produce an alloy with a Schottky contact and good adhesion with the third buffer layer 310. Other alloys forming a Schottky junction with the buffer layer such as titanium-tungsten ("TiW"), tantalum-nitrogen ("TaN"), and tungsten-silicon ("WSi") can also be used within the scope of the invention. Metal evaporated onto other areas of the die protected by the photoresist 357 are removed by a lift-off process, as is well understood in the art. The electrical characteristics of the Schottky junction formed by the metal layer 362 with the third buffer layer 310 can be controlled by the doping density thereof as understood by one with ordinary skill in the art. The metal layer 362 forms an anode of a Schottky diode and at least the third buffer layer 310 forms the cathode of the Schottky diode.

Figure 23:
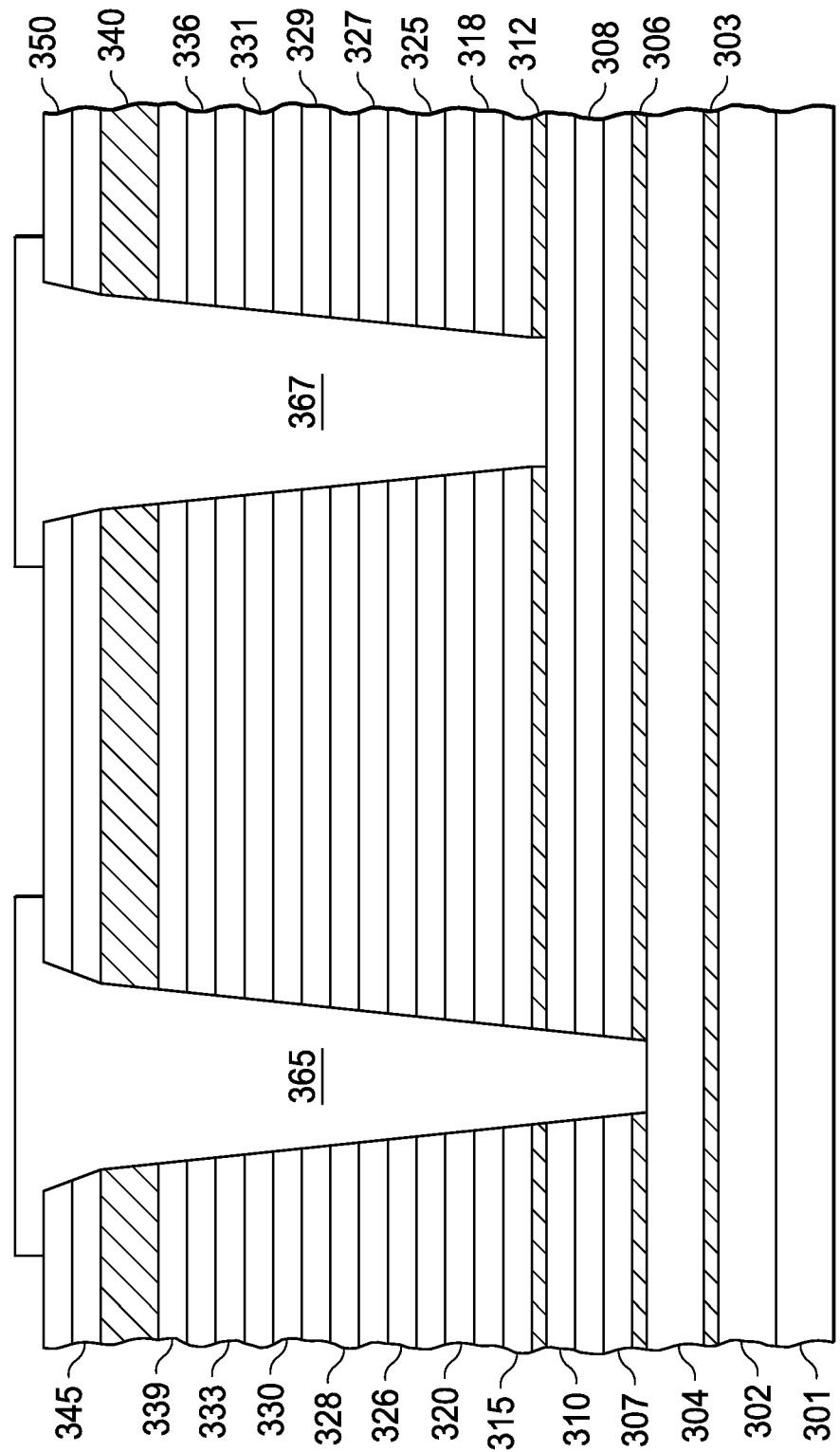

Turning now to FIG. 23, an electroplating process is thereafter performed to form a low-resistance Schottky interconnect 367. The Schottky interconnect 367 is filled substantially level with the top surface of the wafer with plated gold. The wafer is dipped into a plating solution and is connected to an electrical current source. A metal material of the plating solution (e.g., either platinum or gold) becomes ionized and is deposited on a conductive surface. In this manner, a low resistance Schottky interconnect can be formed accessible to an outside surface of the die. Alternatively, an implant may be formed to create the Schottky interconnect such as illustrated in U.S. Patent Application Publication No. 2006/0226477, as previously cited.

Figure 24:
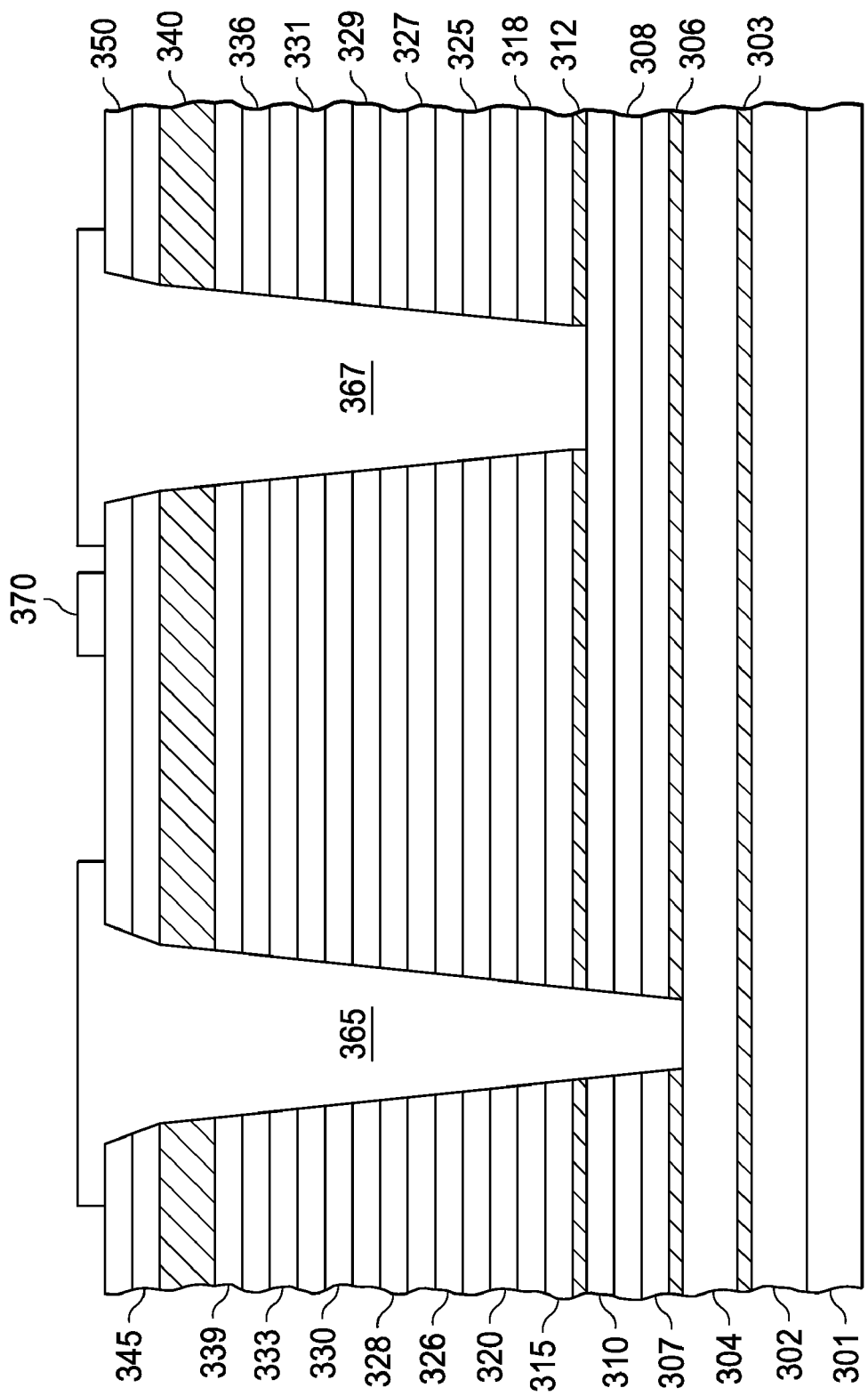

Turning now to FIG. 24, a metal layer 370 is deposited in an area associated with the drain, preferably by a vacuum evaporation and deposition process employing a patterned photoresist. The metal layer 370 provides a low-resistance ohmic contact for the drain. The metal layer 370 also provides a plating base for a process of constructing a drain post as set forth below. Additionally, the metal layer 360 described above with reference to FIG. 16 and the present metal layer 370 may be deposited at the same time by a technique referred to as a metal lift off process. In such a case, a photoresist is spun on the surface and patterned such that an area where the metal is desired gets exposed and the other areas are covered by the photoresist. Metal evaporation is thereafter performed on the patterned wafer. When the wafer is dipped into solvents, the metal on the top of the patterned photoresist is removed and only the metal on the exposed area remains. With this process, multiple ohmic contacts may be created as desired at the same time.

Figure 25:
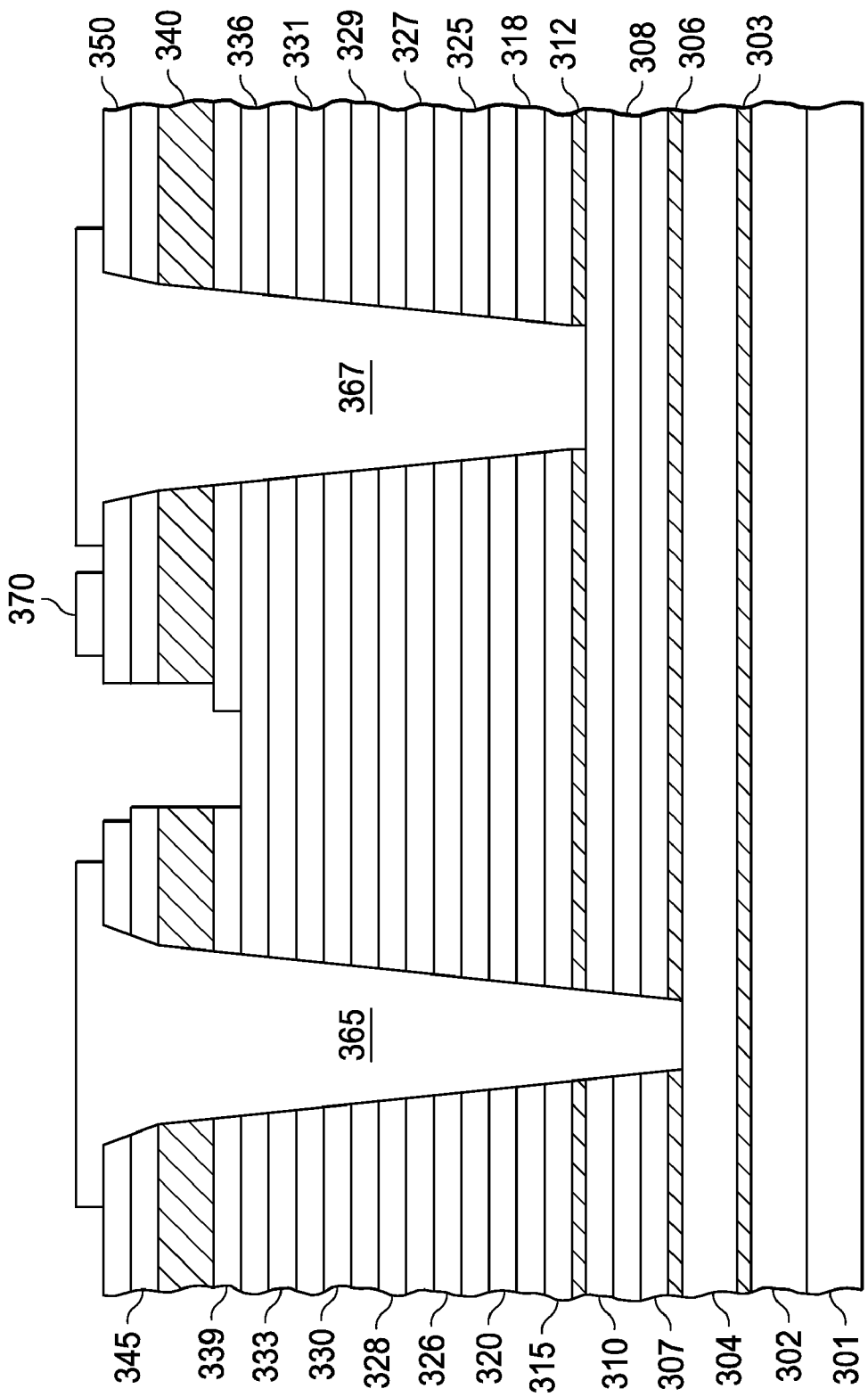

Turning now to FIG. 25, the first and second source/drain contact layers 345, 350 are then patterned and selectively etched to form a wide recess area, to provide a gate-to-drain separation distance as described below, down to the fourth etch stop layer 340. The fourth etch stop layer 340 is etched by a selective wet etch process such as an HCl-based etch. A gate recess is thereafter formed by patterning and selectively etching through the recess layer 339 down to the second barrier layer 336. The unetched portion of the recess layer 339 between a gate and drain allows the lateral FET to sustain a higher voltage (e.g., 20 volts or more) by reducing a high internal electric field that would otherwise damage or destroy the device. An appropriate etchant or etchants are used for the selective removal of the respective layers as is well understood in the art. The width of the gate recess and doping levels of selected layers can be advantageously chosen to increase the voltage sustaining capability of the device.

Figure 26:
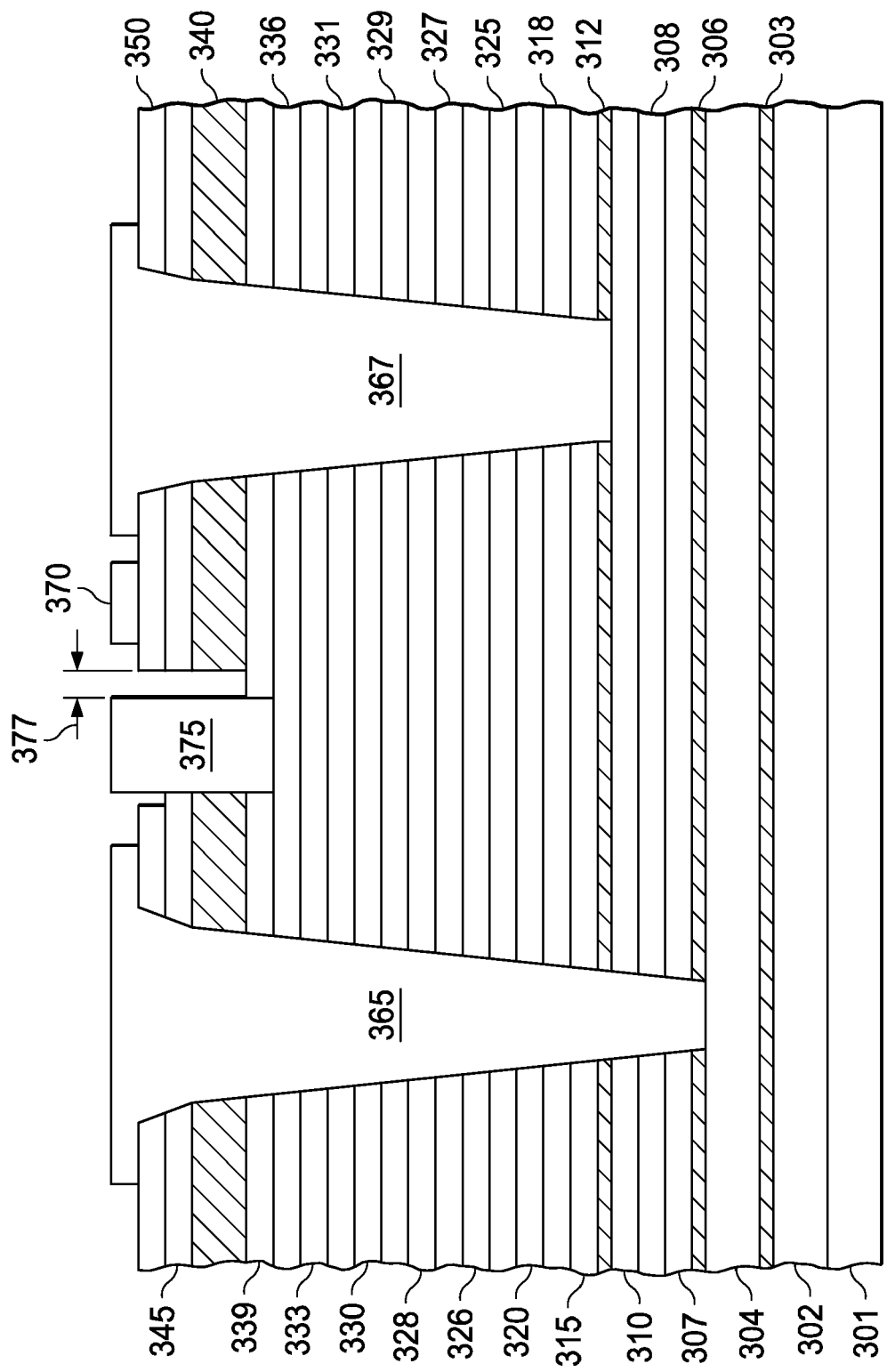
Figure 27:
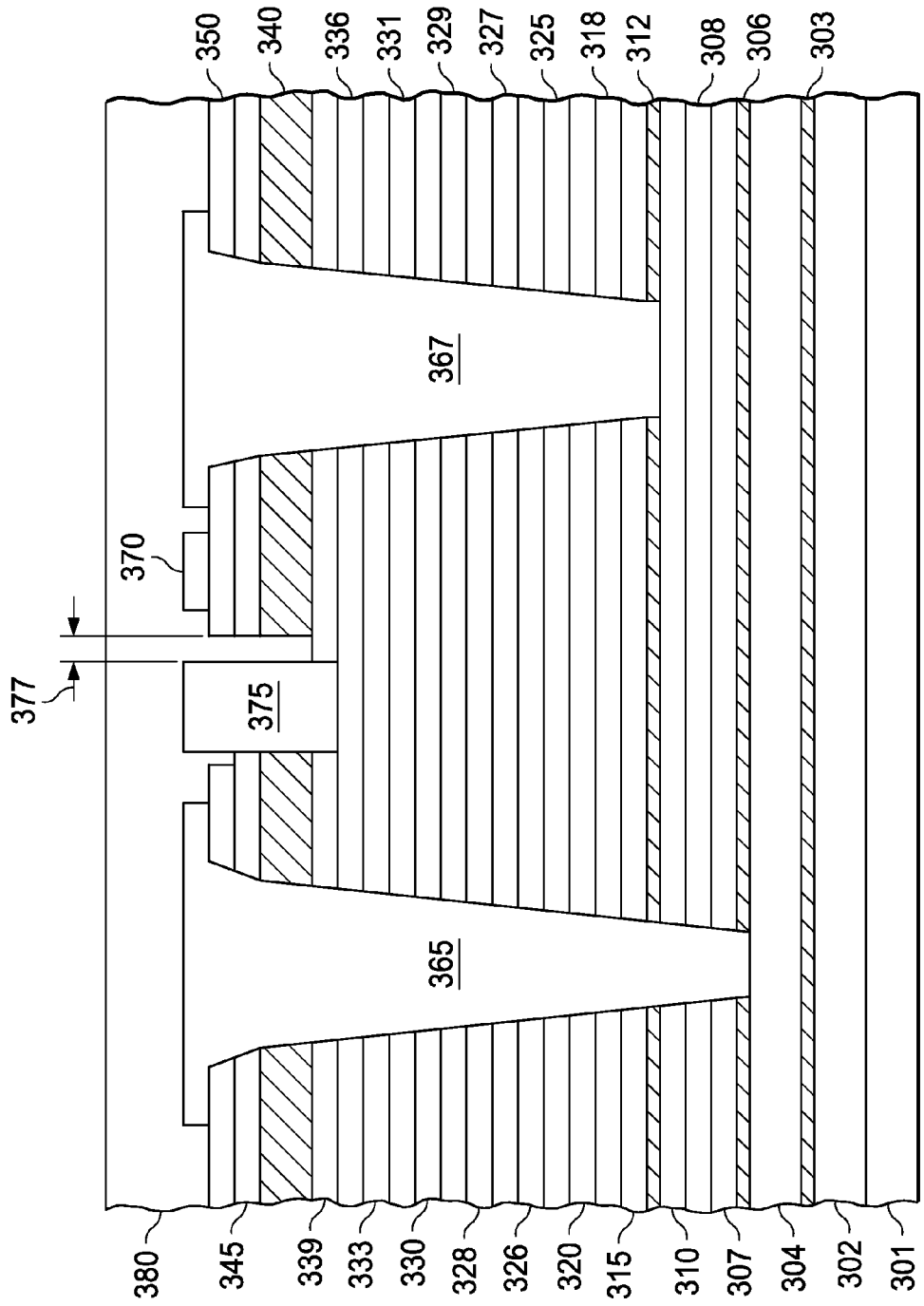

Turning now to FIGS. 26 and 27, a gate 375 is patterned and formed preferably by a self-aligned process in the gate recess. An enhanced gate-to-drain separation distance 377 between the gate 375 and drain formed in part by the first source/drain contact layer 345 is illustrated herein. An exemplary gate-to-drain separation distance is 0.2 µm for a lower voltage device and 1.5 µm for a higher voltage device. The drain is, therefore, offset from one side of the gate 375 by the gate-to-drain separation distance 377. It should be understood that the first source/drain contact layer 345 forms at least a portion of the source and drain on opposite sides of the gate 375 of the lateral FET. The gate 375 forms a Schottky junction and is formed with multiple layers, preferably metallic multi-layer titanium-platinum-gold ("TiPtAu"), but other Schottky-junction forming layers such as titanium-tungsten ("TiW"), tantalum-nitrogen ("TaN"), and tungsten-silicon ("WSi") can also be used within the scope of the invention. Also, a thin layer providing dielectric surface passivation such as silicon nitride ("$Si_3N_4$," not shown) may then be optionally deposited on an upper surface of the lateral FET. A dielectric layer 380 is then formed about the lateral FET, preferably with a low dielectric constant material (e.g. BCB, polyimide, Si glass, or other flowable oxide) to preserve a performance of the lateral FET. The dielectric layer 380 is typically spun on and cured as necessary for planarization and for further surface passivation. The thickness of the dielectric layer 380 advantageously can be controlled by a spinning speed and duration. The cured dielectric layer 380 is strong enough to provide mechanical and chemical support for subsequent processing steps.

Figure 28:
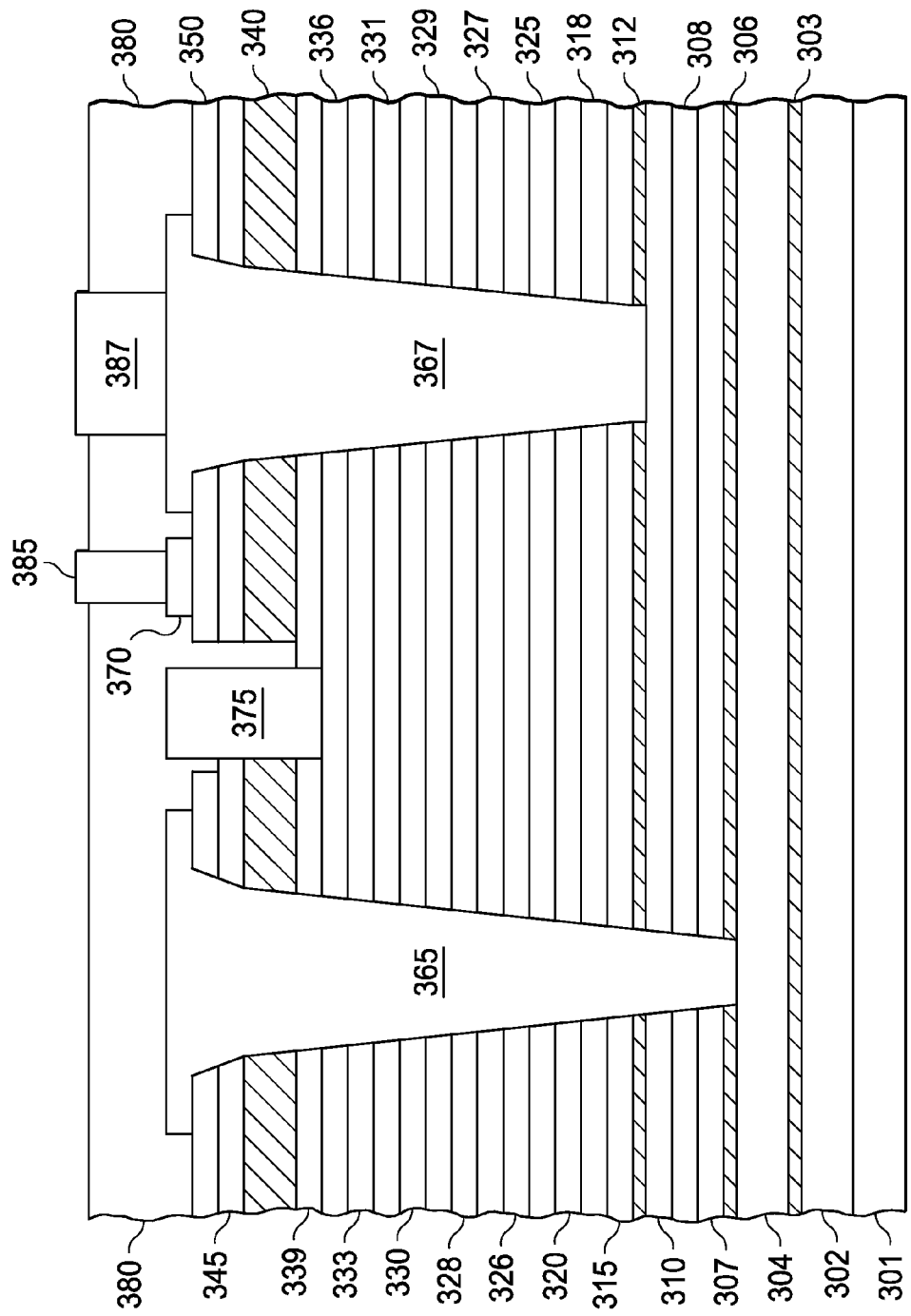

Turning now to FIG. 28, the dielectric layer 380 is then patterned and etched down to the metal layer 370 to form a drain post, and to the Schottky interconnect 367, to form a Schottky interconnect post as a metallic deposition. An electroplating process is thereafter performed to form a drain post or finger 385 and the Schottky interconnect post 387. Analogous to the process for creating the source interconnect 365, the wafer is dipped into a gold plating solution, and ionized gold and other elements are deposited on an electrically conductive surface. The drain post 385 and a Schottky interconnect post 387 are metallic interconnects that form wide area, low-resistance interconnects to a top surface of the lateral FET. An alternative is to plate the drain post 385 and a Schottky interconnect post 387 first, apply the dielectric material 380, and etch the dielectric layer 380 down to the top of the drain post 385 and to the top of the Schottky interconnect post 387 using an etch-back technique. In addition, these metal interconnects can be formed by metal evaporation and a subsequent lift-off process. Typically, a seed layer is not required to ensure plating, assuming starting the process with a conductive substrate.

Figure 29:
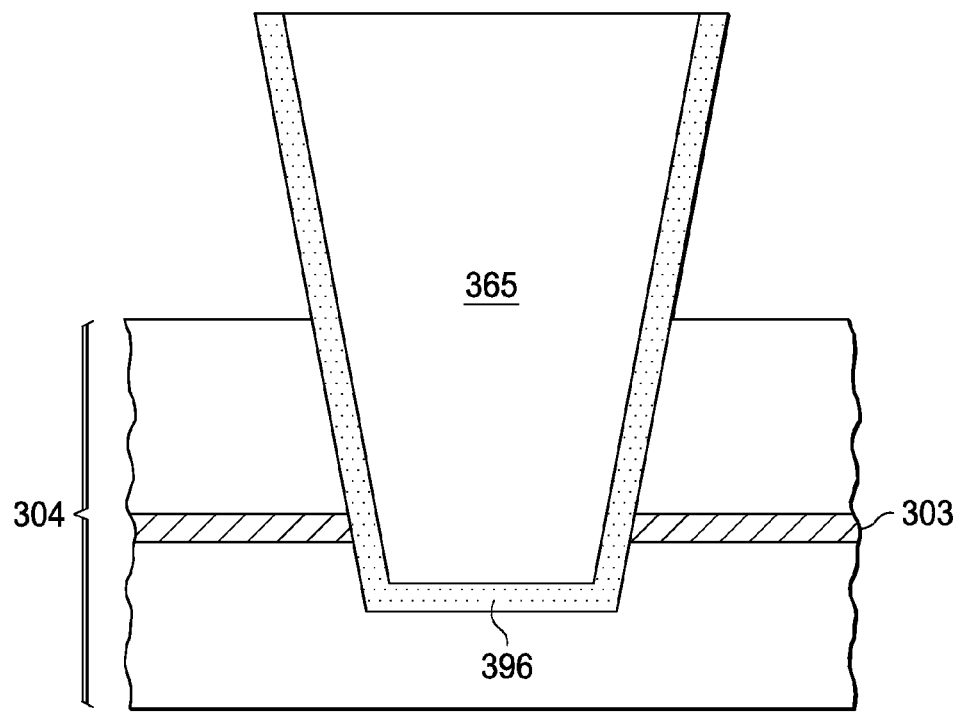

As illustrated in FIG. 29, the first etch stop layer 303 may be optionally deposited as an intermediary layer within the second buffer layer 304. A location of the first etch stop layer 303 may vary within the second buffer layer 304, and an ohmic contact 396 is formed at the lower end of the source interconnect 365 with the second buffer layer 304. In a preferred embodiment as illustrated in FIG. 29, the source interconnect 365 is formed substantially to the bottom of the second buffer layer 304 to provide a path with low electrical resistance to a metal layer (a source contact as described hereinbelow with reference to FIG. 34) that will be deposited on the lower surface of the second buffer layer 304 in a later processing step. In addition to low electrical resistance that can be advantageously achieved by extending the source interconnect 365 substantially to the bottom of the second buffer layer 304, the thermal resistance of the device is also thereby enhanced.

Figure 30:
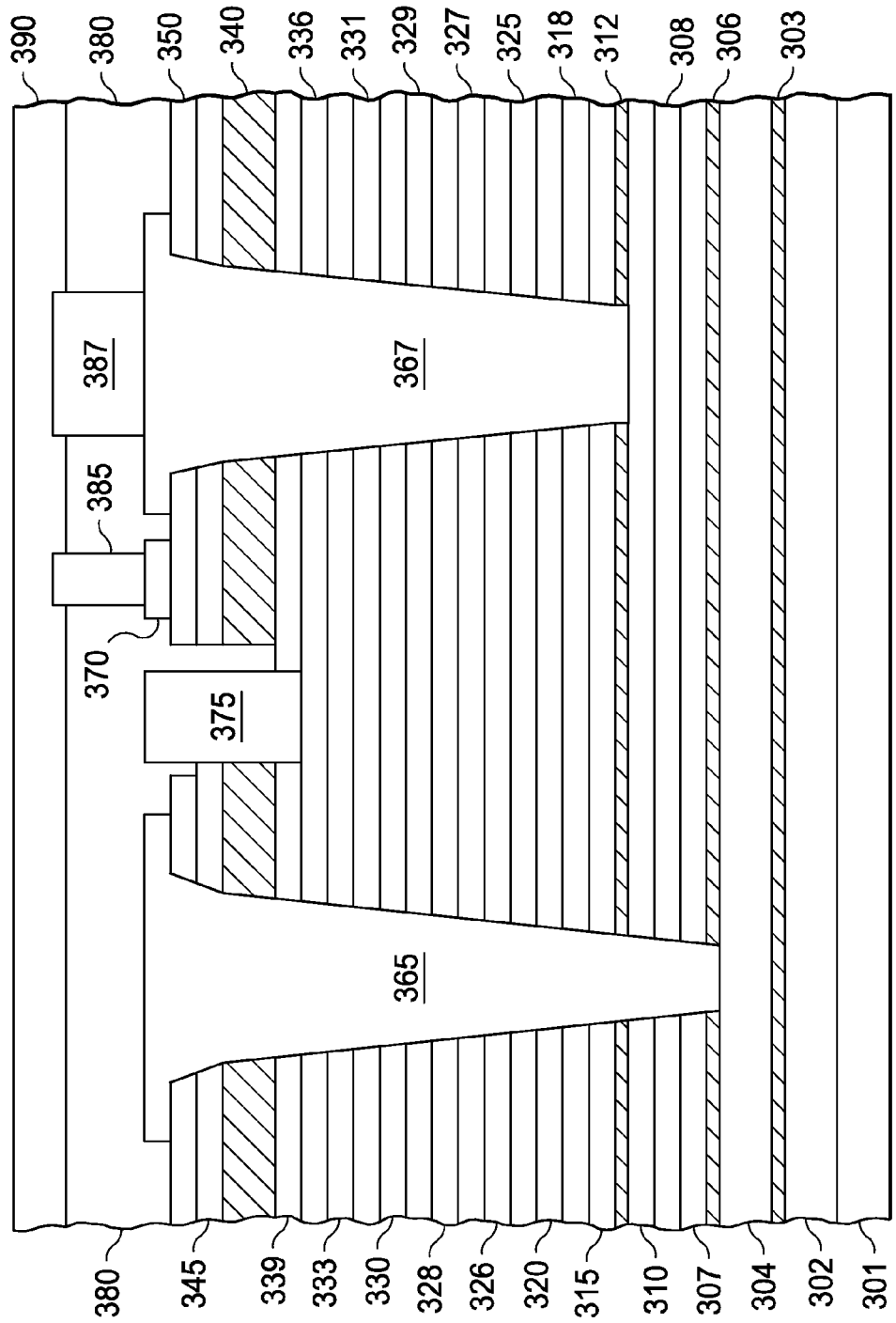

Turning now to FIG. 30, a metallized top contact (also referred to as a drain contact 390) coupled to the drain post 385 and to the Schottky interconnect post 387 is sequentially deposited and preferably patterned on the top surface of the lateral FET, preferably using a metallic alloy. Since this metal is fairly thick (e.g., a few microns), a plating process with Ti—Au as a seed layer is preferably used, followed by photo patterning and plating with Au to form a low-resistance, large area contact. The plating step includes stripping the resist followed by etching the Au and Ti. The Ti acts as an adhesion layer. The deposition process may be performed by vacuum deposition, sputtering, plating processes, or combinations thereof. The drain contact 390 is typically a few microns in thickness to accommodate the packaging process including die attachment and bonding, and preferably covers a substantial portion of a top surface of the lateral FET.

Figure 31:
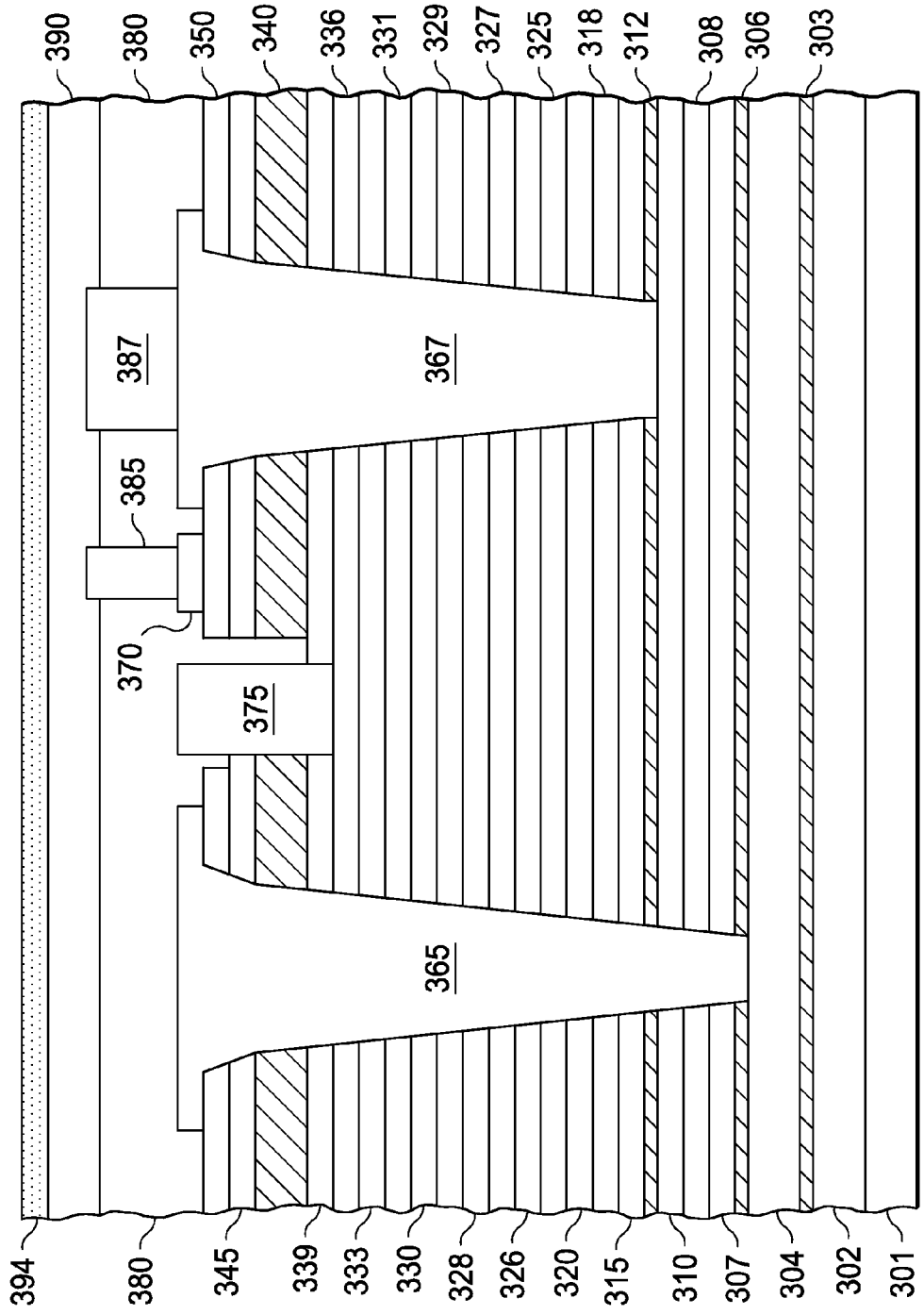
Figure 32:
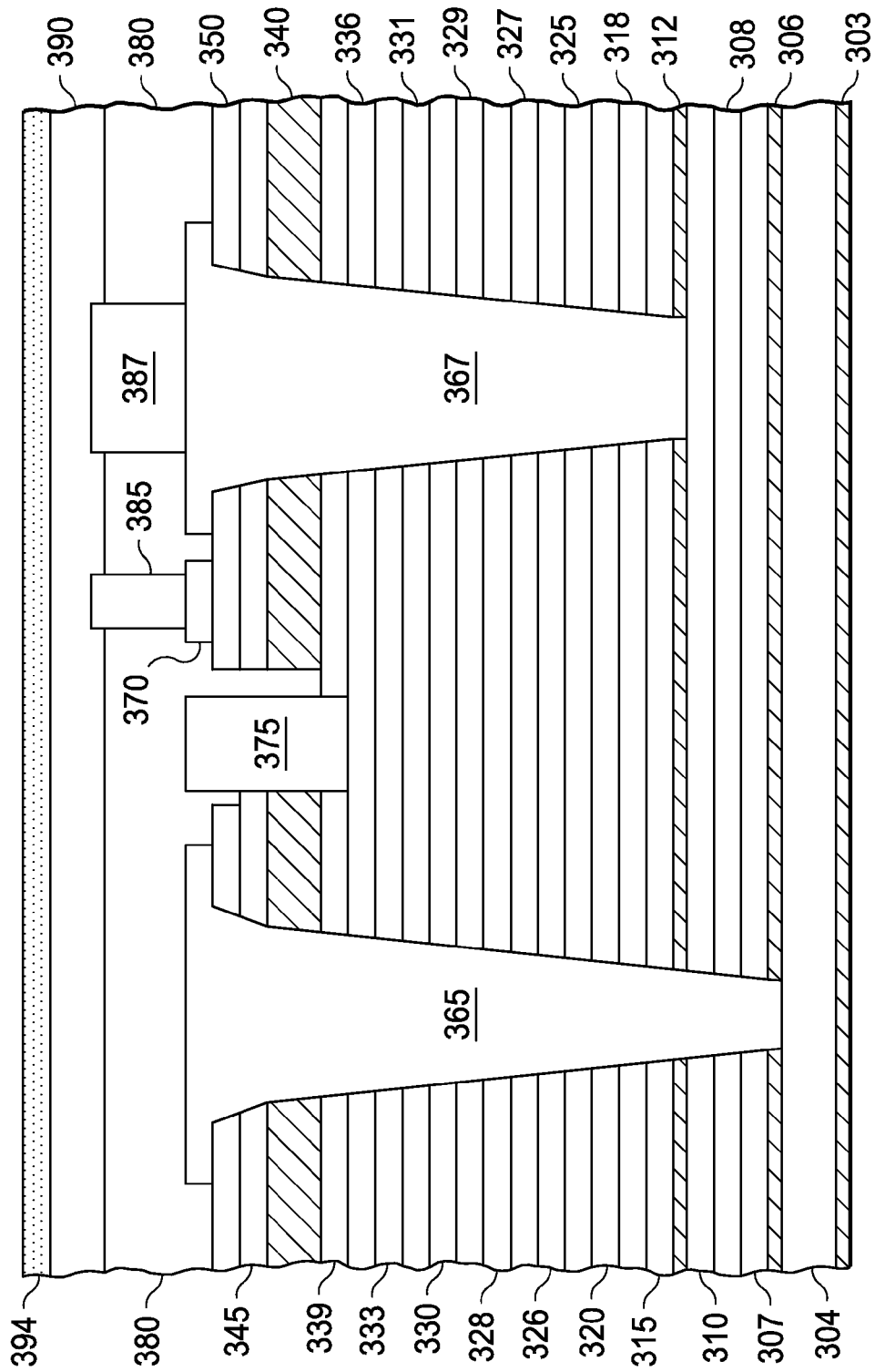
Figure 33:
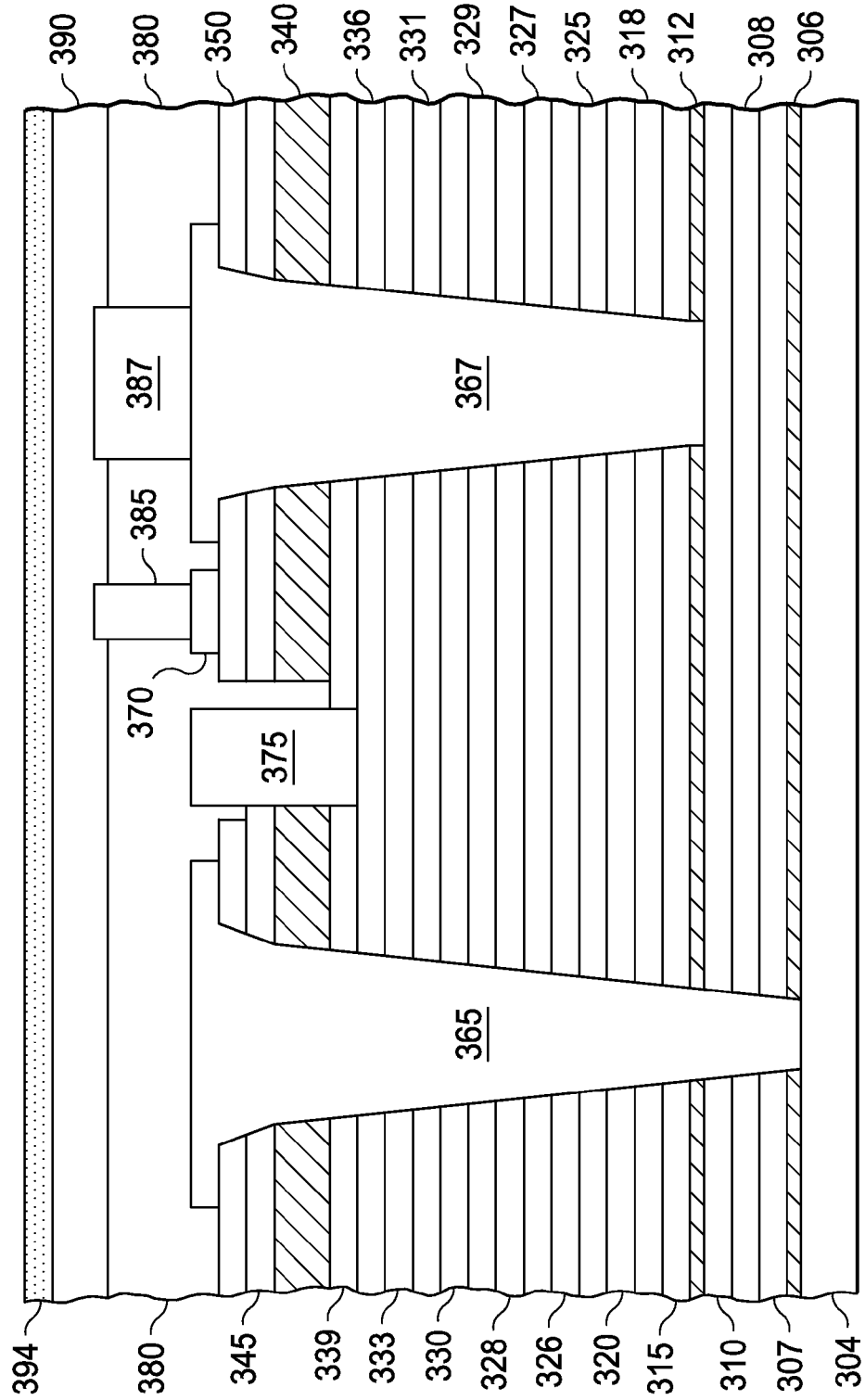

Turning now to FIGS. 31 to 33, the wafer is removably bonded face up (i.e., with the substrate 301 exposed) onto a carrier 394 (e.g., a sapphire, aluminum oxide carrier). Suitable bonding materials for a removable bonding include high-temperature wax or tape, as commonly used in the art. The substrate 301 and the first buffer layer 302 are then thinned, initially by grinding and then by wet etching, using techniques similar to those used for standard wafer thinning. After the bulk of the substrate 301 and the first buffer layer 302 are removed, the remainder of the thinning can be performed with a dry etching process, such as a plasma dry etching with fluorine-based gas, that has high throughput and is highly selective to the first etch stop layer 303. A fluorine-based etch can form a protective surface (e.g., aluminum fluoride ("$AlF_3$")) across the first etch stop layer 303 during a dry-etching process. The dry etch should be performed with high uniformity across the wafer, using techniques well known in the art. The result of these etching processes is complete removal of the substrate 301 and the first buffer layer 302 as illustrated in FIG. 32, leaving the first etch stop layer 303 as the outer layer of the wafer. As illustrated in FIG. 33, the first etch stop layer 303 is thereafter removed using a wet etch such as an HCl-based etch that is selective to gallium arsenide, thereby exposing the second buffer layer 304.

Figure 34:
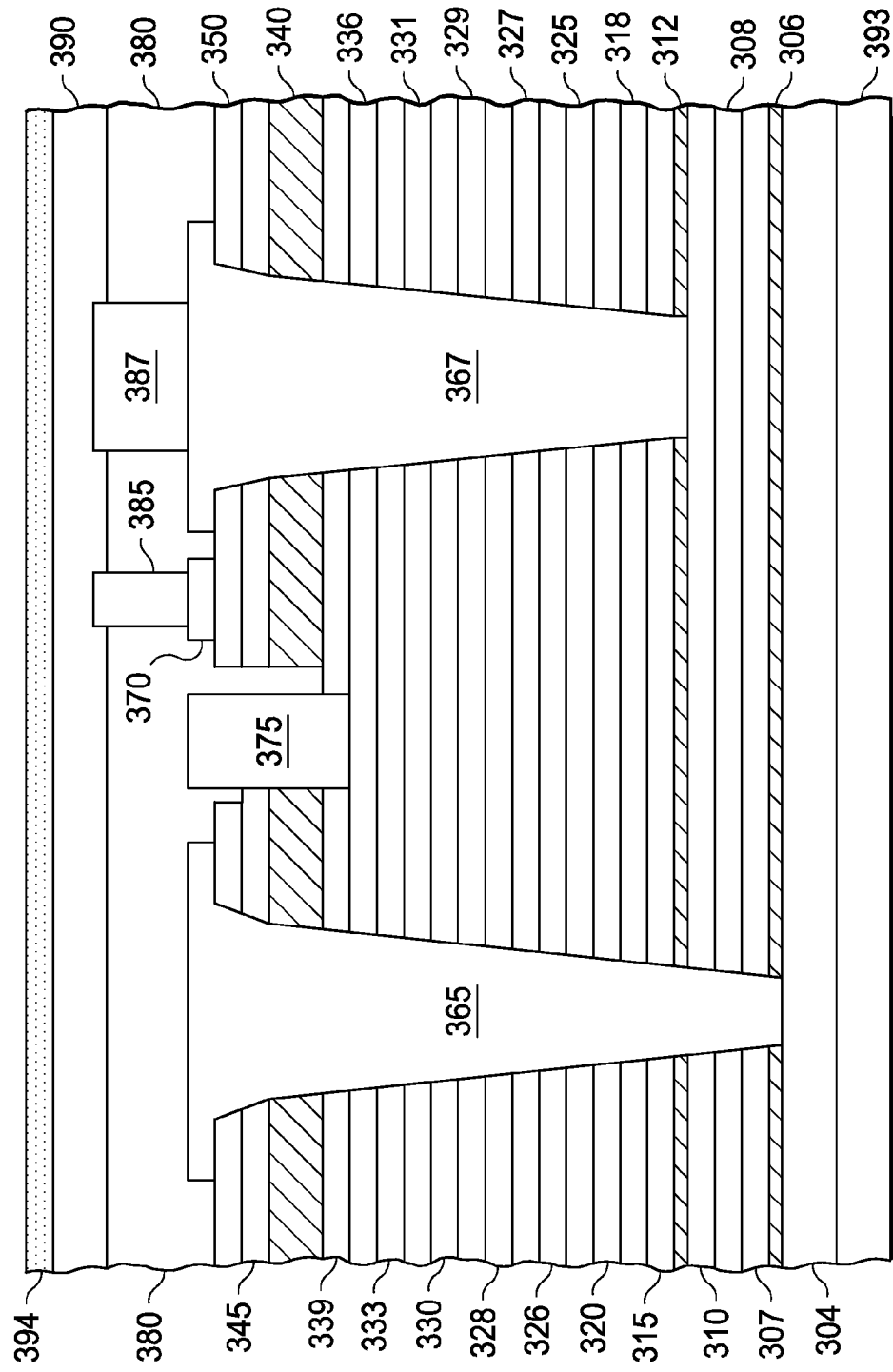

Turning now to FIG. 34, a metallic layer of gold-germanium-nickel-gold is selectively or blanket evaporated onto the second buffer layer 304 on the back of the wafer to form a wide-area, low-resistance ohmic source contact 393 with the second buffer layer 304. A further sublayer of gold may be optionally plated onto the gold-germanium-nickel-gold layer to provide additional mechanical support and to reduce resistance of this layer. A plating process is more desirable for a substantial portion of the plating than an evaporation-based process because of faster throughput for manufacturing. However, an evaporation-based or sputtering-based process may be used to initiate/seed the plating process. A liftoff process (e.g., a metal-selective process) can also be used for deposition of a metallic layer. The metallic layer is preferably deposited sufficiently thick to provide mechanical support for the die in view of absence of the substrate, which previously provided a mechanical support function. If a lift-off process is used for deposition of the metallic layer, the metallic layer can be selectively evaporated only onto active areas of the die, thereby keeping saw streets open to accommodate later die separation. A liftoff process can include patterning and processing a photoresist to form open areas, evaporating metal substantially everywhere over the photoresist which forms discontinuities in the metal surface at the edges of the photoresist, and dissolving the photoresist, which "lifts off" metal deposited thereupon. If an ordinary plating process is used, an additional masking step may be required to define streets on the back of the wafer for later sawing to separate die.

An alternative to deposition of the source contact 393 for mechanical support as well as to provide an electrical contact is to bond the thin wafer to another carrier. For example, the wafer can be bonded to a highly conductive substrate such as one of silicon carbide, or to a metal heatsink, such as one of aluminum. A heat sink can be bonded to the die using solder or high thermal conductivity epoxy adhesive paste that also has low electric resistivity. As described above with reference to FIG. 5, the second buffer layer 304 can be grown thick to provide additional rigidity for the wafer.

Figure 35:
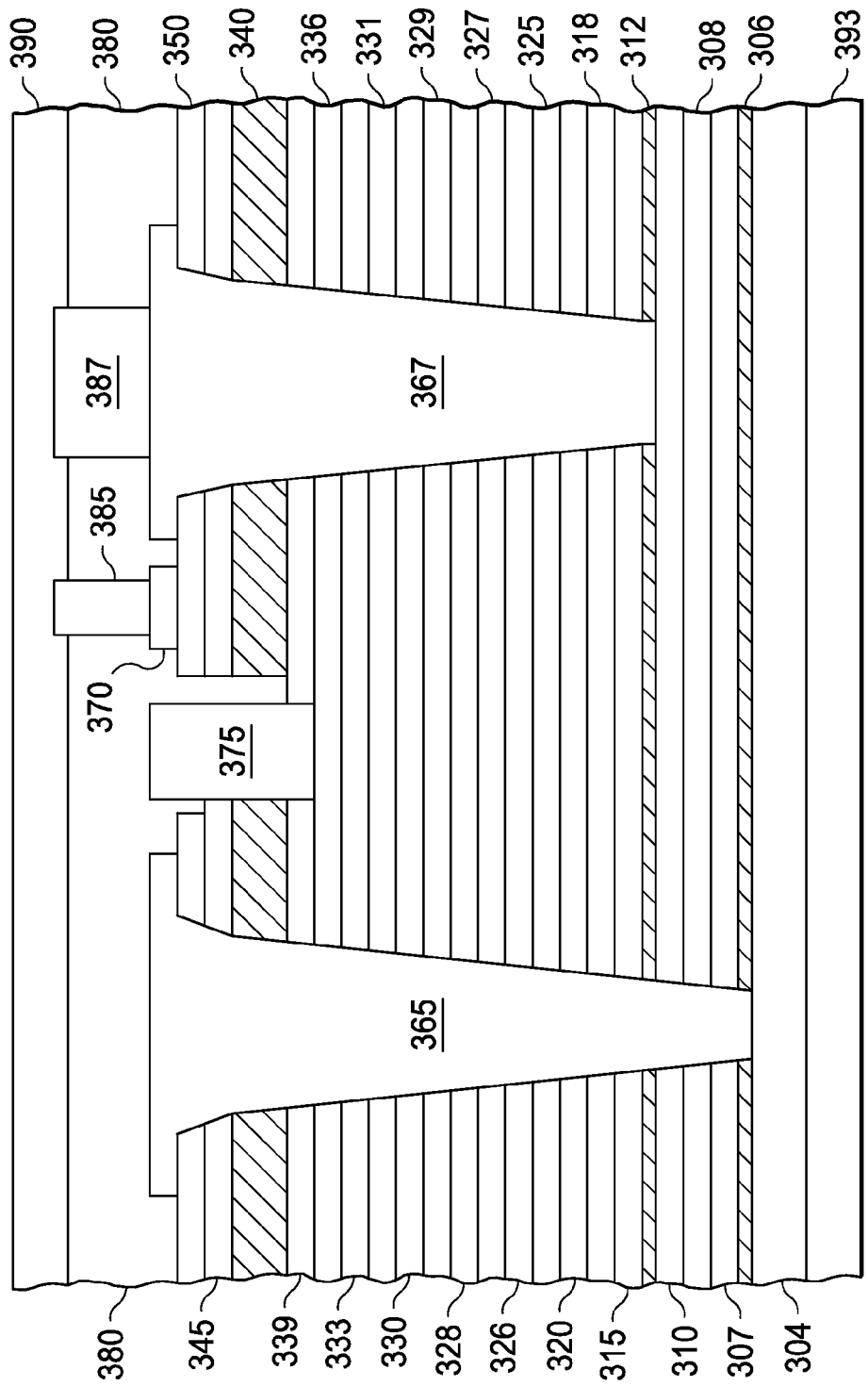

As illustrated with respect to FIG. 35, the carrier 394 is then removed using ordinary techniques in the art to separate a carrier from a wafer, which was removably bonded to the wafer using a high-temperature wax or tape, as described previously. The resulting wafer now has a metal drain and Schottky anode contact 390 on the top layer, and a metal source contact 393 on the bottom layer. The metal source contact 393 is formed directly on the highly doped second buffer layer 304, thereby avoiding the electrical and thermal resistances that would otherwise be provided by a substrate.

Thus, as described above with reference to FIGS. 3 to 35, a semiconductor device with a monolithically integrated Schottky diode is advantageously constructed by depositing a metallic Schottky layer such as a Ti—Pt—Au layer in the bottom of a formed trench, and then filling the trench with an electroplated metallic structure such as a Au deposit. The device is formed with reduced FET on-resistance as well as reduced Schottky diode resistance by depositing an etch stop layer above a substrate, which can be a semi-insulating substrate, and then performing substantially all the top-side processing of the wafer. A carrier is bonded to the top of the wafer, and the substrate and the etch stop are sequentially removed. A plated metallic contact is formed on the bottom side of the wafer, and the carrier is removed. In an alternative embodiment, a heatsink is bonded to the bottom side of the wafer, after which the carrier is removed. Of course, as described in previous applications cited hereinabove, the substrate need not be removed from the die to produce a device including a lateral FET. Following the embodiments described herein, a Schottky diode can be monolithically integrated on the same die with a lateral FET without removing the substrate.

Design enhancement of a semiconductor device to provide higher breakdown voltage between source and drain with minimal increase in device on-resistance, formed according to the principles of the present invention, will now be described. The device described hereinabove with reference to FIGS. 3 to 35 provides a baseline design with an on-resistance of about 1.27 $\Omega$·mm and an exemplary reverse drain-to-source voltage up to 20 volts, employing a gate-to-drain separation distance (see, e.g., gate-to-drain separation distance 377 of FIG. 27) of 1.5 µm. A preferable higher-voltage design will now be described providing an on-resistance of 2.19 $\Omega$·mm and an exemplary reverse drain-to-source voltage up to 80 volts, employing a gate-to-drain separation distance of 2.5 µm. The results were obtained by simulation of fields and carrier flow on a scale of the device feature sizes using the commercially available simulation tool Silvaco®. Of course, the parameters described herein are for illustrative purposes only and the broad scope of the present invention is not so limited.

Ordinarily, for a field-effect transistor, on-resistance is expected to increase roughly as the 2.6 power of rated breakdown voltage. Thus, increasing the maximum reverse drain-to-source voltage from 20 volts to 80 volts should increase the on-resistance from 1.27 $\Omega$·mm in the baseline case to approximately 47 $\Omega$·mm for an 80 volts drain-to-source breakdown voltage rating. The on-resistance of 2.19 $\Omega$·mm that was obtained by an exemplary enhancement for 80 volts is a significant reduction from ordinary expectation.

A key issue affecting maximum reverse drain-to-source breakdown voltage is the electric field in a region proximate the gate. One technique used in the industry to reduce a high electric field in a PHEMT or other semiconductor device is to introduce a "field plate" (i.e., a highly conductive structure preferably electrically coupled to the gate), such as a patterned metallic deposition, in a region of the device exhibiting such field. The advantage of field plates is to shift and reduce the peak electric field away from a region such as a gate edge (also spreading the electric field), resulting in a higher maximum reverse drain-to-source breakdown voltage. However, disadvantages of field plates are the extra mask layer and processing steps required for its deposition (such as by sputtering) and associated costs, as well as increased on-resistance resulting from higher channel depletion in an area under a field plate, requiring a larger active device area to provide a required on-resistance.

Another general technique to increase the maximum device breakdown voltage is to increase the gate-to-drain separation distance. This can be accomplished by increasing the recess width between the gate and drain, which can reduce the electric field at the drain-facing edge of the gate. However, a disadvantage of increasing the gate-to-drain separation distance is, again, an increase in device on-resistance and device cost due to the enlarged dimensions thereof.

Substantial improvement in gate-to-drain voltage can be obtained for a compound semiconductor device as described herein without significantly increasing device on-resistance. Such improvement can be obtained by jointly enhancing gate-to-drain separation distance (see, e.g., gate-to-drain separation distance 377 of FIG. 27), and reducing the delta doping concentration of the top and bottom delta-doped layers proximate the lateral channels (e.g., reducing a delta doping concentration to about $1 \times 10^{12}$ cm$^{-2}$ to $3 \times 10^{12}$ cm$^{-2}$ of the first barrier layer 318 and the sixth spacer layer 333 as illustrated in FIGS. 7-8 and discussed above).

Figure 36:
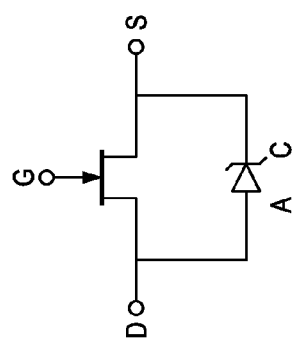
FIG. 36 illustrates an equivalent circuit diagram of an embodiment of a semiconductor device constructed according to the principles of the present invention.

Turning now to FIG. 36, illustrated is an equivalent circuit diagram of a semiconductor device (e.g., including a lateral FET) constructed according to the principles of the present invention. As described hereinabove, a lateral FET is formed on a conductive substrate and includes a drain contact D, gate contact G and a source contact S. A Schottky diode is formed on the same die with the lateral FET and includes an anode A and a cathode C. In an exemplary embodiment, the anode of the monolithically integrated Schottky diode is coupled to the drain contact of the lateral FET. The cathode of the monolithically integrated Schottky diode is coupled to the source contact of the lateral FET via a buffer layer described previously. As a result, a Schottky diode is formed monolithically on the same die coupled to the source and drain contacts of the lateral FET.

The lateral FET as described above is readily operable as a depletion-mode FET. In other words, the channels are enabled to conduct when substantially zero volts is applied between the gate and source contacts thereof (i.e., for "substantially zero gate voltage"). A depletion-mode device is ordinarily expected to be pinched off with negative gate voltage, relying on the current-blocking character of a gate for negative applied voltage. If the gate voltage is raised above about 0.8 volts positive to further enhance the channel conductivity, then gate current is expected to flow. A modest gate current is not harmful to the operation of the lateral FET, and thus the device is ordinarily capable of operation with gate voltage less than about 0.8 volts, or at higher gate voltage with suitable provision to limit the gate current. Exemplary circuits employing depletion mode devices are illustrated and described in U.S. Patent Application Publication No. 2006/0198173, entitled "Control Circuit for a Depletion Mode Switch and Method for Operating the Same," to Rozman, published Sep. 7, 2006, which is incorporated herein by reference.

An enhancement-mode device can be produced or provided by several alternatives to the processing steps described hereinabove. For purposes of illustration, any modifications to the processing steps to attain an enhancement-mode device will be described with reference to the lateral FET illustrated and described with respect to FIGS. 3 to 35 above. One alternative is to reduce the top delta doping level to a selected level of about $1 \times 10^{12}$ cm$^{-2}$ instead of $4 \times 10^{12}$ cm$^{-2}$, which reduces the level of the free carriers in the lateral channels that can be used to increase channel resistance several orders of magnitude higher than a depletion-mode design with substantially zero gate voltage. It may not be necessary in practical circuit designs for the lateral FET to provide essentially an open circuit when the gate voltage is substantially zero. A careful engineering assessment of the proper doping levels for the layers should be made to determine the best trade-off of channel resistance for substantially zero gate voltage and the resulting on-resistance of the device for a positive gate voltage. The reduction of free carriers in the portion of the lateral channels outside the region of the gate resulting from reduced pulse doping may raise the on-resistance of the lateral FET. This effect can be reduced by selectively implanting the lateral channels with an n-type dopant in regions away from the gate.

Another alternative to preserve low on-resistance of an enhancement-mode device is to recess the gate through the gate recess closer to or proximate the lateral channels and provide higher pulse doping levels. An etch stop layer may be selectively formed under the gate to facilitate this option. This approach relies on the recessed gate metal forming a sufficiently deep depletion region in the lateral channels to provide the necessary device on-resistance for substantially zero gate voltage.

Referring now to FIGS. 37 to 60, illustrated are cross-sectional views of a further embodiment of constructing a semiconductor device (e.g., a lateral FET coupled to a Schottky diode) according to the principles of the present invention. The process as described below removes a semi-insulating substrate on which the device is formed. Of course, as described in U.S. Patent Application Publication No. 2006/0255360 introduced above, the device can be formed on a doped substrate, which may be thinned but not removed with accommodation for the processing steps to retain the substrate.

Figure 37:
FIGS. 37 to 60 illustrate cross-sectional views of another embodiment of constructing a semiconductor device according to the principles of the present invention.

Beginning with FIG. 37, the lateral FET is formed on a substrate (e.g., GaAs substrate) 401. The substrate 401 is preferably semi-insulating for low cost since it will be removed during a later processing step. Optionally, the substrate 401 may be a doped (e.g., n-type doped) conductive layer (e.g., a conductive substrate). The substrate 401 may be chosen to be sufficiently thick, such as 650 μm, to provide mechanical and chemical support for semiconductor processing and handling, and may be supported by a further underlying medium.

If the substrate 401 is optionally doped, a preferred n-type doping material for GaAs is silicon ("Si"), but selenium ("Se"), tellurium ("Te") or other doping materials or combinations thereof may be employed within the broad scope of the present invention. Although the lateral FET described herein is GaAs based, alternative semiconductor materials may be employed to form the substrate 401 such as a semiconductor material based on indium-phosphide ("InP") as well as oppositely doped semiconductors with essential properties of related materials appropriately altered.

As further illustrated in FIG. 37, a first buffer layer 402 (e.g., an n+ epitaxial buffer layer) is optionally deposited above the substrate 401. The first buffer layer 402 is preferably grown by molecular beam epitaxy or metal-organic chemical-vapor deposition to a preferred thickness of about 3000 angstroms ("Å"). A suitable n-type doping material such as Si may be employed, but alternatively Se, Te or other n-type dopant or combinations thereof may be employed in the epitaxial growth process. A preferred doping density is in the range of $7 \times 10^{17}$ to $5 \times 10^{18}$ cm$^{-3}$. The addition of the first buffer layer 402 generally provides a more uniform crystal structure for further epitaxial depositions than an ordinary, doped or undoped GaAs substrate 401, and thus is optionally included for the formation of the above layers for improved device characteristics.

Figure 38:
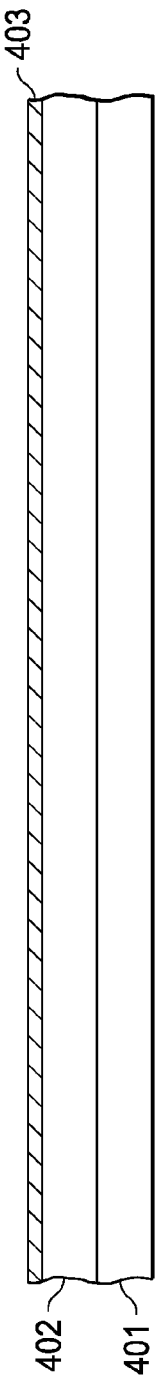

Referring now to FIG. 38, illustrated is a first etch stop layer 403 deposited above the first buffer layer 402. The first etch stop layer 403 embodied in a thin aluminum-arsenide ("AlAs"), aluminum-gallium-arsenide ("AlGaAs"), indium-phosphide ("InP"), or indium-gallium-phosphide ("InGaP") epitaxial deposition is formed above the first buffer layer 402. Chemical-vapor deposition or other vacuum deposition process such as molecular beam epitaxy can be used for formation of the first etch stop layer 403, using techniques well known in the art. When an aluminum-gallium-arsenide deposition is used for the first etch stop layer 403, a relatively higher concentration of aluminum (with respect to gallium) would typically be used to provide a more robust etch stop layer for a subsequent etching process. The first etch stop layer 403 provides an etch stop for substantially complete removal of the substrate 401 and the first buffer layer 402 in a later processing step. The first etch stop layer 403 is preferably about 25 to 500 Å thick, and can be optionally doped n-type with a doping level approximately in the range of $1\times10^{17}$ to $5\times10^{18}$ cm$^{-3}$, or left undoped.

Figure 39:
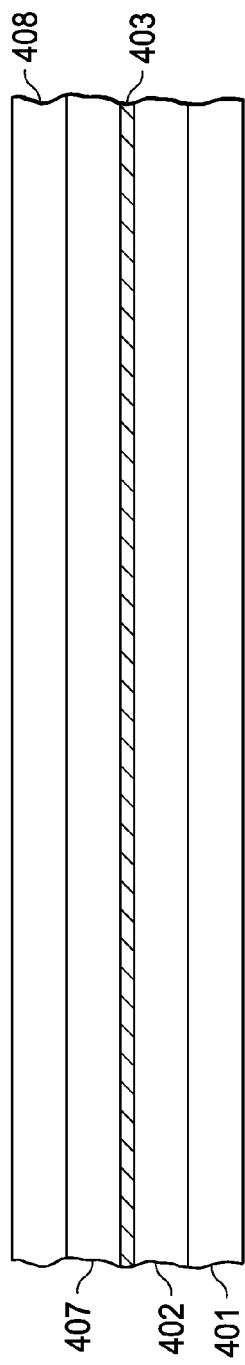

Turning now to FIG. 39, above the first etch stop layer 403, a first isolation layer (e.g., a p+ isolation layer) 407 is formed with a preferred thickness of 1000 Å, and a doping density of 1 to $5\times10^{19}$ cm$^{-3}$. Above the first isolation layer 407, a second isolation layer (e.g., a p-lightly doped isolation layer) 408 is formed with a thickness preferably of about 1 to 3 µm, and is p-doped with a doping level preferably of about $1\times10^{15}$ to $1\times10^{16}$ cm$^{-3}$ to provide a high blocking voltage rating for the device. In an alternative embodiment, wherein the substrate 401 is not removed, the first isolation layer 407 may be deposited directly onto the first buffer layer 402. In a further alternative embodiment, wherein the substrate 401 is not removed, the first isolation layer 407 may be deposited directly onto the substrate 401, omitting the first buffer layer 402.

Figure 40:
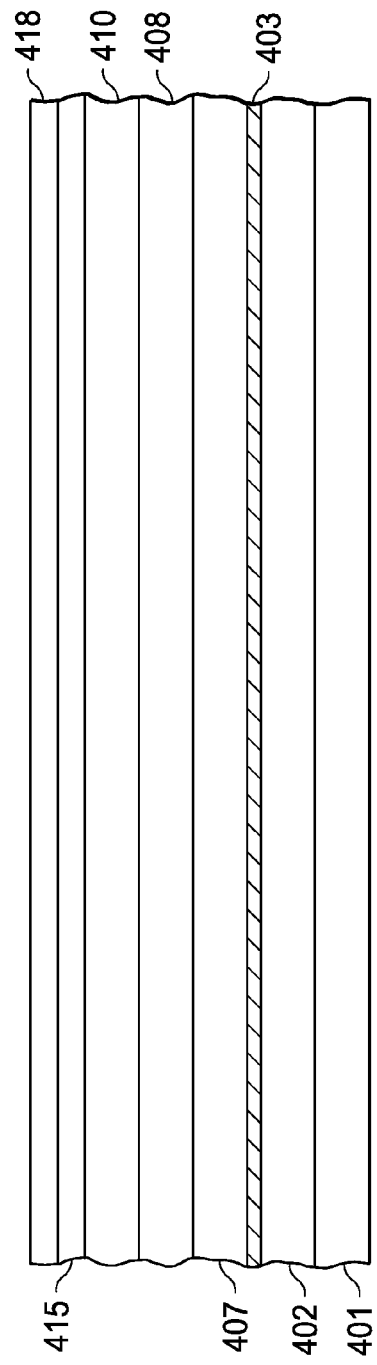

Turning now to FIG. 40, above the second isolation layer 408 is a second buffer layer (e.g., an n-epitaxial buffer layer) 410 that is preferably grown by molecular beam epitaxy or metal-organic chemical-vapor deposition to a thickness of about 3000 angstroms. A suitable n-type doping material such as Si may be employed, but alternatively Se, Te or other n-type dopant or combinations thereof may be employed in the epitaxial growth process. A preferred doping density is in the range of $1\times10^{17}$ to $5\times10^{17}$ cm$^{-3}$. A preferred thickness for the second buffer layer 410 is 3000 Å, but a thicker layer may be grown to provide increased rigidity of the die after a later thinning step described below regarding removal of the substrate. The added device on-resistance of the device as a result of making the second buffer layer 410 thicker is not significant.

Referring still to FIG. 40, a third buffer layer 415 located above the second buffer layer 410 is an alternating aluminum-gallium arsenide/gallium arsenide ("AlGaAs/GaAs") superlattice buffer that is sequentially deposited epitaxially to improve the smoothness of the surface of the crystal and to increase the mobility of the electrons in the channel to be formed thereabove. The presence of aluminum may also act as a "getter" to capture and disable oxygen atoms that may otherwise be present in the subsequent growth. The third buffer layer 415 is deposited preferably with ten alternating layers of AlGaAs (0.24 Al), preferably about 185 Å thick, and GaAs, preferably about 15 Å thick. The total thickness of the third buffer layer 415 is approximately 2000 Å.

A first barrier layer 418 located above the third buffer layer 415 is an aluminum-gallium arsenide-phosphide AlGaAsP (0.24 Al and 0.05 P) bottom barrier/spacer that is epitaxially deposited at approximately 1000 Å to substantially block free carriers from flowing down to the layers therebelow. An n-pulse doping with Si ("delta doped"), preferably to a doping level of about $4\times10^{12}$ cm$^{-2}$, is thereafter performed thereon to supply the free carriers to the channel thereabove by the mechanism of modulation doping.

Figure 41:
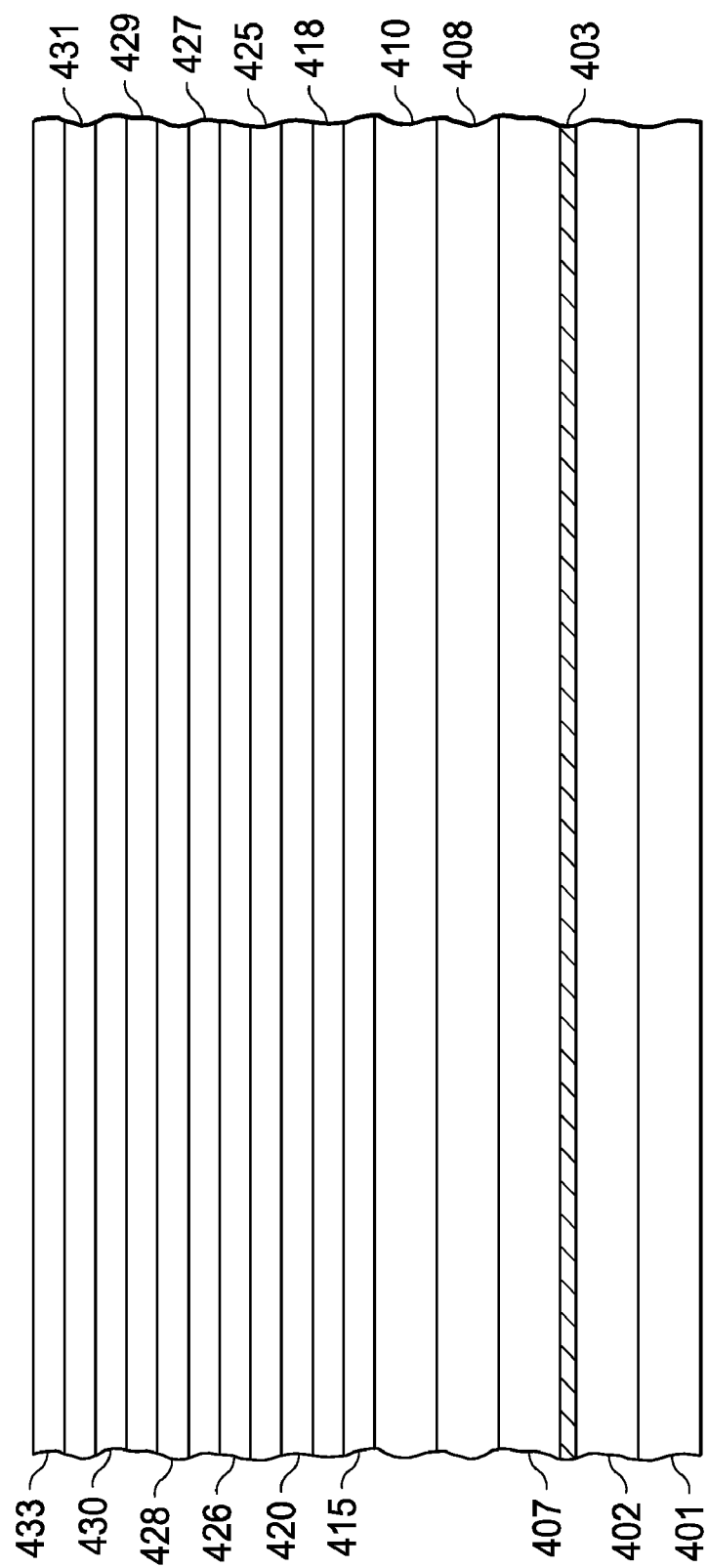

Turning now to FIG. 41, first spacer layer 420 [e.g., a substantially undoped AlGaAsP (0.24 Al and 0.05 P) spacer] is then epitaxially deposited at approximately 40 Å above the first barrier layer 418 to separate the effects of dopants from the channel, thereby separating the free carriers from the ionized sites and improving electron mobility therein. Above the first spacer layer 420 is a thin, indium-gallium arsenide ("InGaAs") layer that is epitaxially deposited with about 20% indium to form a first lateral channel 425 (also referred to as "a lateral channel" or "another lateral channel") with controllable conductivity. Due to the substantial lattice mismatch between GaAs and InGaAs, the first lateral channel 425 is inherently lattice-strained (i.e., it is "pseudomorphic," and the resulting device is referred to as a pseudomorphic high-electron-mobility transistor, or a "pHEMT") and is preferably less than about 100 Å to prevent lattice dislocations and formation of polycrystalline structure in the layers to be deposited thereabove. The lattice-strained channel provides higher carrier mobility owing to a reduced effective mass of the carriers. The first lateral channel 425 provides the controllable conduction mechanism between the source and drain of the lateral FET and provides a modulation-doped channel with reduced crystalline irregularities for free carriers supplied by adjacent pulsed doped layers.

A second spacer layer 426 [e.g., a substantially undoped AlGaAsP (0.24 Al and 0.05 P) spacer] is then epitaxially deposited at approximately 40 Å above the first lateral channel 425 to separate the effects of dopants from the channel, thereby separating the free carriers from the ionized sites and improving the electron mobility therein. An n-pulse doping with Si ("delta doped"), preferably to a level of about $4\times10^{12}$ cm$^{-2}$, is thereafter performed thereon to supply free carriers to the first lateral channel 425 below and to a second lateral channel to be deposited thereabove by the mechanism of modulation doping. A third spacer layer 427 [e.g., a substantially undoped AlGaAsP (0.24 Al and 0.05 P) spacer] is then epitaxially deposited at approximately 40 Å above the second spacer layer 426 to separate the effects of dopants from a second lateral channel to be deposited thereabove, again separating free carriers from the ionized sites and improving electron mobility of a second lateral channel.

Above the third spacer layer 427 is a second, thin, indium-gallium arsenide ("InGaAs") layer that is epitaxially deposited with about 20% indium to form a second lateral channel 428 (also referred to as "a lateral channel" or "another lateral channel") with controllable conductivity. Again, due to the substantial lattice mismatch between GaAs and InGaAs, the second lateral channel 428 is inherently lattice-strained and is preferably less than about 100 Å to prevent lattice dislocations and formation of polycrystalline structure in the layers to be deposited thereabove.

A fourth spacer layer 429 [e.g., a substantially undoped AlGaAsP (0.24 Al and 0.05 P) spacer] is then epitaxially deposited at approximately 40 Å above the second lateral channel 428 to separate the effects of dopants from the second lateral channel 428 as described hereinabove. An n-pulse doping with Si ("delta doped"), preferably to a level of about $4\times10^{12}$ cm$^{-2}$, is thereafter performed thereon to supply free carriers to the second lateral channel 428 and to a third lateral channel to be deposited thereabove by the mechanism of modulation doping. A fifth spacer layer 430 [e.g., a substantially undoped AlGaAsP (0.24 Al and 0.05 P) spacer] is then epitaxially deposited at approximately 40 Å above the fourth spacer layer 429 to separate the effects of dopants from a third lateral channel above, thereby separating free carriers from the ionized sites and improving electron mobility of a third lateral channel.

Above the fifth spacer layer 430 is a third, thin, indium-gallium arsenide ("InGaAs") layer that is epitaxially deposited with about 20% indium to form a third lateral channel 431 (also referred to as "a lateral channel" or "another lateral channel") with controllable conductivity. Again, due to the substantial lattice mismatch between GaAs and InGaAs, the third lateral channel 431 is inherently lattice-strained and is preferably less than about 100 Å to reduce lattice dislocations and formation of polycrystalline structure in the layers to be deposited thereabove.

Above the third lateral channel 431 is another region (see below) that is epitaxially deposited including sub-layers of AlGaAsP (0.24 Al and 0.05 P) to provide additional free carriers (electrons) for modulation doping of the third lateral channel 431, and to provide a barrier for the free carriers in the third lateral channel 431. A sixth spacer layer 433 is undoped and deposited at about 40 Å to provide a spacer layer separating the free carriers in the third lateral channel 431 from ionized impurity sites. A n-pulse doping with Si ("delta doped"), preferably to a level of about $4 \times 10^{12}$ cm$^{-2}$, is performed on the sixth spacer layer 433 to induce additional free electrons with enhanced mobility that migrate across the sixth spacer layer 433 to the third lateral channel 431.

The inclusion of phosphorus in the spacer layers mentioned above provides a mechanism to at least partially compensate for the mismatch of the lattice constant for the lateral channels as described previously hereinabove. Although the semiconductor device as described herein includes three lateral channels, semiconductor devices with one or more lateral channels are well within the broad scope of the present invention as described previously.

Figure 42:
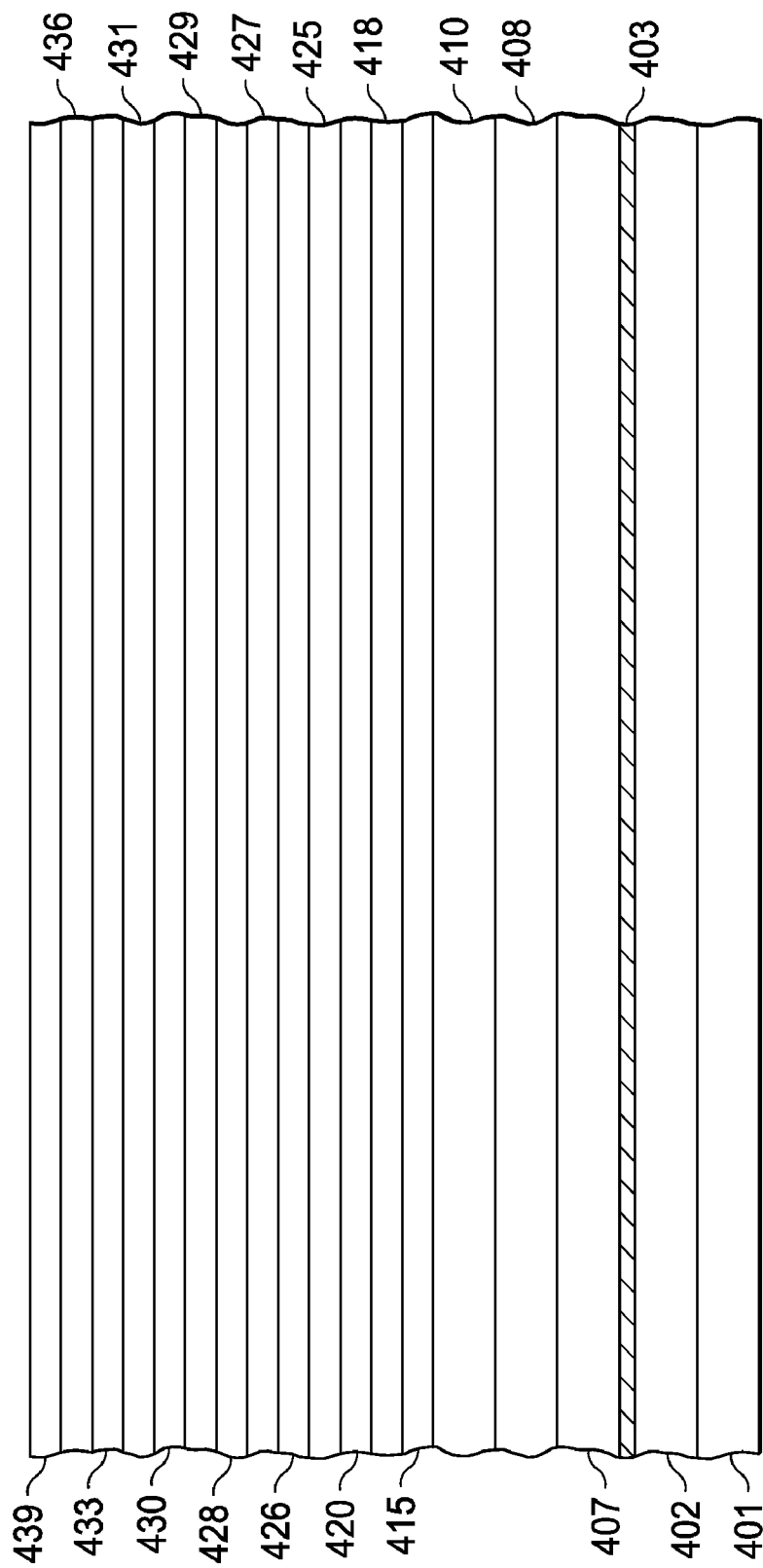

Turning now to FIG. 42, a second barrier layer 436 (embodied in an undoped AlGaAs layer) is then epitaxially deposited at about 210 Å with a doping level in the range of $1 \times 10^{17}$ to $5 \times 10^{17}$ cm$^{-3}$ or undoped. A recess layer 439 of GaAs is then epitaxially deposited, preferably at about 230 Å and Si-doped with a doping level in the range of $1 \times 10^{17}$ to $5 \times 10^{17}$ or undoped.

Figure 43:
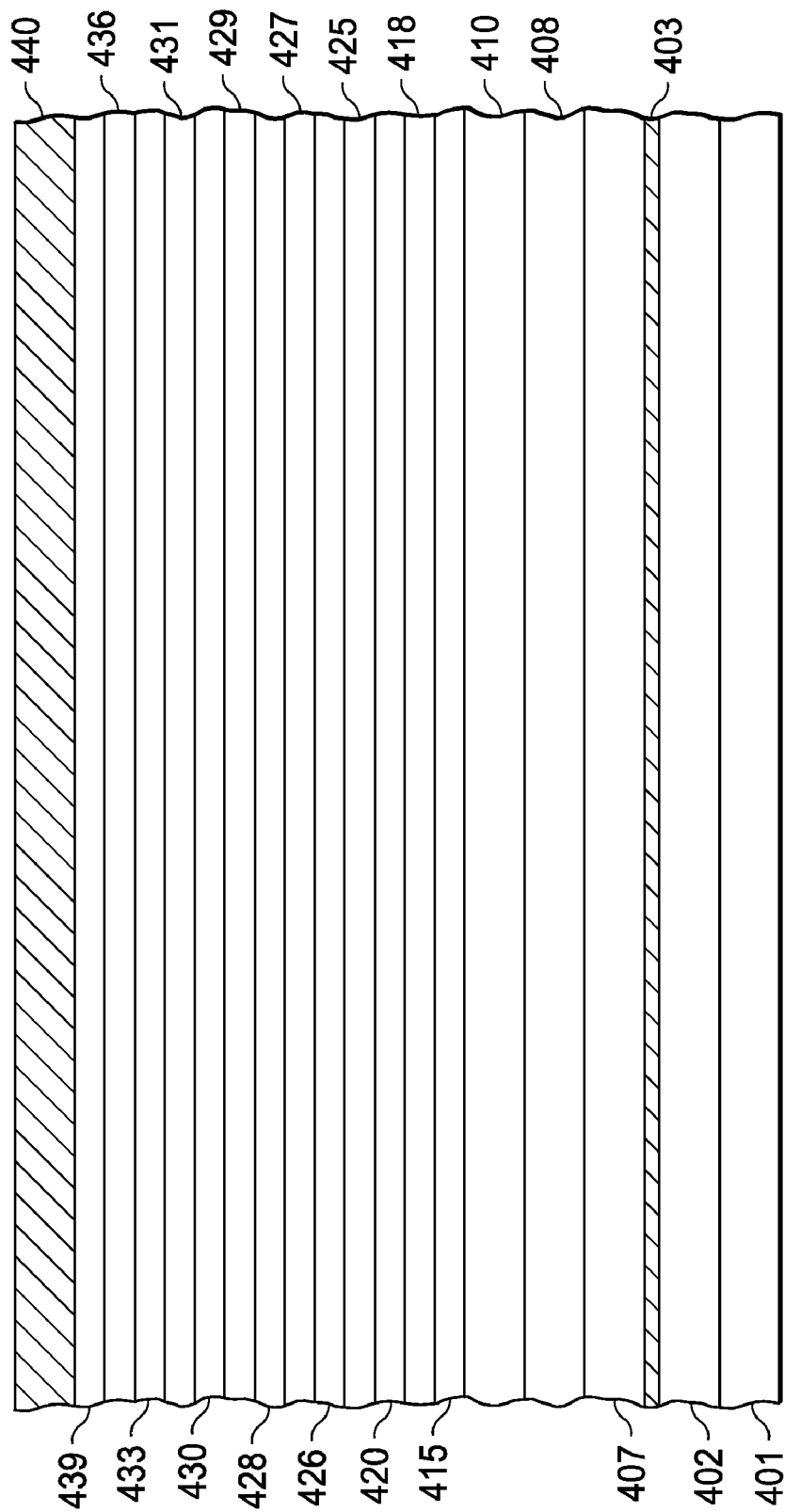

Turning now to FIG. 43, a second etch stop layer 440 embodied in a thin aluminum-arsenide ("AlAs"), indium-phosphide ("InP"), or indium-gallium-phosphide ("InGaP") epitaxial deposition is formed above the recess layer 439. The second etch stop layer 440 provides an etch stop for a later, trench-forming process for GaAs layers to be further deposited and doped thereabove. The second etch stop layer 440 is preferably about 25 to 500 Å thick and can be doped n-type with a doping level in the range of $1 \times 10^{17}$ to $5 \times 10^{18}$ cm$^{-3}$ or undoped.

Figure 44:
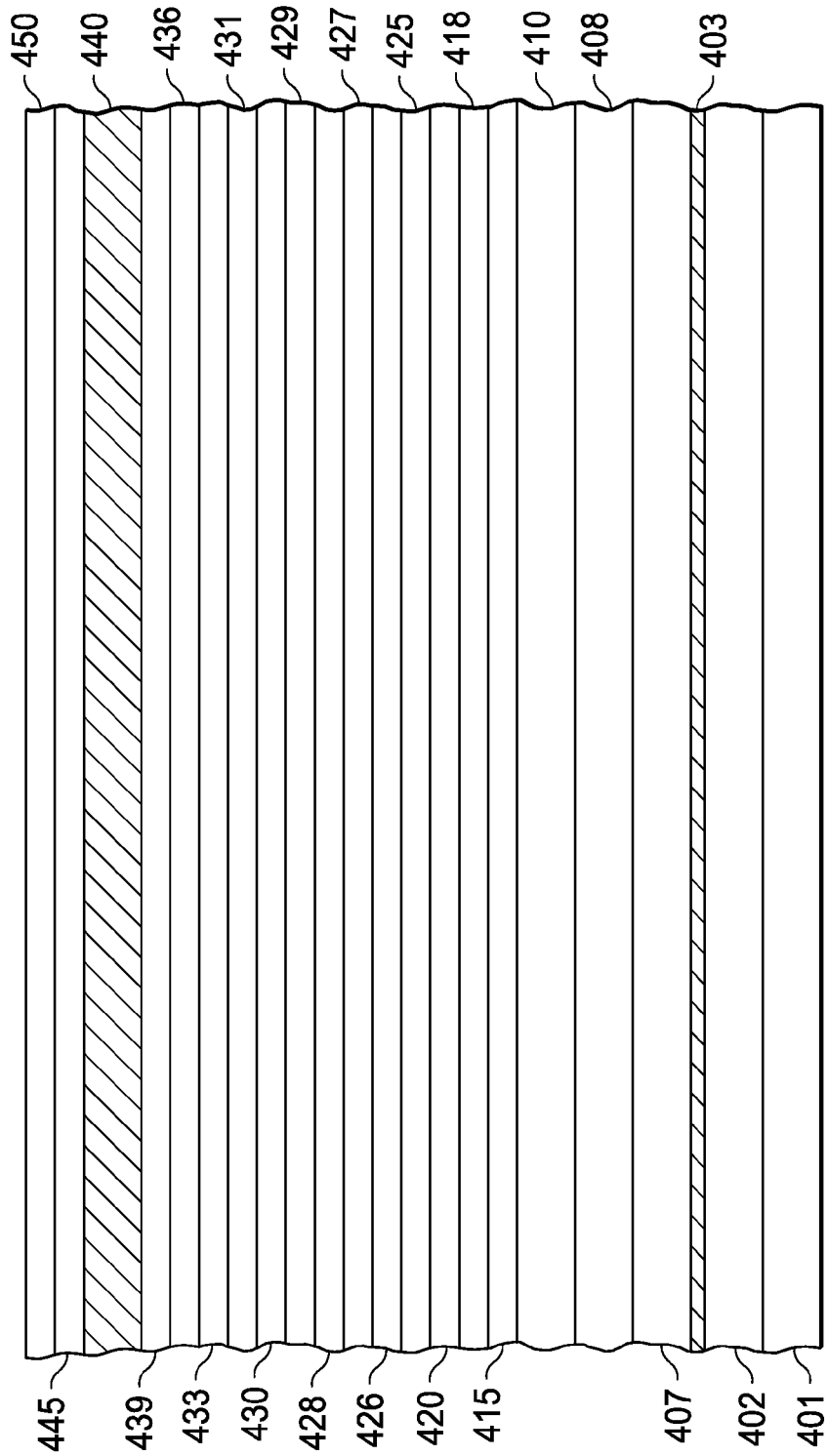

Turning now to FIG. 44, layers of GaAs are epitaxially deposited above the second etch stop layer 440 to form source and drain contact layers for the lateral FET. First, a first source/drain contact layer 445 of about 300 Å of an n-type doped layer of GaAs is epitaxially deposited, preferably using Si as the dopant with a doping level in the range of $1 \times 10^{17}$ to $1 \times 10^{18}$ cm$^{-3}$. Then, a second source/drain contact layer 450 of about 500 Å of a heavily doped n+ layer of GaAs is epitaxially deposited with a doping level in the range of $1 \times 10^{18}$ to $1 \times 10^{19}$ cm$^{-3}$ to improve formation of ohmic contacts for the source and drain and to reduce resistance in the source-to-gate and drain-to-gate regions of the channels.

Turning now to FIGS. 45 to 50, illustrated are cross-sectional views of an embodiment of constructing a source interconnect through the lateral FET in accordance with the principles of the present invention. The source interconnect is configured to create a low-resistance ohmic contact between the first, second and third lateral channels (also referred to as "lateral channels") 425, 428, 431 and a metallic contact to be formed on the lower surface of the die.

Figure 45:
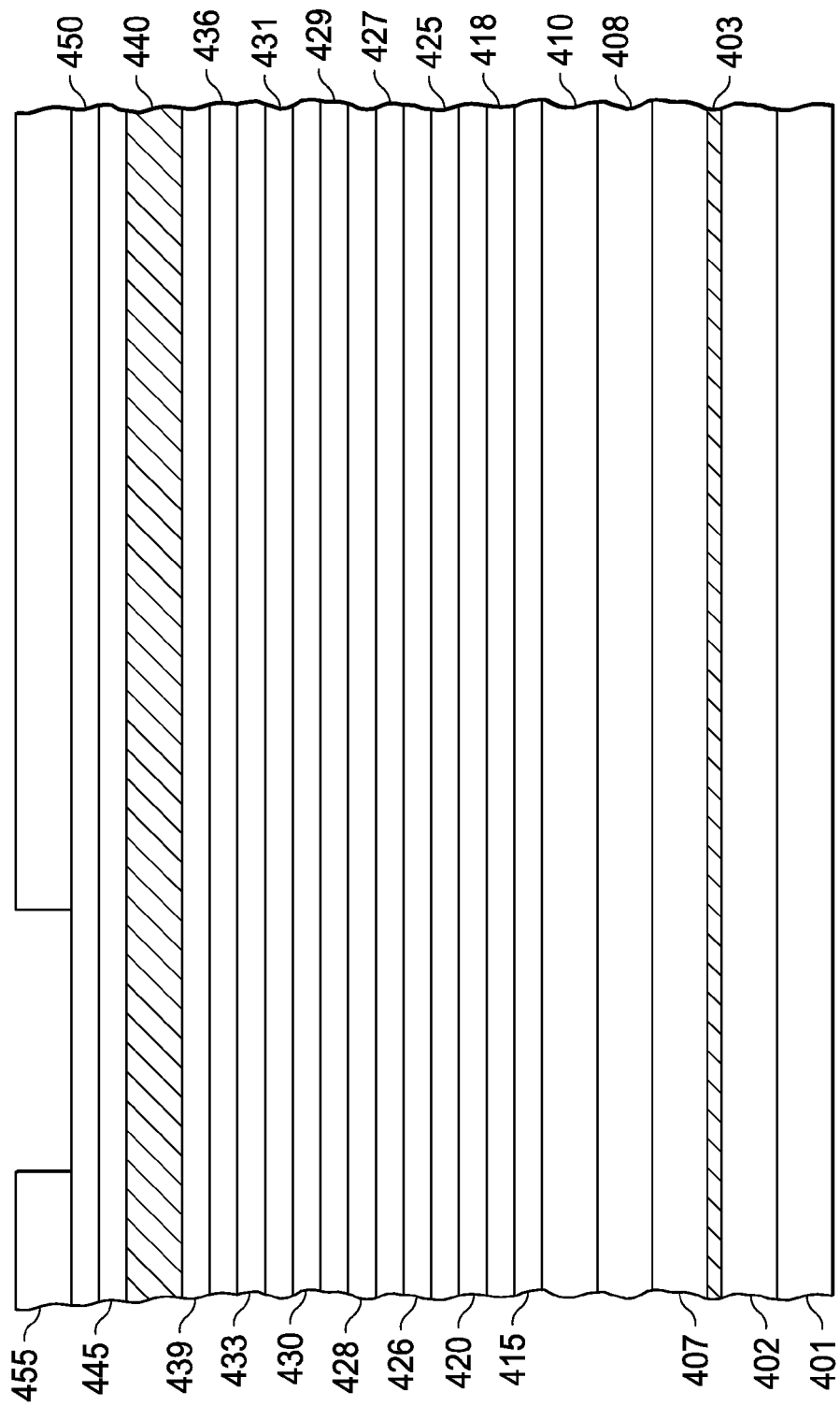
Figure 46:
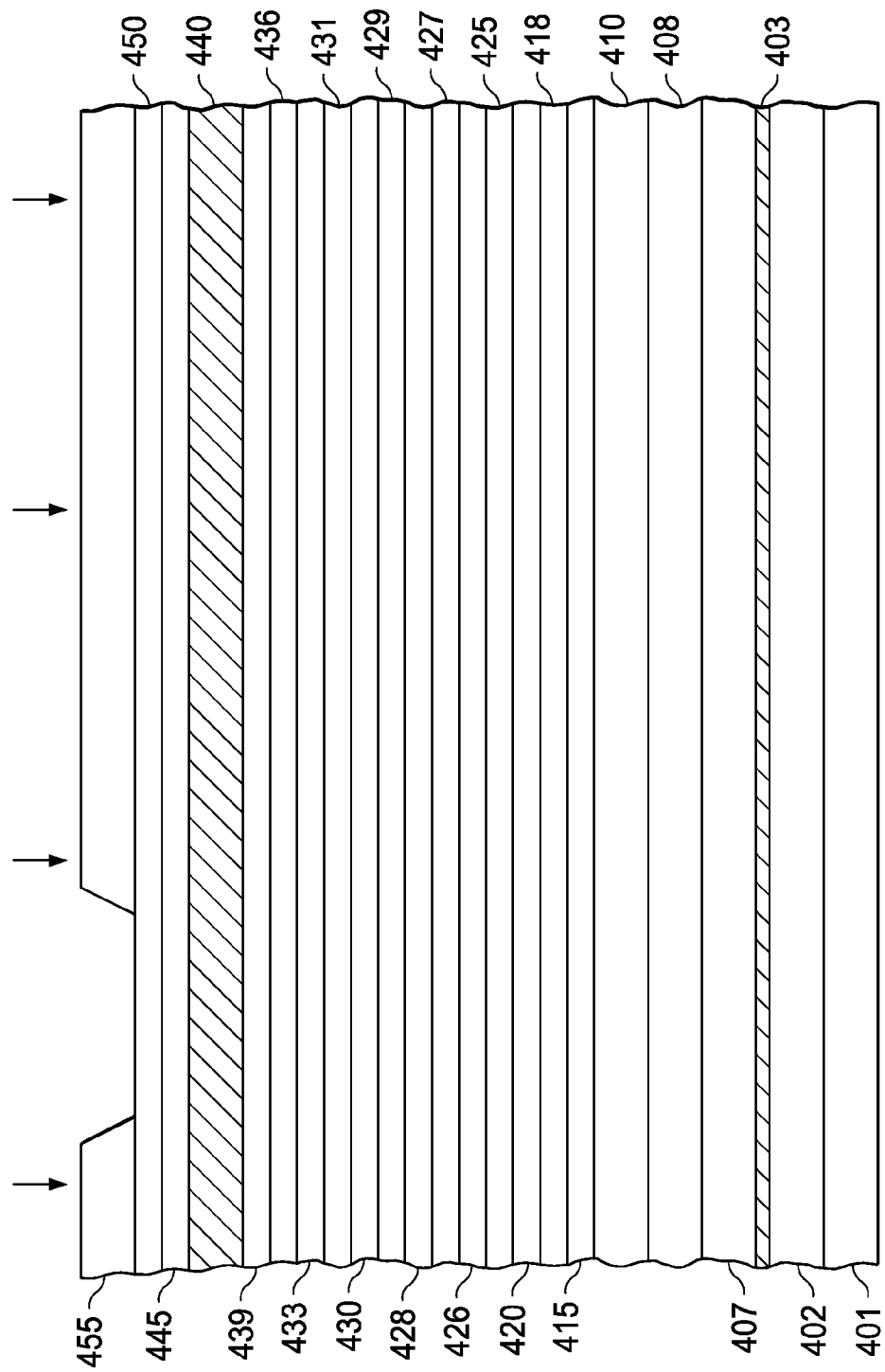

Turning first to FIG. 45, a spun-on photoresist 455 is illustrated that has been masked, exposed and developed as is well known in the art preparatory to forming a trench for access to the layers therebelow to form a Schottky diode. The photoresist 455 is then baked (e.g., reflowed) such as on a hot plate or oven at about 110 to 150 degrees Celsius and in a normal atmosphere, which cures the photoresist 455 and causes a lower surface of the photoresist 455 facing the trench to encroach toward the trench, forming a generally angular aspect to the trench as illustrated with respect to FIG. 46. The angle of the slope in the photoresist 455 can be controlled by modifying a duration and temperature profile of the reflow process as is well understood in the art.

Figure 47:
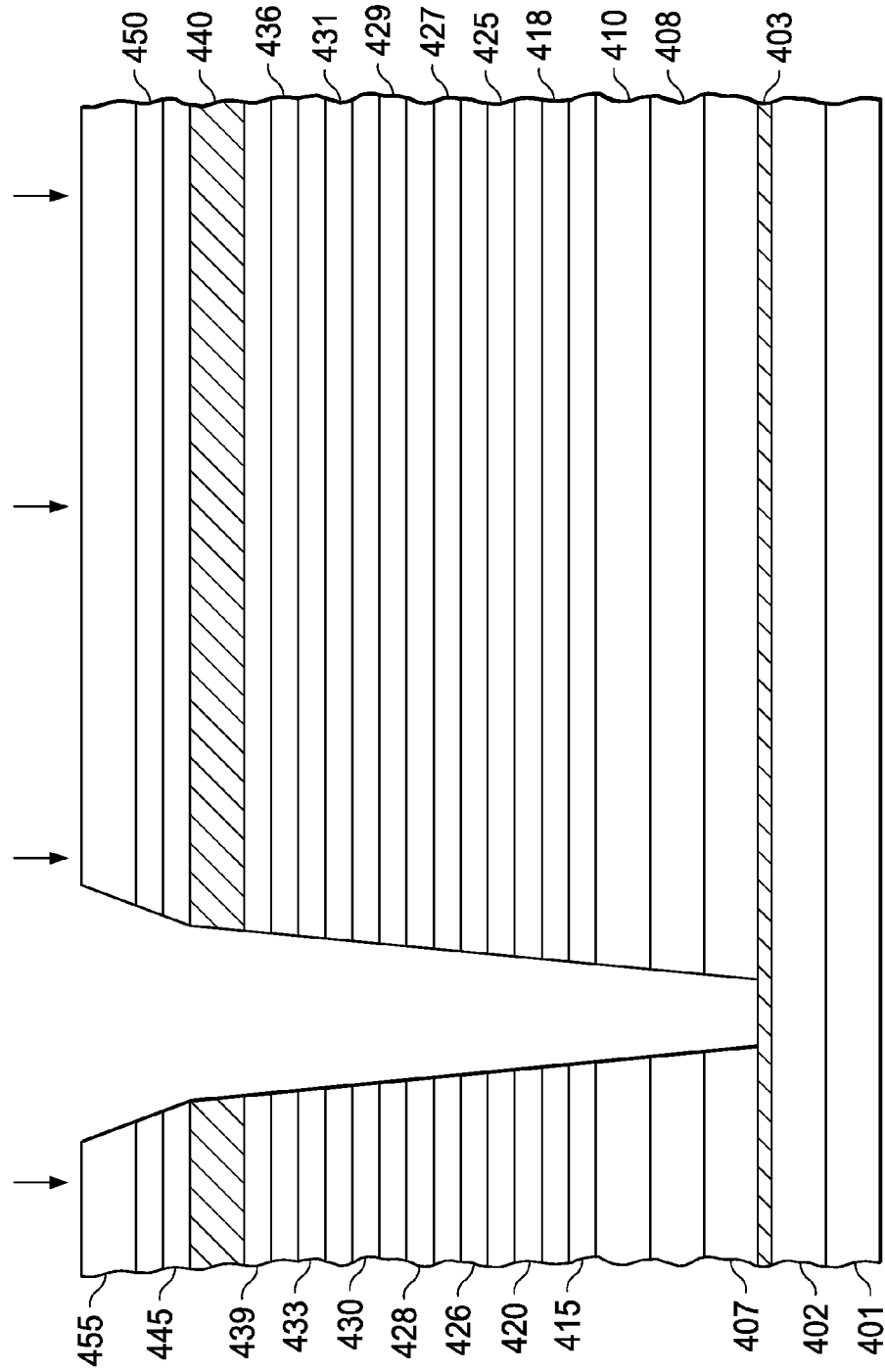
Figure 48:
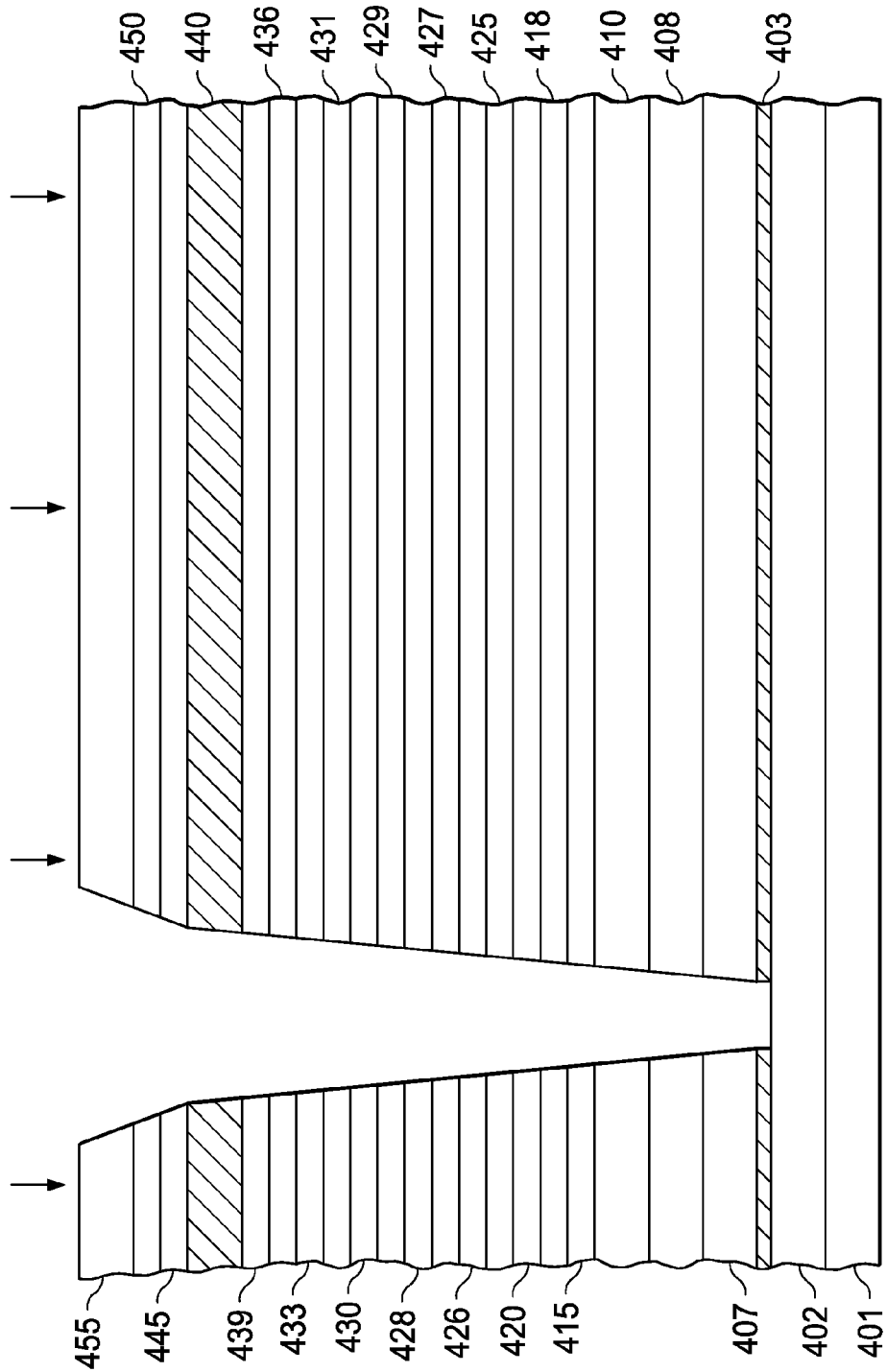

Turning now to FIG. 47, the portion of the lateral FET unprotected by the photoresist 455 is anisotropically dry etched, preferably using an inductively coupled plasma (i.e., an "ICP" dry etch) for a controlled period of time to form a source via (or trench) through the layers of the lateral FET down to the first etch stop layer 403. The presence of the first etch stop layer 403 facilitates controllably etching the source trench to the bottom of the first isolation layer 407. The first etch stop layer 403 is then removed from the bottom of the trench using a wet etch such as a HCl-based etch as illustrated in FIG. 48. This sequence of etching steps facilitates forming a low-resistance contact between the first, second and third lateral channels 425, 428, 431 and a metal layer (a source contact) that is deposited over ("below" as illustrated in the FIGUREs) the first isolation layer 407, as illustrated and described later hereinbelow with reference to FIG. 54, et seq. The non-selective dry etching may further alter a profile of the photoresist 455, as described previously hereinabove.

Figure 49:
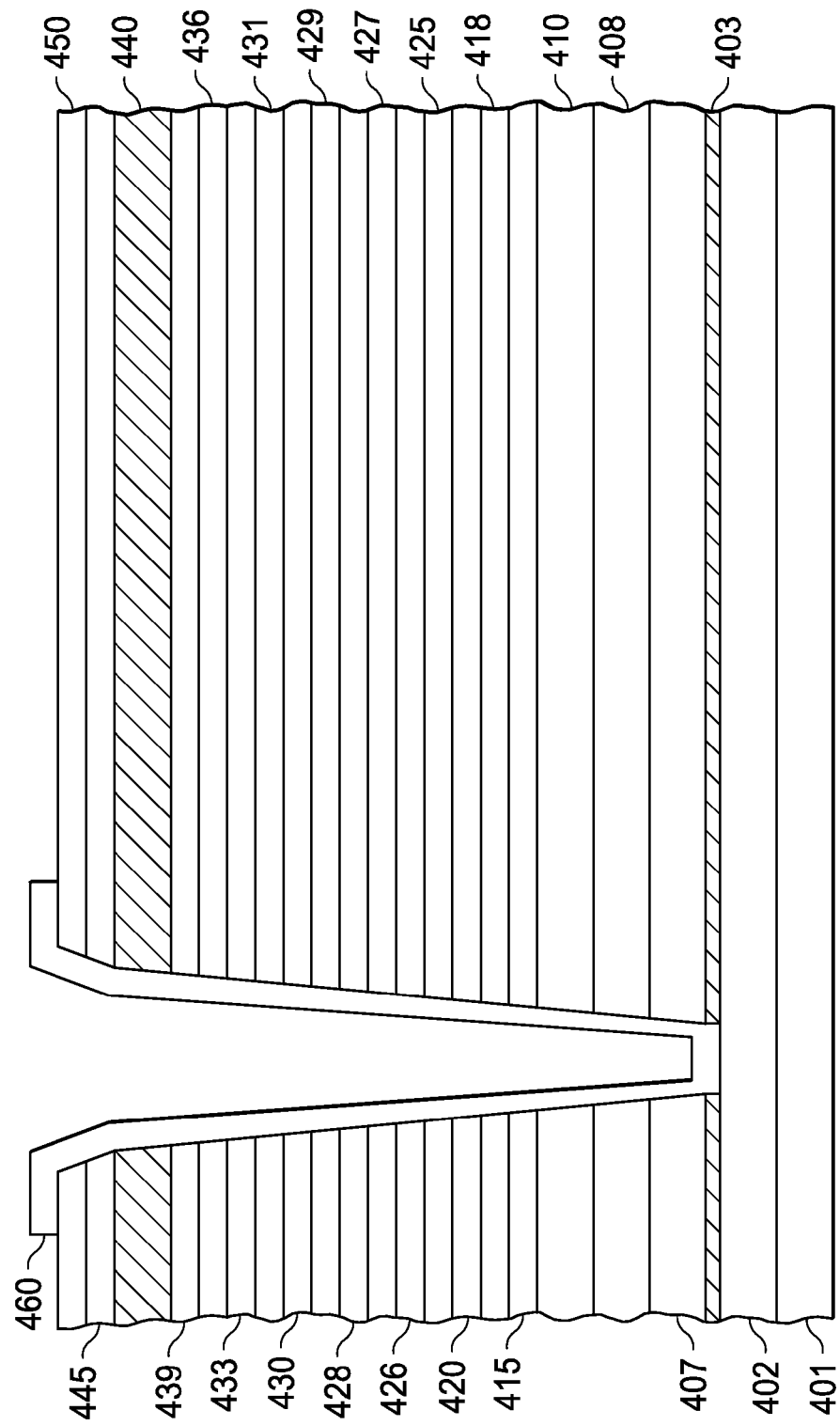

Turning now to FIG. 49, the walls of the source trench should be sufficiently sloped so that a thin metal layer (generally designated 460) can be deposited on horizontal and semi-horizontal surfaces, preferably by a vacuum evaporation and deposition process. The metal material is anisotropically deposited onto the horizontal surfaces such as the bottom of the source trench and on the sloped surfaces. Typically, about 3000-4000 Å of gold, germanium, nickel, and then gold are preferably sequentially deposited and annealed to produce an alloy with a low-resistance ohmic contact and good adhesion with the first, second and third lateral channels 425, 428, 431, as described previously.

Figure 50:
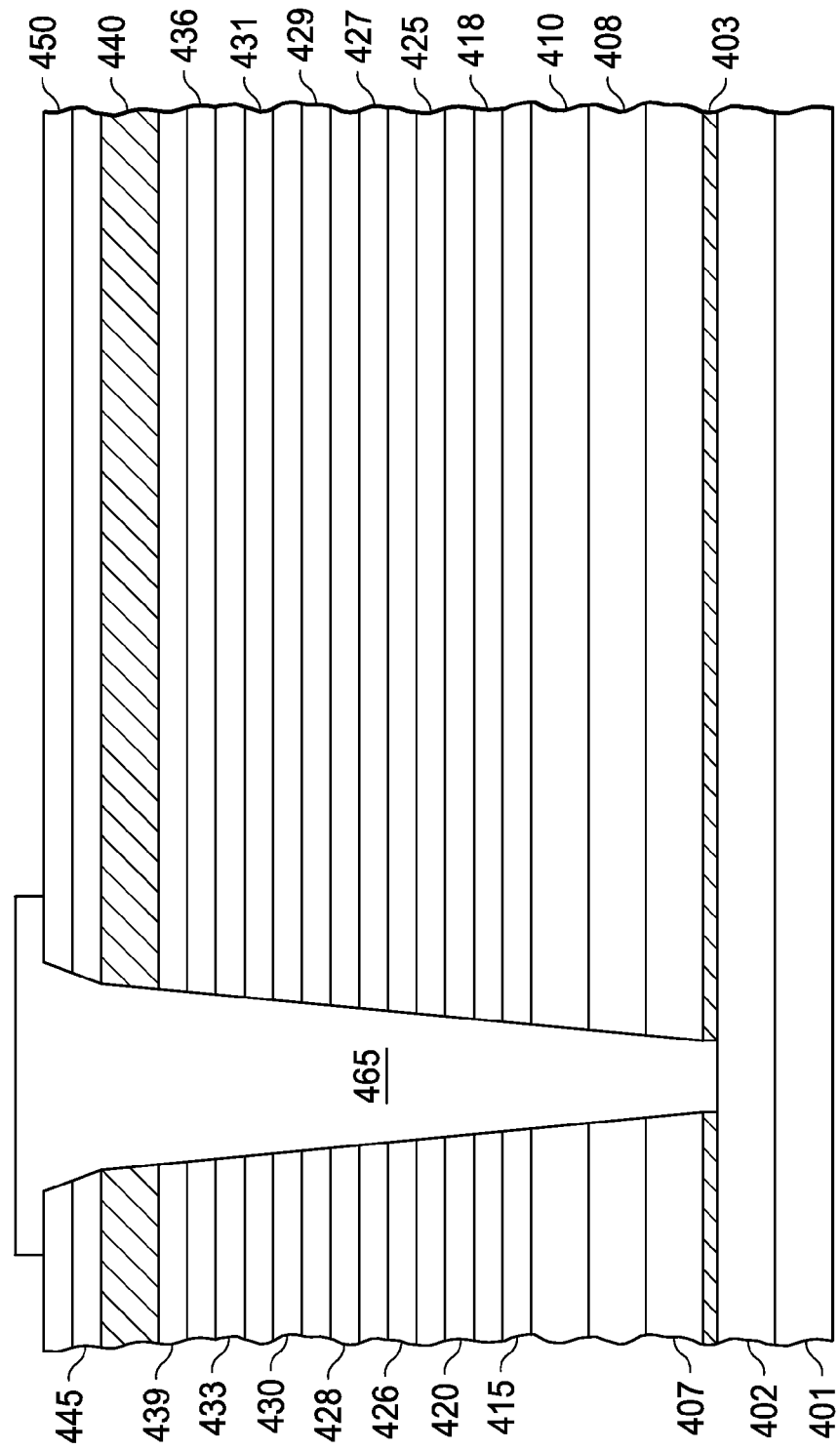

Turning now to FIG. 50, an electroplating process is thereafter performed to form a low-resistance source interconnect 465. The source interconnect 465 is filled substantially level with the top surface of the wafer with plated gold, as described previously.

Figure 51:
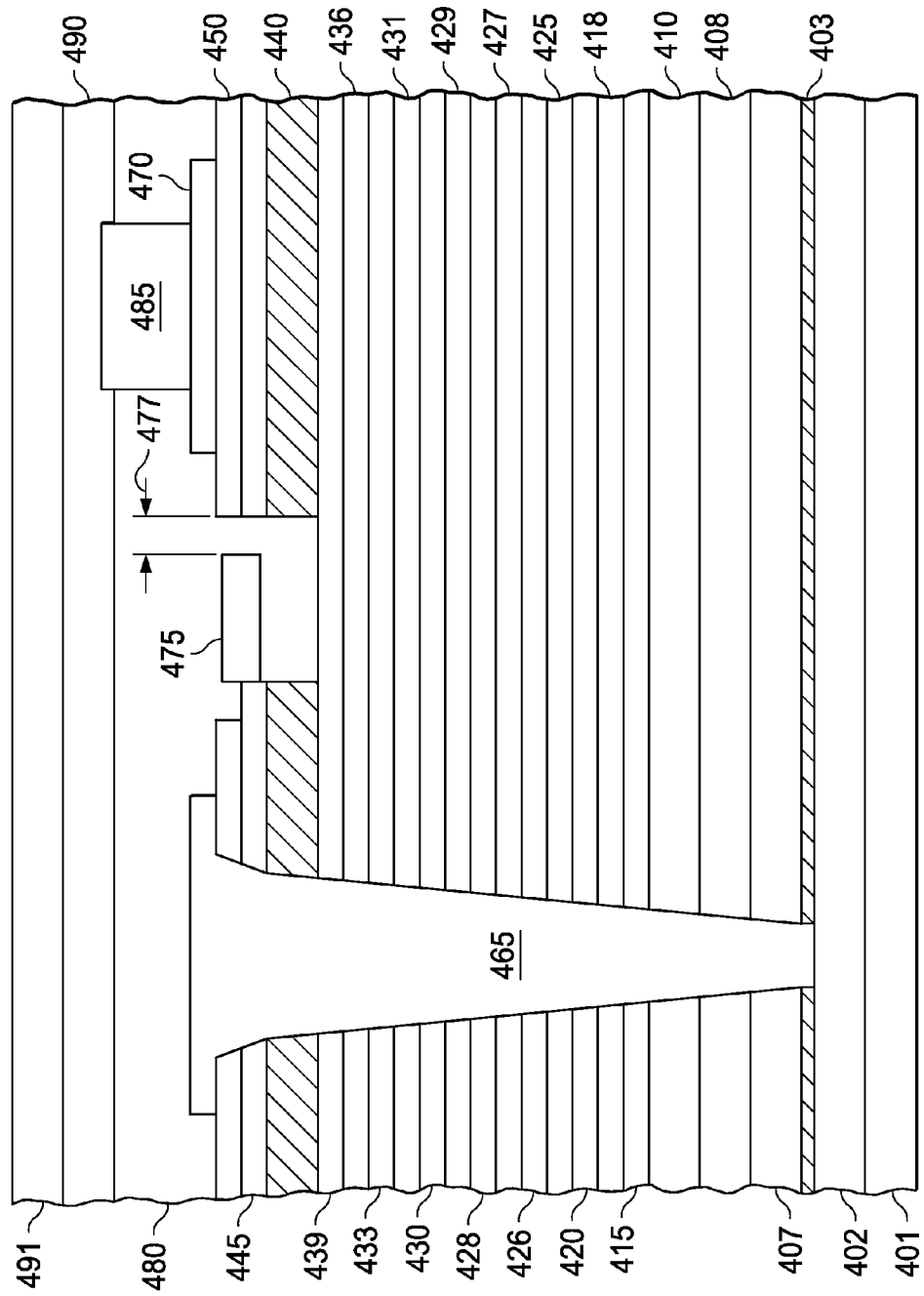

Turning now to FIG. 51, illustrated is a cross-sectional view of a metal layer 470, a gate 475, a gate-to-drain separation distance 477, a dielectric layer 480, a drain post 485, a drain contact 490 and a carrier 491. The steps to construct the aforementioned layers are analogous to the semiconductor device illustrated and described with respect to FIG. 3, et seq. and will not hereinafter be repeated.

Figure 52:
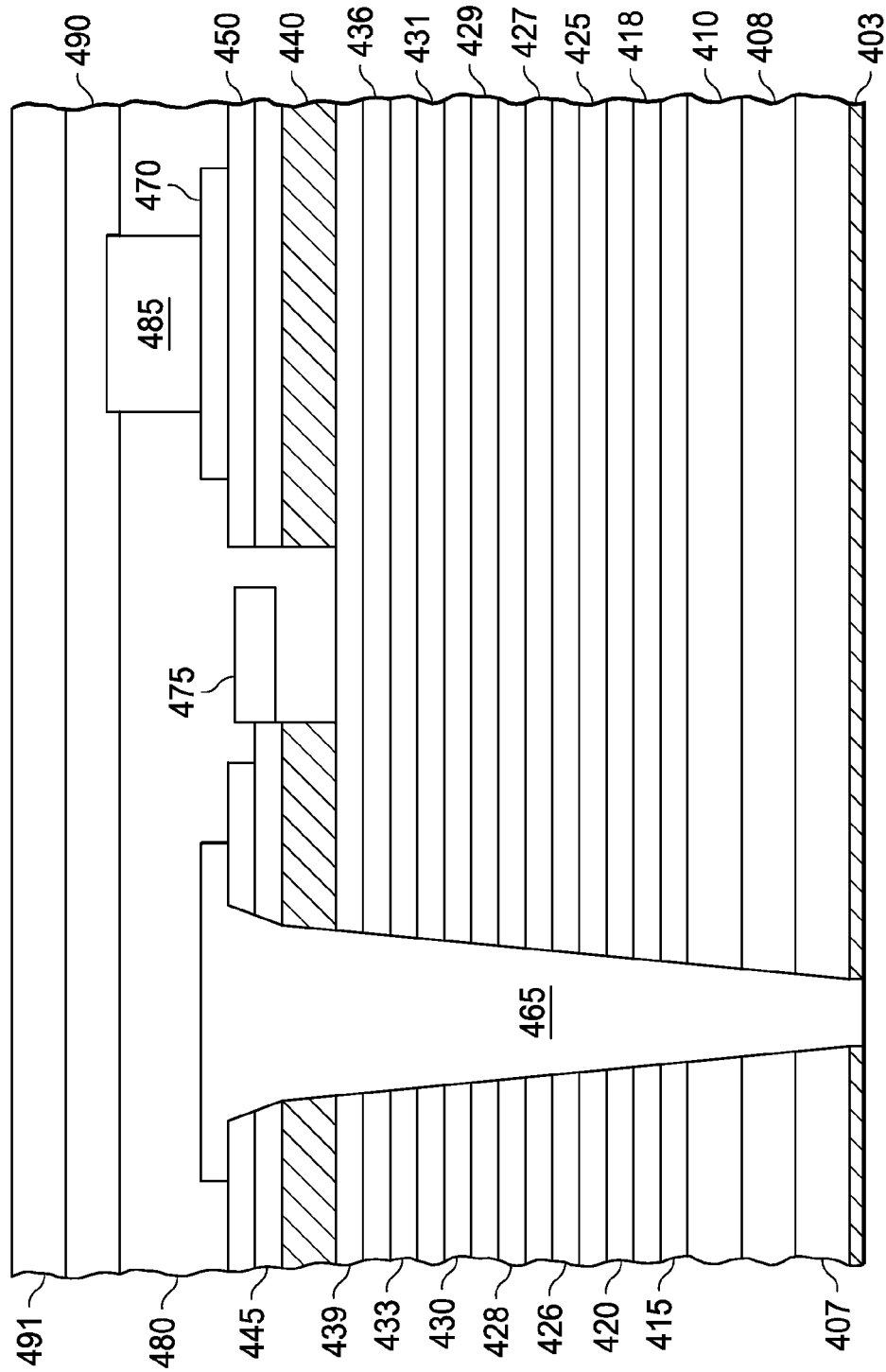
Figure 53:
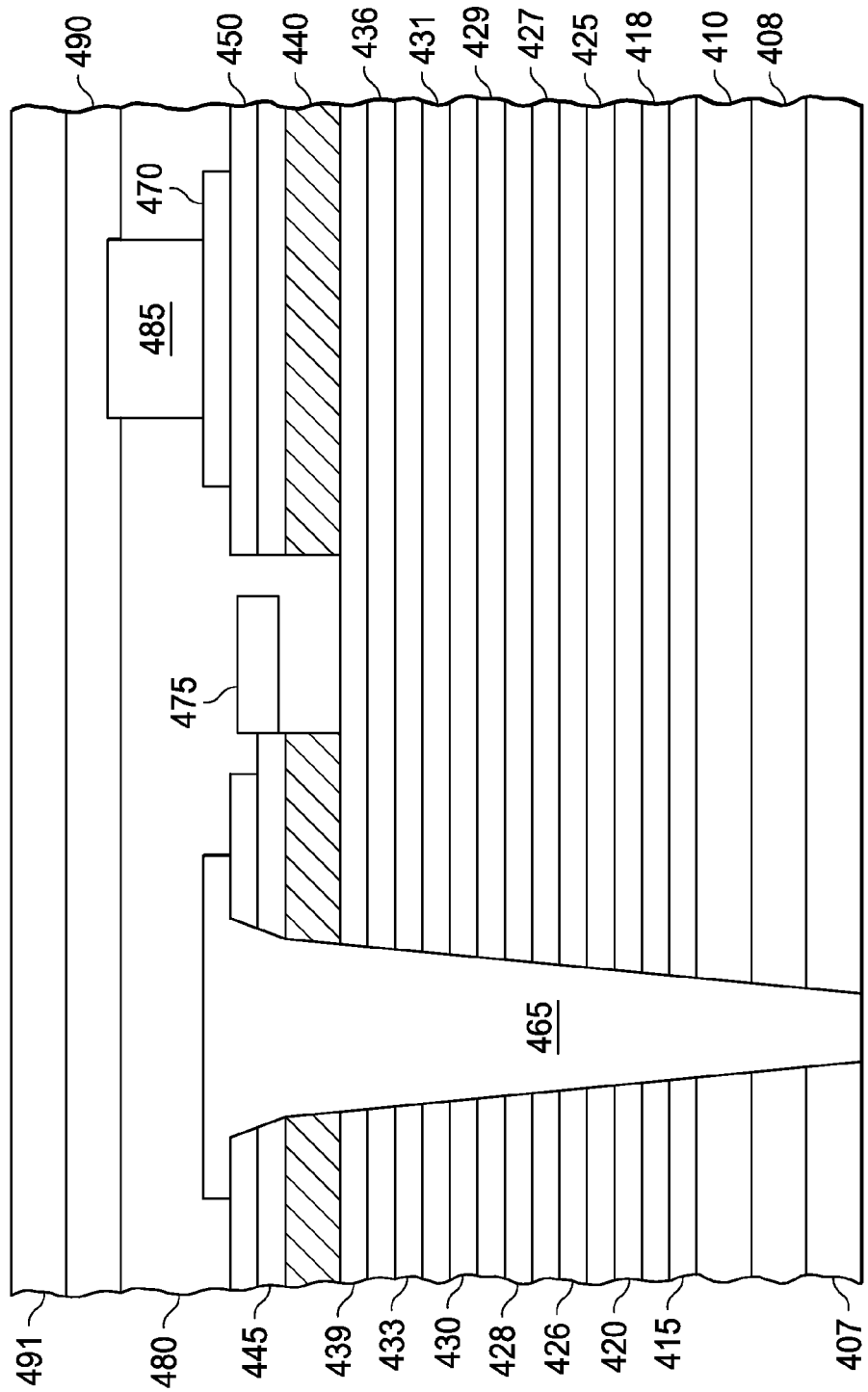

Turning now to FIG. 52 and analogous to the semiconductor device illustrated and described with respect to FIG. 3, et seq., the substrate 401 and the first buffer layer 402 are removed leaving the first etch stop layer 403 as the outer layer of the wafer. As illustrated in FIG. 53, the first etch stop layer 403 is thereafter removed using a wet etch such as a hydrochloric acid ("HCl")-based etch that is selective to gallium arsenide, exposing thereby the first isolation layer 407.

Figure 54:
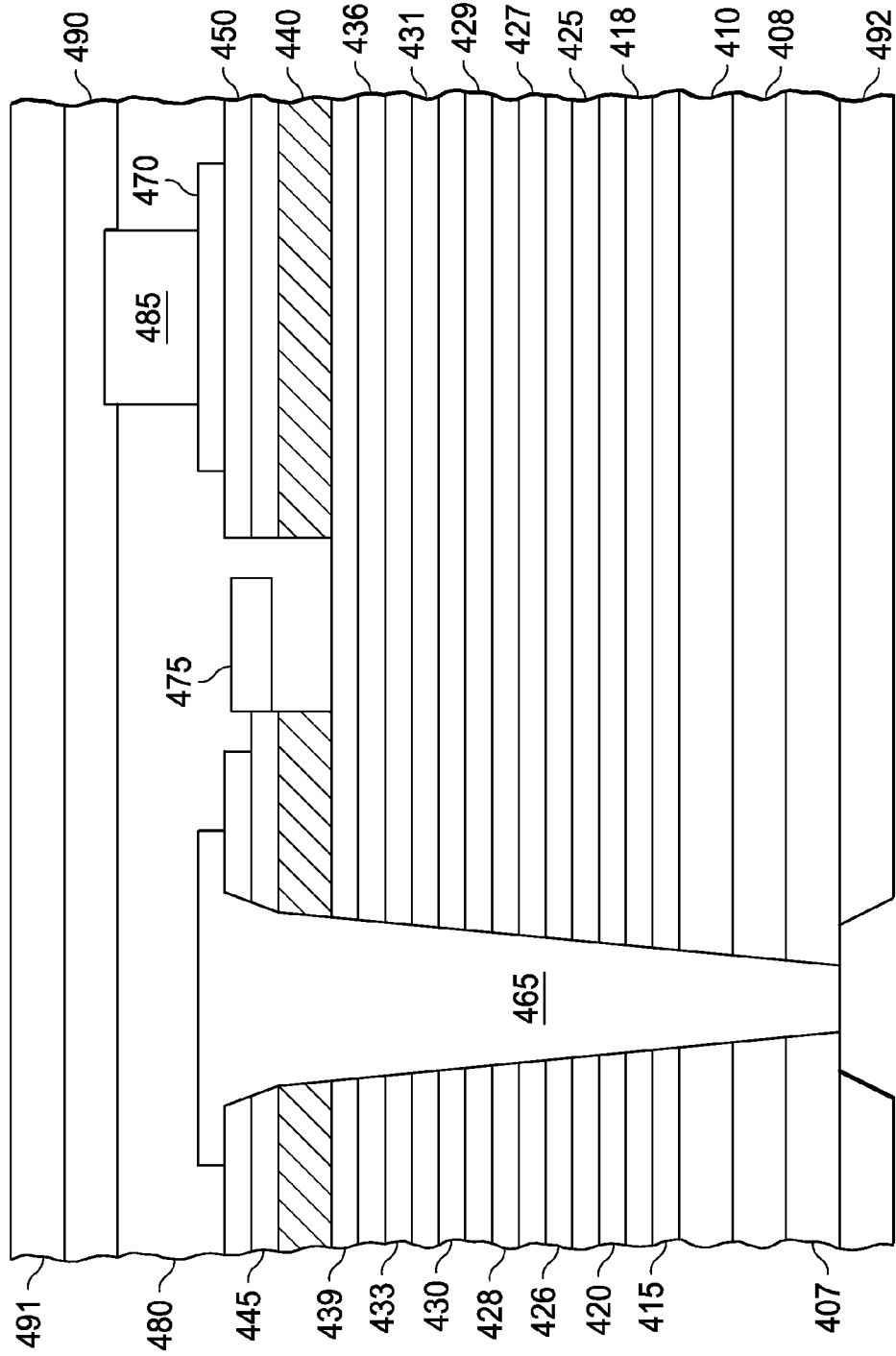
Figure 55:
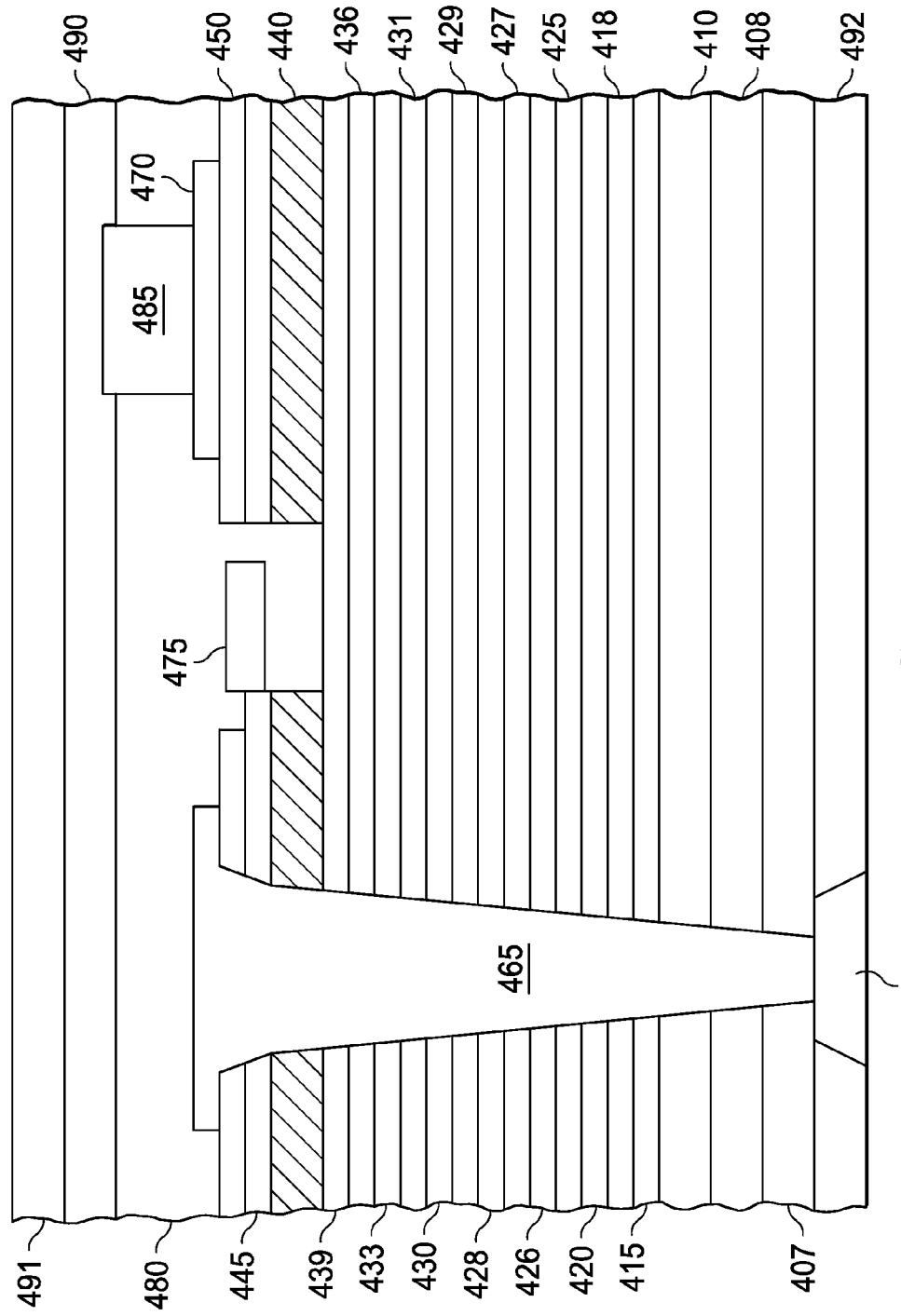
Figure 56:
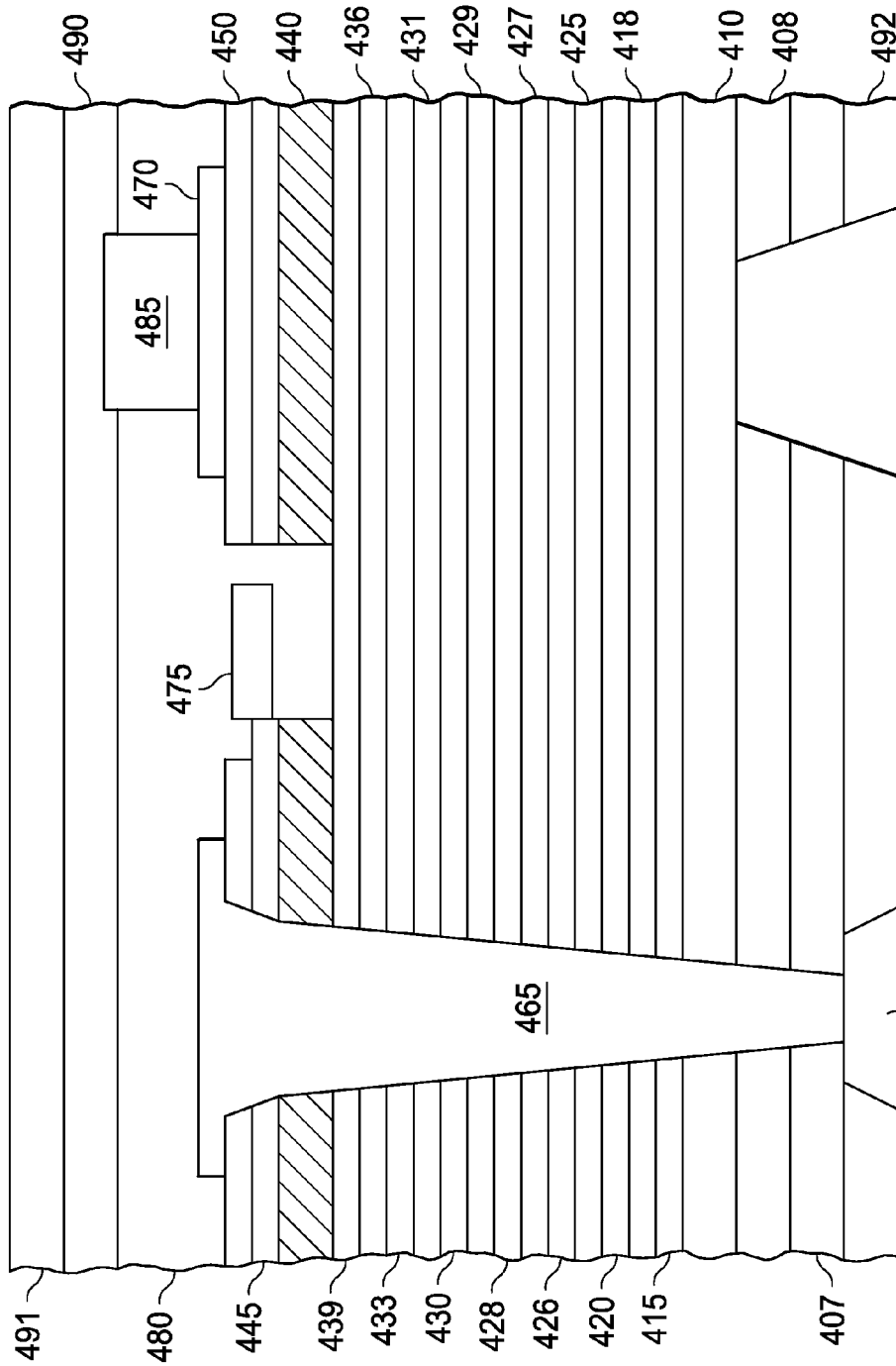

Turning now to FIG. 54, illustrated is a spun-on dielectric 492, preferably with a low dielectric constant material (e.g. BCB, polyimide, Si glass, or other flowable oxide), that has been protected with a photoresist (not shown) which has been masked, exposed and developed as previously described to form a generally angular aperture in the dialectic 492 for access to the source interconnect 465. Thereafter, a source contact layer 493 including titanium-gold is deposited preferably using a lift-off process in the aperture in the dielectric 492 as illustrated in FIG. 55. The dielectric 492 is again protected with a photoresist (not shown), which is masked, exposed and developed as previously described to form another generally angular aperture in the dialectic 492, and the first and second isolation layers 407, 408 for access to the second buffer layer 410 as illustrated in FIG. 56.

Figure 57:
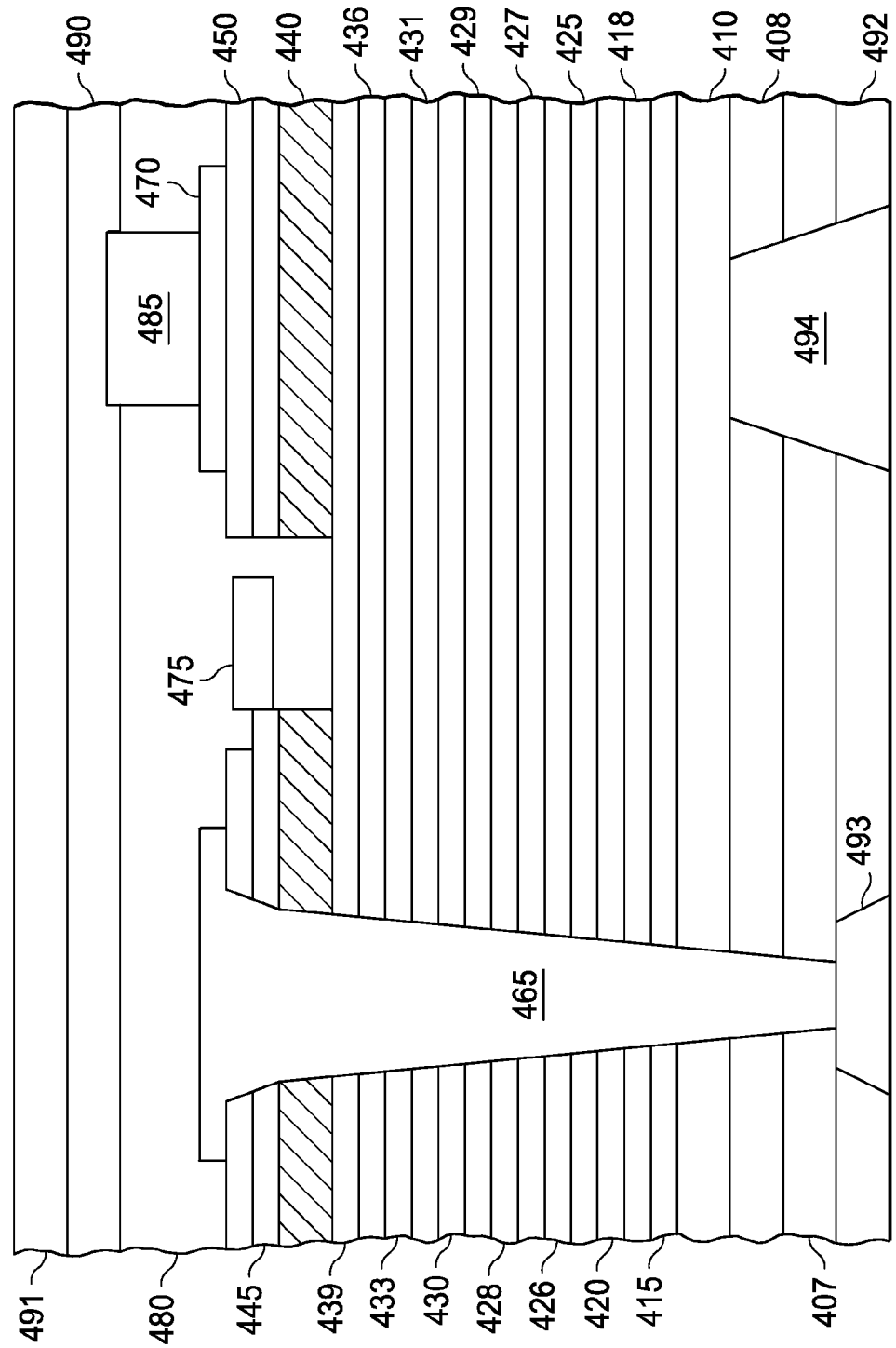
Figure 58:
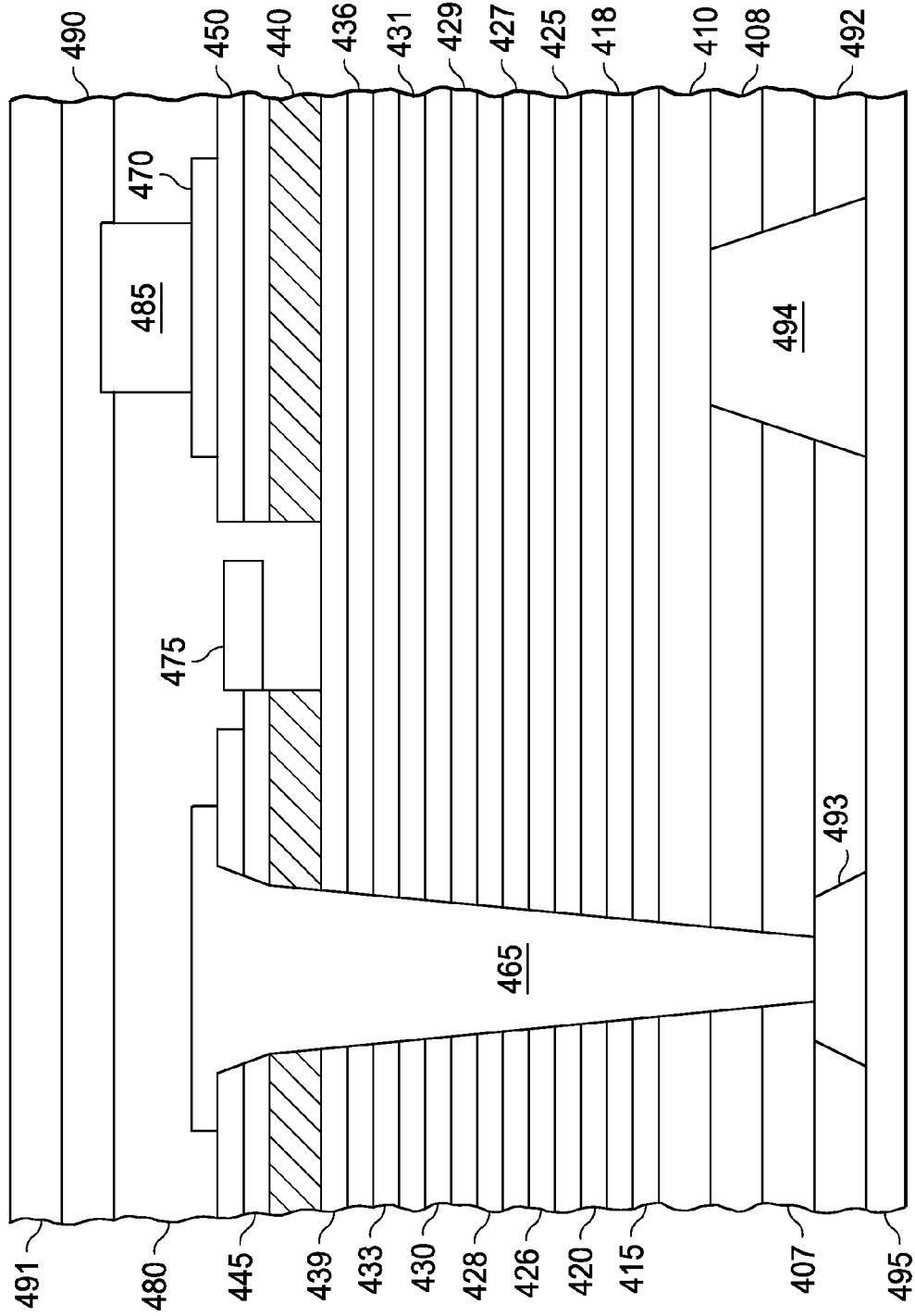

Turning now to FIG. 57, a Schottky junction is formed in the another aperture by deposition of a Ti—Pt—Au alloy, forming thereby a Schottky anode 494, preferably using a lift-off process, to contact the second buffer layer 410. The electrical characteristics of the Schottky junction formed by the Schottky anode 494 with the second buffer layer 410 (the cathode of the Schottky diode) can be controlled by the doping density thereof, as understood by one with ordinary skill in the art. A Ti—Au metal seed is deposited on the lower surface of the die to form a seed layer 495 as illustrated in FIG. 58.

Figure 59:
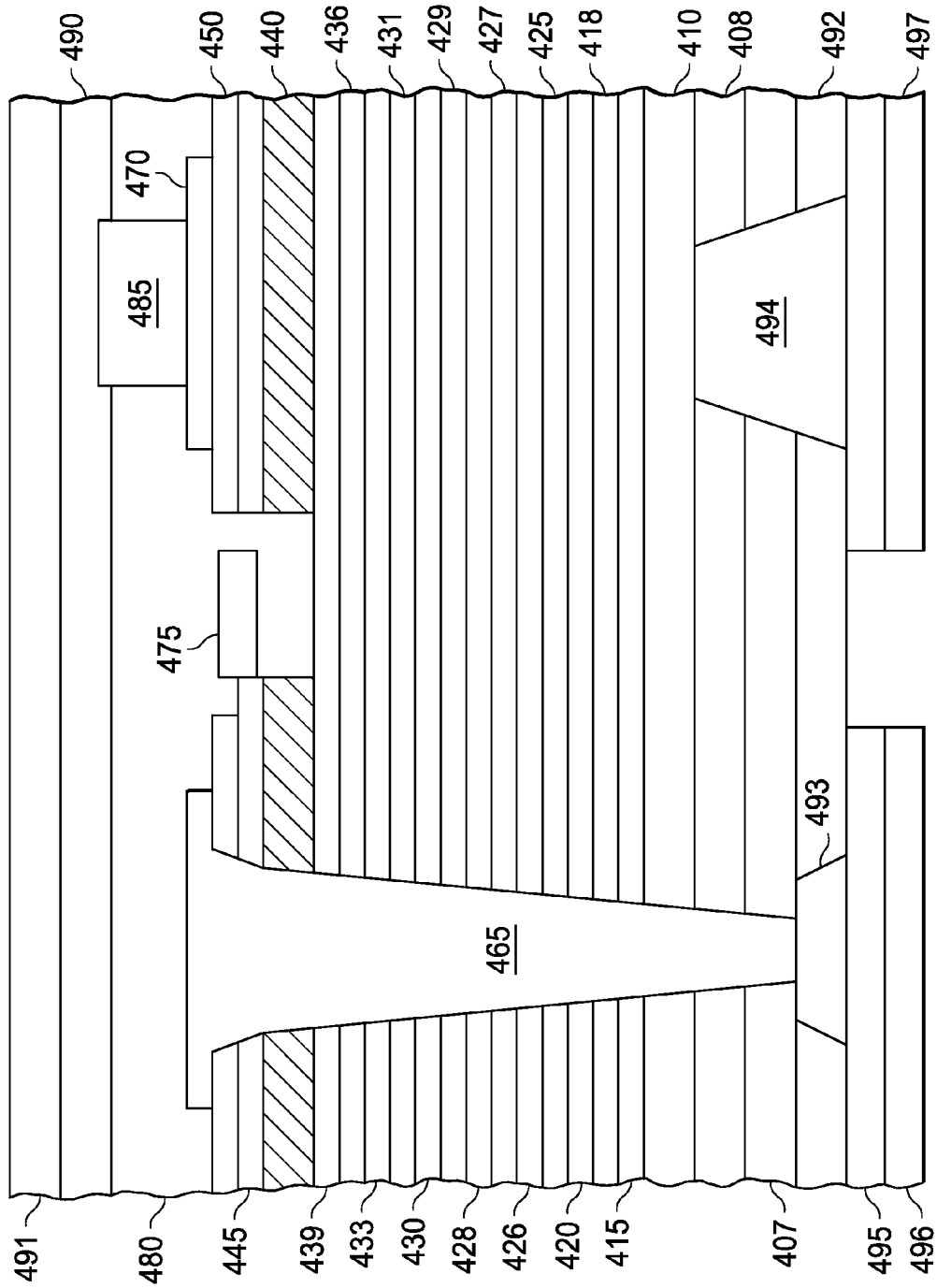

Turning now to FIG. 59, a photoresist (not shown) is deposited over the seed layer 495, which is then masked, exposed, developed, and etched to electrically decouple seed portions over the source contact layer 493 from seed portions over the Schottky anode 494. A source contact 496 and a Schottky contact 497 are then plated over the decoupled seed portions after suitable patterning and processing with a photoresist (not shown), preferably plating gold. A further sublayer of gold may be optionally plated onto the gold contacts to provide additional mechanical support and to reduce resistance of this layer. The overall contact deposition process may be performed by vacuum deposition, sputtering, plating processes, or combinations thereof.

The source and Schottky contacts 496, 497 are typically a few microns in thickness to accommodate the packaging process, including die attachment and bonding, and preferably cover a substantial portion of a lower surface of the semiconductor device. A plating process is generally more desirable for a substantial portion of the plating than an evaporation-based process because of faster throughput for manufacturing. However, an evaporation-based or sputtering-based process may be necessary to initiate/seed the plating process. A liftoff process (e.g., a metal-selective process) can also be used for deposition of a metallic layer. As previously described, an alternative to deposition of thick contacts for mechanical support as well as to provide an electrical contact is to bond the thin wafer to another carrier.

Figure 60:
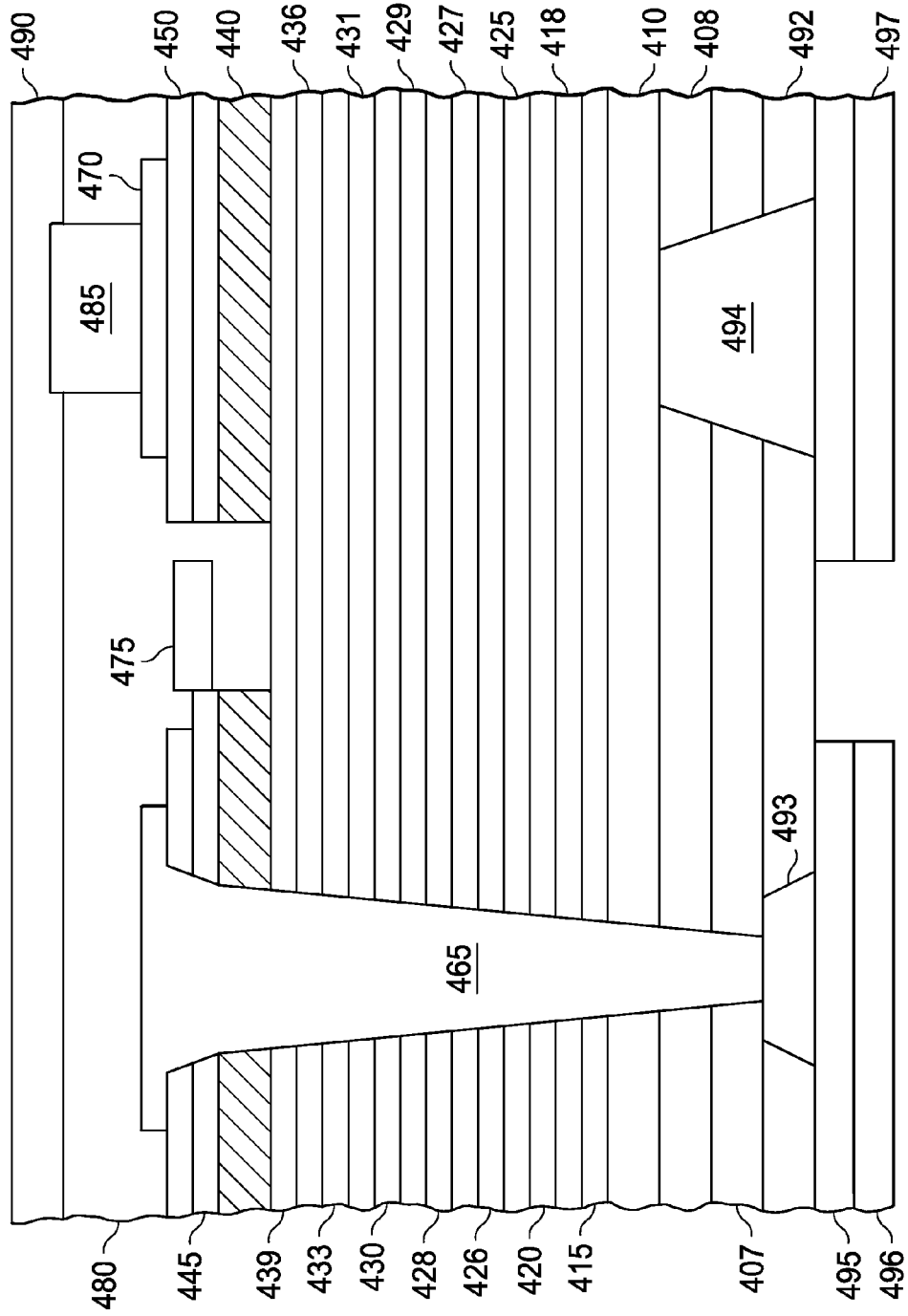

As illustrated in FIG. 60, the carrier 491 is then removed using ordinary techniques in the art to separate a carrier from a wafer, which was removably bonded to the wafer using a high-temperature wax or tape, as described previously above. The resulting wafer now has a metal drain contact 490 on the top layer, and a metal source contact 496 and a metal Schottky contact 497 on the bottom layer. The metal source contact 496 is formed directly on the source interconnect 465, thereby avoiding resistance of intervening semiconductor layers.

The Schottky contact 497 on the lower surface of the die can be coupled to the drain contact 490 on the opposing upper die surface using a lead-frame arrangement as typically employed in a subsequent die packaging step to couple these two device terminals together, or by other packaging techniques well known in the art. Other coupling techniques to couple the Schottky contact 497 to the drain contact 490, such as a metallized trench in the die, formed in a manner similar to the source interconnect, or an implant coupling the Schottky contact 496 with the drain contact 490, can also be employed. Couplings (not shown) between metallic layers can also be made by plated vias through a dielectric layer using well understood masking, patterning, etching and deposition processes.

Figure 61:
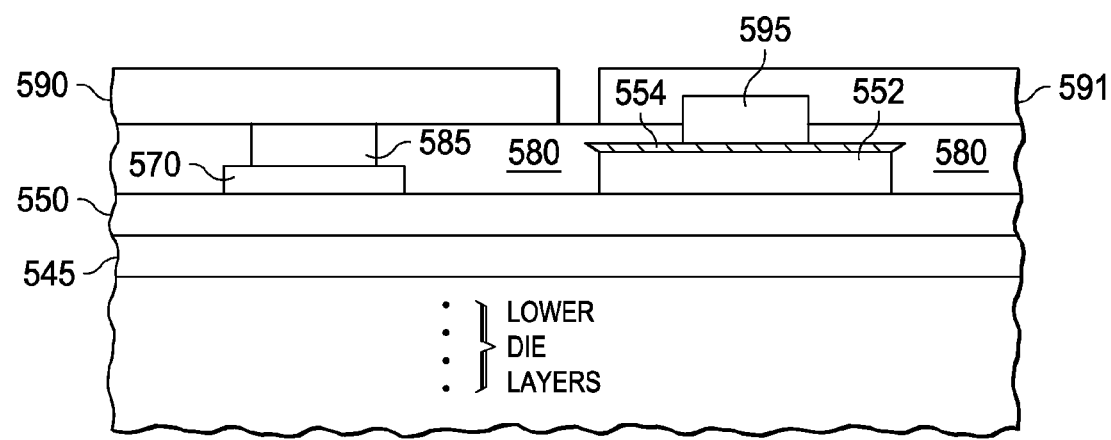
FIG. 61 illustrates a cross-sectional view of portions of another embodiment of a semiconductor device constructed according to the principles of the present invention.

Referring now to FIG. 61, illustrated is a cross-sectional view of portions of another embodiment of a semiconductor device (e.g., a lateral FET including a monolithically integrated and parallel-coupled Schottky diode) constructed according to the principles of the present invention. The FIGURE illustrates an upper portion of the semiconductor device including metallic posts directly coupling the drain of a lateral FET and the anode of a Schottky diode to a contact on the upper surface of the semiconductor device. A contact (not shown) coupled to the source of the lateral FET is formed on the lower surface of the die as previously described. The anode of the Schottky diode can be electrically coupled to a contact of the lateral FET of the semiconductor device by means of a lead frame (not shown) in the device packaging, or by other techniques well known in the art such as wire bonding. This device structure, however, may require additional active die area in comparison to the approaches described previously for formation of the monolithically integrated Schottky diode. The process to form the semiconductor device as described below may optionally remove or retain a substrate on which the die is formed.

A monolithically integrated Schottky diode is formed in parallel with a lateral FET in an embodiment of the invention by adding an n-doped layer preferably above first and second source drain contact layers 545, 550 as previously described, to form a cathode 552 of the Schottky diode. The remaining layers of the semiconductor device are formed in substantially the same manner as the embodiments of the semiconductor devices described above. A Schottky anode 554, such as a Ti—Pt—Au metal layer or other appropriate Schottky-forming alloy, is deposited on the cathode 552, preferably using a lift-off process as previously described. The cathode 552 can be removed from remaining areas of the die, and the lateral FET processing can be performed as described above. A Schottky post 595, preferably formed as an evaporatively deposited Ti—Pt—Au alloy (or as plated Au), is deposited above and in electrical contact with the Schottky anode 554. A drain contact 590, deposited over a dielectric layer 580, can then be deposited over and in electrical contact with a drain post 585 coupled to a metal layer 570. The drain contact 590 is preferably formed of a Ti—Pt—Au alloy evaporatively deposited over the metal layer 570 (or as plated Au). The drain contact 590 provides a wide area, low resistance contact on the upper surface of the semiconductor device. A Schottky contact 591 (formed over the dielectric layer 580) is deposited over and in electrical contact with Schottky post 595, thereby providing a wide area, low-resistance contact on the upper surface of the semiconductor device to the Schottky anode 554. In an alternative embodiment, the Schottky contact 591 and the drain contact 590 are formed as a single, electrically coupled contact, thereby coupling the Schottky diode in parallel with the drain contact 590 and the source contact (not shown) of the lateral FET. The cathode 552 of the Schottky diode is electrically connected to the drain embodied in the first and second source/drain contact layers 545, 550. A monolithically integrated Schottky diode is thereby formed on the same die with a lateral FET, and may be electrically coupled in parallel with its drain and source contacts.

Thus, the present invention provides a semiconductor device with a lateral FET and a monolithically integrated Schottky diode and a method of forming the same. In one embodiment, the lateral field-effect transistor includes a buffer layer having a contact covering a substantial portion of a bottom surface thereof, a lateral channel above the buffer layer, another contact above the lateral channel, and an interconnect that connects the lateral channel to the buffer layer, operable to provide a low resistance coupling between the contact and the lateral channel. The semiconductor device also includes a Schottky diode parallel-coupled to the lateral field-effect transistor including a cathode formed from another buffer layer interposed between the buffer layer and the lateral channel, a Schottky interconnect interposed between the another buffer layer and the another contact, and an anode formed on a surface of the Schottky interconnect operable to connect the anode to the another contact. The semiconductor device may also include an isolation layer interposed between the buffer layer and the lateral channel.

In another aspect, the present invention provides a semiconductor device including a lateral field-effect transistor and a Schottky diode, and method of forming the same. In one embodiment, the lateral field-effect transistor includes a buffer layer having a contact coupled to a bottom surface thereof, a lateral channel above the buffer layer, another contact above the lateral channel, and an interconnect that connects the lateral channel to the buffer layer, operable to provide a low resistance coupling between the contact and the lateral channel. The semiconductor device also includes a Schottky diode coupled to the lateral field-effect transistor including a cathode formed from the buffer layer, an anode formed on a bottom surface of the cathode, and a Schottky contact coupled to a bottom surface of the anode. The semiconductor device may also include an isolation layer interposed between the contact and the buffer layer.

In another aspect, the present invention provides a semiconductor device including a lateral field-effect transistor and a Schottky diode, and method of forming the same. In one embodiment, the lateral field-effect transistor includes a buffer layer having a contact coupled to a bottom surface thereof, a lateral channel above the buffer layer, another contact above the lateral channel, and an interconnect that connects the lateral channel to the buffer layer, operable to provide a low resistance coupling between the contact and the lateral channel. The semiconductor device also includes a Schottky diode coupled to the lateral field-effect transistor including a cathode above the lateral channel, an anode formed on an upper surface of the cathode, and a Schottky contact coupled to an upper surface of the anode. The semiconductor device may also include an isolation layer interposed between the buffer layer and the lateral channel.

Those skilled in the art should understand that the previously described embodiments of the field-effect transistor and related methods of forming the same are submitted for illustrative purposes only. In addition, other embodiments capable of providing the advantages as described above are well within the broad scope of the present invention. While the field-effect transistor has been described as providing advantages in the environment of a power supply, other applications therefor are well within the broad scope of the present invention.

For a better understanding of power electronics, see "Principles of Power Electronics," by J. G. Kassakian, M. F. Schlecht and G. C. Verghese, Addison-Wesley (1991). For a better understanding of semiconductor devices and processes, see "Fundamentals of III-V Devices," by William Liu, John Wiley and Sons, (1999). For a better understanding of gallium arsenide processing, see "Modern GaAs Processing Methods," by Ralph Williams, Artech House, Second Ed. (1990). The aforementioned references are incorporated herein by reference.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof, to form the devices providing reduced on-resistance, gate drive energy, and costs as described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. Additionally, the terms "above," "formed over" or other similar terminology employed in reference to the semiconductor device or method of forming the same shall not be limited to "directly above" or "directly formed over" and, unless otherwise specified, the scope of the present invention contemplates that intervening layers may be present when characterizing a layer above, over, formed over, etc. another layer. In addition, while the illustrated embodiments describe a source contact on a bottom surface of a substrate and a drain contact on a top surface thereof, those skilled in the art understand that the contacts for a FET may be reversed as described herein and still fall within the broad scope of the present invention.

What is claimed is:

1. A semiconductor device, comprising:
   a lateral field-effect transistor, including:
      a buffer layer having a contact coupled to a bottom surface thereof,
      a lateral channel above said buffer layer,
      another contact above said lateral channel, and
      an interconnect that connects said lateral channel to said buffer layer, operable to provide a low resistance coupling between said contact and said lateral channel; and
   a Schottky diode coupled to said lateral field-effect transistor, including:
      a cathode formed from said buffer layer,
      an anode formed on a bottom surface of said cathode, and
      a Schottky contact coupled to a bottom surface of said anode.

2. The semiconductor device as recited in claim 1 wherein said Schottky diode further includes a seed layer interposed between said anode and said Schottky contact.

3. The semiconductor device as recited in claim 1 wherein said anode includes a titanium-platinum-gold deposition.

4. The semiconductor device as recited in claim 1 wherein said lateral field-effect transistor further includes a contact layer and a seed layer interposed between said buffer layer and said contact.

5. The semiconductor device as recited in claim 1 wherein said lateral field-effect transistor further includes a superlattice buffer above said buffer layer.

6. The semiconductor device as recited in claim 1 wherein said lateral field-effect transistor further includes a modulation doped barrier layer interposed between said buffer layer and said lateral channel.

7. The semiconductor device as recited in claim 1 wherein said lateral field-effect transistor further includes another lateral channel interposed between said lateral channel and said another contact.

8. The semiconductor device as recited in claim 1 wherein said lateral field-effect transistor further includes a modulation doped spacer layer above said lateral channel.

9. The semiconductor device as recited in claim 1 wherein said lateral field-effect transistor further includes a source/drain contact layer interposed between said lateral channel and said another contact.

10. The semiconductor device as recited in claim 1 wherein said lateral field-effect transistor further includes a gate located in a gate recess interposed between said lateral channel and said another contact.

11. A semiconductor device, comprising:
- a lateral field-effect transistor, including:
  - an isolation layer having a contact coupled to a bottom surface thereof,
  - a buffer layer above said isolation layer,
  - a lateral channel above said buffer layer,
  - another contact above said lateral channel, and
  - an interconnect that connects said lateral channel to said contact, operable to provide a low resistance coupling between said contact and said lateral channel; and
- a Schottky diode coupled to said lateral field-effect transistor, including:
  - a cathode formed from said buffer layer,
  - an anode formed on a bottom surface of said cathode through said isolation layer, and
  - a Schottky contact coupled to a bottom surface of said anode.

12. The semiconductor device as recited in claim 11 wherein said Schottky diode further includes a seed layer interposed between said anode and said Schottky contact.

13. The semiconductor device as recited in claim 11 wherein said anode includes a titanium-platinum-gold deposition.

14. The semiconductor device as recited in claim 11 wherein said lateral field-effect transistor further includes a contact layer and a seed layer interposed between said isolation layer and said contact.

15. The semiconductor device as recited in claim 11 wherein said lateral field-effect transistor further includes a super-lattice buffer above said buffer layer.

16. The semiconductor device as recited in claim 11 wherein said lateral field-effect transistor further includes a modulation doped barrier layer interposed between said buffer layer and said lateral channel.

17. The semiconductor device as recited in claim 11 wherein said lateral field-effect transistor further includes another lateral channel interposed between said lateral channel and said another contact.

18. The semiconductor device as recited in claim 11 wherein said lateral field-effect transistor further includes a modulation doped spacer layer above said lateral channel.

19. The semiconductor device as recited in claim 11 wherein said lateral field-effect transistor further includes a source/drain contact layer interposed between said lateral channel and said another contact.

20. The semiconductor device as recited in claim 11 wherein said lateral field-effect transistor further includes a gate located in a gate recess interposed between said lateral channel and said another contact.

* * * * *

UNITED STATES PATENT AND TRADEMARK OFFICE
CERTIFICATE OF CORRECTION

PATENT NO. : 7,504,673 B2
APPLICATION NO. : 11/866259
DATED : March 17, 2009
INVENTOR(S) : Sadaka et al.

It is certified that error appears in the above-identified patent and that said Letters Patent is hereby corrected as shown below:

In Col. 13, line 35, delete "fourth etch stop layer 340" and insert --third etch stop layer 312--.
In Col. 18, line 52, after interconnect insert --367--.
In Col. 18, line 54, after interconnect insert --367--.
In Col. 29, line 57, delete "496" and insert --497--.

Signed and Sealed this

Fifth Day of May, 2009

JOHN DOLL
*Acting Director of the United States Patent and Trademark Office*